(12) United States Patent
Mehrotra

(10) Patent No.: US 8,592,902 B1
(45) Date of Patent: Nov. 26, 2013

(54) SEMICONDUCTOR STRUCTURE THAT REDUCES THE EFFECTS OF GATE CROSS DIFFUSION AND METHOD OF FORMING THE STRUCTURE

(71) Applicant: Texas Instruments Incorporated, Dallas, TX (US)

(72) Inventor: Manoj Mehrotra, Plano, TX (US)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 13/624,018

(22) Filed: Sep. 21, 2012

(51) Int. Cl.
*H01L 21/336* (2006.01)
*H01L 21/8234* (2006.01)
*H01L 21/76* (2006.01)
*H01L 29/66* (2006.01)

(52) U.S. Cl.
USPC .......... 257/337; 257/197; 257/353; 257/288; 257/399; 257/305; 257/596; 257/E21.435; 257/E29.269; 257/E21.413; 438/197; 438/305; 438/212; 438/216; 438/275

(58) Field of Classification Search
USPC .......................................................... 257/337
See application file for complete search history.

(56) References Cited

U.S. PATENT DOCUMENTS

| | | | |
|---|---|---|---|
| 5,512,506 A * | 4/1996 | Chang et al. | 438/305 |
| 6,391,733 B1 * | 5/2002 | Fisher | 438/305 |
| 8,169,027 B2 * | 5/2012 | Doyle et al. | 257/353 |
| 2005/0164438 A1 * | 7/2005 | Okonogi et al. | 438/197 |

* cited by examiner

*Primary Examiner* — Thao Le
*Assistant Examiner* — Long Le
(74) *Attorney, Agent, or Firm* — Jacqueline J. Garner; Wade J. Brady, III; Frederick J. Telecky, Jr.

(57) ABSTRACT

Gate cross diffusion in a semiconductor structure is substantially reduced or eliminated by forming multiple n-type gate regions with different dopant concentrations and multiple p-type gate regions with different dopant concentrations so that the n-type gate region with the lowest dopant concentration touches the p-type gate region with the lowest dopant concentration.

13 Claims, 73 Drawing Sheets

SEMICONDUCTOR STRUCTURE THAT REDUCES THE EFFECTS OF GATE CROSS DIFFUSION AND METHOD OF FORMING THE STRUCTURE

BACKGROUND OF THE INVENTION

1. Field of the Invention

The present invention relates to semiconductor structures and, more particularly, to a semiconductor structure that reduces the effects of gate cross diffusion and a method of forming the structure.

2. Description of the Related Art

A complimentary metal oxide semiconductor (CMOS) device is a well-known semiconductor device that includes both n-channel (NMOS) and p-channel (PMOS) transistors. Each transistor has spaced-apart source and drain regions, which are separated by a channel, and a gate that lies over and insulated from the channel.

FIGS. 1A-1F show views that illustrates a prior-art semiconductor structure 100. FIG. 1A shows a plan view, while FIG. 1B shows a cross-sectional view taken along line 1B-1B of FIG. 1A, FIG. 1C shows a cross-sectional view taken along line 1C-1C of FIG. 1A, FIG. 1D shows a cross-sectional view taken along line 1D-1D of FIG. 1A, FIG. 1E shows a cross-sectional view taken along line 1E-1E of FIG. 1A, and FIG. 1F shows a cross-sectional view taken along line 1F-1F of FIG. 1A.

As shown in FIGS. 1A-1F, semiconductor structure 100 includes a semiconductor body 110. Semiconductor body 110, in turn, includes a p-type single-crystal-silicon substrate region 112, and a trench isolation structure 114 that touches substrate region 112. Semiconductor body 110 also includes a p-type well 116 and an n-type well 118 that touch substrate region 112 and trench isolation structure 114.

In addition, semiconductor body 110 includes an n-type source 120 and an n-type drain 122 that each touch p-type well 116, and a p-type source 124 and a p-type drain 126 that each touch n-type well 118. Source 120 and drain 122 each include a lightly-doped (n−) region, and a heavily-doped (n+) region. Similarly, source 124 and drain 126 each include a lightly-doped (p−) region, and a heavily-doped (p+) region. Further, source 120 and drain 122 touch, and are separated by, a channel portion 130 of p-well 116, while source 124 and drain 126 touch, and are separated by, a channel portion 132 of n-well 118.

As additionally shown in FIGS. 1A-1F, semiconductor structure 100 also includes a gate insulation region 134 that touches and lies over channel portion 130, and a gate insulation region 136 that touches and lies over channel portion 132. semiconductor structure 100 further includes a gate 140 that touches trench isolation structure 114, gate insulation region 134, and gate insulation region 136. Further, gate 140 lies over channel portion 130 and channel portion 132.

Gate 140, which can be implemented with polycrystalline silicon, includes an n-type gate region 146 that lies over channel portion 130, and a p-type gate region 148 that lies over channel portion 132. N-type gate region 146, which is heavily doped (n+), touches p-type gate region 148, which is also heavily doped (p+).

Further, semiconductor structure 100 includes a non-conductive side wall spacer 150 that touches and laterally surrounds gate 140. In addition, semiconductor structure 100 includes a conductive structure 152 that touches and overlies gate 140. Conductive structure 152 can be implemented with, for example, silicide. (Although not shown, a silicide structure can also lie over each of the sources and drains.)

In operation, p-type well 116, n-type source 120, n-type drain 122, channel portion 130, gate insulation region 134, and gate 140 form an NMOS transistor 160, while n-type well 118, p-type source 124, p-type drain region 126, channel portion 132, gate insulation region 136, and gate 140 form a PMOS transistor 162.

The threshold voltage of a transistor is the gate voltage required to form an inversion layer at the top surface of the channel portion that is sufficient to allow a current to flow from the source region to the drain region. In the case of an NMOS transistor, n-type dopant atoms form the inversion layer, while p-type dopant atoms form the inversion layer in the case of a PMOS transistor.

When a positive drain-to-source voltage $V_{DS}$ is present, and the gate-to-source voltage $V_{GS}$ is more positive than the threshold voltage, NMOS transistor 160 turns on and electrons flow from source region 120 to drain region 122. When the gate-to-source voltage $V_{GS}$ is more negative than the threshold voltage, NMOS transistor 160 turns off and no electrons (other than a very small leakage current) flow from source region 120 to drain region 122.

Similarly, when a negative drain-to-source voltage $V_{DS}$ is present, and the gate-to-source voltage $V_{GS}$ is more negative than the threshold voltage, PMOS transistor 162 turns on and holes flow from source region 124 to drain region 126. When the gate-to-source voltage $V_{GS}$ is more positive than the threshold voltage, PMOS transistor 162 turns off and no holes (other than a very small leakage current) flow from source region 124 to drain region 126.

In order to place more and more transistors on a single die, the physical sizes of the NMOS and PMOS transistors are being continually scaled down. The performances of the NMOS and PMOS transistors have steadily improved as the physical sizes of the transistors have been scaled down.

However, problems arise as the physical sizes of the transistors are scaled down. One problem that arises as a result of reducing the physical sizes of the transistors is known as gate cross diffusion. In gate cross diffusion, the dopant atoms in the gate region of one transistor diffuse over and change the dopant concentration of the dopant atoms in an adjacent gate region.

For example, a number of the dopant atoms in n-type gate region 146 can diffuse over to p-type gate region 148, and thereby change the dopant concentrations of the n-type dopant atoms in gate region 146 and the p-type dopant atoms in gate region 148. This change in the dopant concentrations of the gate regions 146 and 148 can change the threshold voltages of NMOS transistor 160 and PMOS transistor 162 which, in turn, changes the gate voltages required to turn on NMOS transistor 160 and PMOS transistor 162.

One approach to reducing the effect of gate cross diffusion is to reduce the concentration of dopant atoms in the gate regions 146 and 148. With lower dopant concentrations, fewer dopant atoms are available to diffuse over into an adjacent gate region. However, the polycrystalline silicon structure 142 of gate 140 is typically doped at the same time that the source and drain regions are formed. As a result, this approach also reduces the dopant concentrations of the source and drain regions. Reducing the dopant concentrations of the source and drain regions increases the source-to-drain series resistance and, therefore, is not a preferred approach.

Another approach to reducing the effect of gate cross diffusion is to first selectively implant n-type dopant atoms into one region of a conventionally-deposited layer of gate polycrystalline silicon to form an initial n-type gate region. Following this, p-type dopant atoms are selectively implanted into one region of the gate polycrystalline layer to form an initial p-type gate region that touches the initial n-type gate region. After this, the gate polycrystalline silicon layer is etched to form a polycrystalline silicon structure, such as the polycrystalline silicon structure 142 of gate 140.

The n-type gate region and the p-type gate region are then further doped when the source and drain regions are forms. Doping the gate polycrystalline silicon layer before the gate polycrystalline silicon layer has been etched to form a polycrystalline silicon structure allows the dopant concentrations within the n-type and p-type gate regions to be adjusted to account for the effect of gate cross diffusion.

SUMMARY OF THE INVENTION

The present invention provides a semiconductor structure and a method of forming the semiconductor structure that reduce the effects of gate cross diffusion. A semiconductor structure of the present invention includes an isolation region, a source that touches the isolation region and a channel region of a first conductivity type, and a drain that touches the isolation region and the channel region and lies spaced apart from the source. The source has a second conductivity type and includes a first source region, a second source region that touches the first source region, and a third source region that touches the first and second source regions. The first source region has substantially a first dopant concentration, the second source region has substantially a second dopant concentration that is greater than the first dopant concentration, the third source region has substantially a third dopant concentration that is greater than the first dopant concentration and less than the second dopant concentration. The drain has the second conductivity type and includes a first drain region, a second drain region that touches the first drain region, and a third drain region that touches the first and second drain regions. The first drain region has substantially the first dopant concentration, the second drain region has substantially the second dopant concentration, the third drain region has substantially the third dopant concentration. The semiconductor structure also includes a gate insulation structure that touches and lies above the channel region, and a gate that touches the isolation region and the gate insulation structure. The gate lies above the channel region.

The semiconductor structure of the present invention can alternately include an isolation region, a first insulation structure that touches and lies above a p-type channel region, and a second insulation structure that touches and lies above an n-type channel region. The semiconductor structure further includes a gate that has a first n-type gate region that lies over the isolation region, a second n-type gate region that touches the first insulation structure and lies over the p-type channel region, a first p-type gate region that lies over the isolation structure, and a second p-type gate region that touches the second insulation structure and lies over the n-type channel region. The first n-type gate region touches the second n-type gate region and the first p-type gate region. The first p-type gate region touches the second p-type gate region and is spaced apart from the second n-type gate region. The second p-type gate region is spaced apart from the first n-type gate region. The first n-type gate region has substantially a first n-type dopant concentration. The second n-type gate region has substantially a second n-type dopant concentration that is greater than the first n-type dopant concentration. The first p-type gate region has substantially a first p-type dopant concentration. The second p-type gate region has substantially a second p-type dopant concentration that is greater than the first p-type dopant concentration.

A method of forming a semiconductor structure in the present invention includes forming an isolation region, and forming a gate insulation structure that touches and lies above a channel region of a first conductivity type. The method also includes forming a gate structure that touches the gate insulation structure and the isolation region, and lies above the channel region. The method further includes forming a first implant blocking structure to touch the gate structure. The first implant blocking structure has a first opening that exposes a first portion of the gate structure. The method additionally includes implanting dopant atoms of a second conductivity type through the first opening into the gate structure to form a first gate region that lies above the channel region. The method also includes replacing the first implant blocking structure with a second implant blocking structure that touches the gate structure. The second implant blocking structure has a second opening that exposes the first portion of the gate structure, a second portion of the gate structure, and a third portion of the gate structure. Further, the method includes implanting dopant atoms of the second conductivity type through the second opening into the gate structure to increase a dopant concentration of the first gate region, and form a second gate region and a third gate region that each touches the first gate region.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 1A is a plan view, while FIG. 1B is a cross-sectional view taken along line 1B-1B of FIG. 1A, FIG. 1C is a cross-sectional view taken along line 1C-1C of FIG. 1A, FIG. 1D is a cross-sectional view taken along line 1D-1D of FIG. 1A, FIG. 1E is a cross-sectional view taken along line 1E-1E of FIG. 1A, and FIG. 1F is a cross-sectional view taken along line 1F-1F of FIG. 1A.

FIG. 2A is a plan view, while FIG. 2B is a cross-sectional view taken along line 2B-2B of FIG. 2A, FIG. 2C is a cross-sectional view taken along line 2C-2C of FIG. 2A, FIG. 2D is a cross-sectional view taken along line 2D-2D of FIG. 2A, FIG. 2E is a cross-sectional view taken along line 2E-2E of FIG. 2A, and FIG. 2F is a cross-sectional view taken along line 2F-2F of FIG. 2A.

FIGS. 3A-11A through 3F-11F are a series of views illustrating an example of a method 300 of forming a semiconductor structure in accordance with the present invention. FIGS. 3A-11A are a series of plan views. FIGS. 3B-11B are a series of cross-sectional views taken along line 3B-3B of FIG. 3A through line 11B-11B of FIG. 11A, respectively. FIGS. 3C-11C are a series of cross-sectional views taken along line 3C-3C of FIG. 3A through line 11C-11C of FIG. 11A, respectively. FIGS. 3D-11D are a series of cross-sectional views taken along line 3D-3D of FIG. 3A through line 11D-11D of FIG. 11A, respectively. FIGS. 3E-11E are a series of cross-sectional views taken along line 3E-3E of FIG. 3A through line 11E-11E of FIG. 11A, respectively. FIGS. 3F-11F are a series of cross-sectional views taken along line 3F-3F of FIG. 3A through line 11F-11F of FIG. 11A, respectively.

FIG. 12A is a plan view, while FIG. 12B is a cross-sectional view taken along line 12B-12B of FIG. 12A, FIG. 12C is a cross-sectional view taken along line 12C-12C of FIG. 12A, FIG. 12D is a cross-sectional view taken along line 12D-12D of FIG. 12A, FIG. 12E is a cross-sectional view taken along line 12E-12E of FIG. 12A, and FIG. 12F is a cross-sectional view taken along line 12F-12F of FIG. 12A.

FIGS. 13A-24A through 13F-24F are a series of views illustrating an example of a method 1300 of forming a semiconductor structure in accordance with the alternate embodiment of the present invention. FIGS. 13A-24A are a series of plan views. FIGS. 13B-24B are a series of cross-sectional views taken along line 13B-13B of FIG. 13A through line 24B-24B of FIG. 24A, respectively. FIGS. 13C-24C are a series of cross-sectional views taken along line 13C-13C of FIG. 13A through line 24C-24C of FIG. 24A, respectively. FIGS. 13D-24D are a series of cross-sectional views taken along line 13D-13D of FIG. 13A through line 24D-24D of FIG. 24A, respectively. FIGS. 13E-24E are a series of cross-sectional views taken along line 13E-13E of FIG. 13A through line 24E-24E of FIG. 24A, respectively. FIGS. 13F-24F are a series of cross-sectional views taken along line 13F-13F of FIG. 13A through line 24F-24F of FIG. 24A, respectively.

DETAILED DESCRIPTION OF THE INVENTION

Figure 1A:
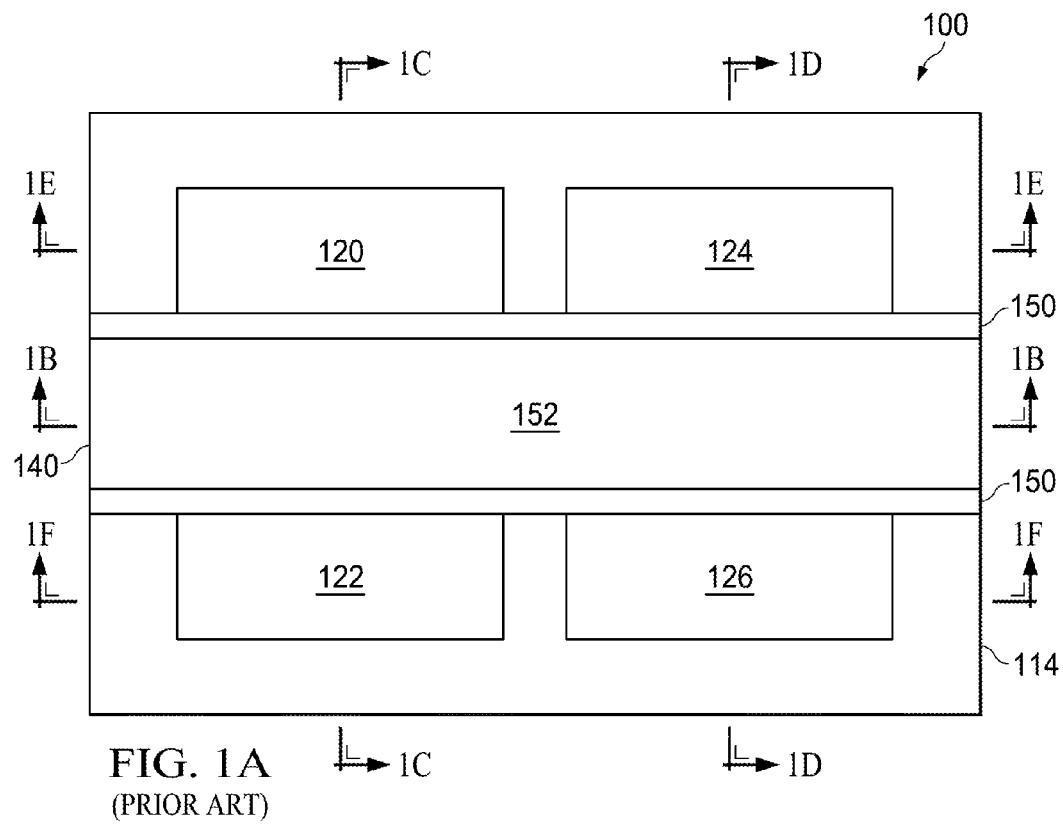
FIGS. 1A-1F are views illustrating a prior-art semiconductor structure 100.
Figure 1B:
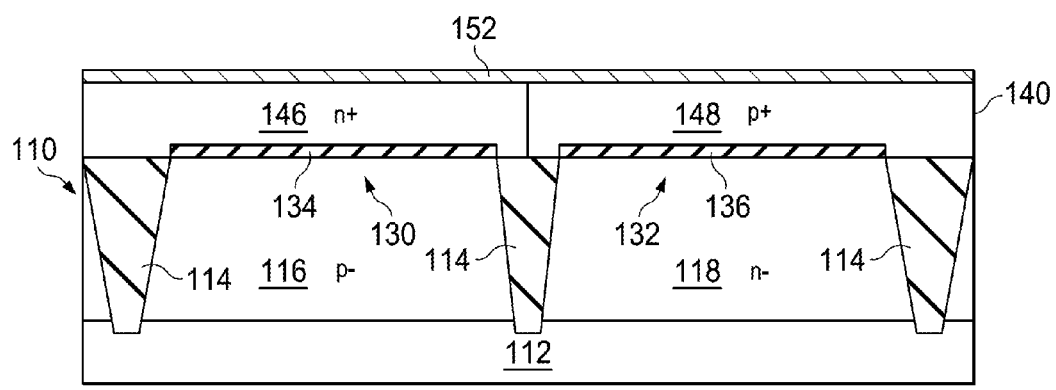
Figure 1C:
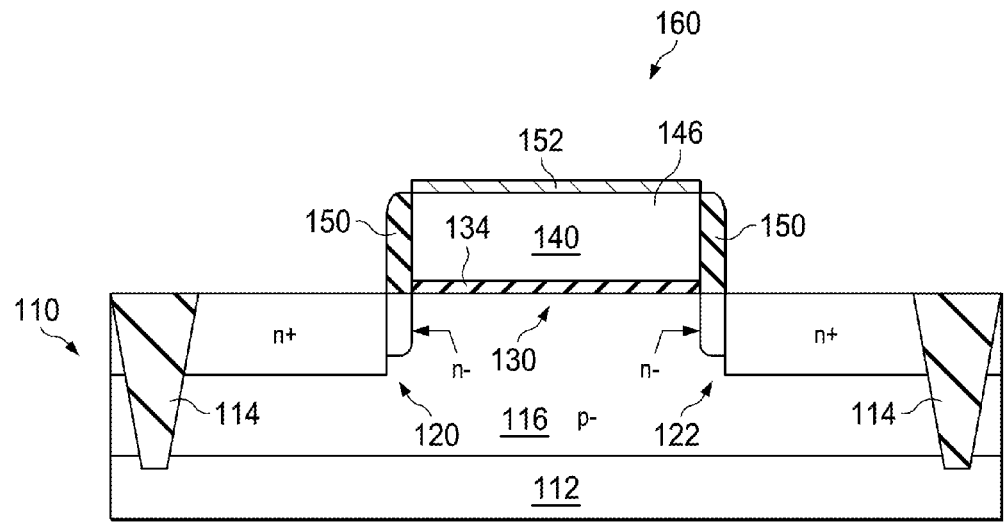
Figure 1D:
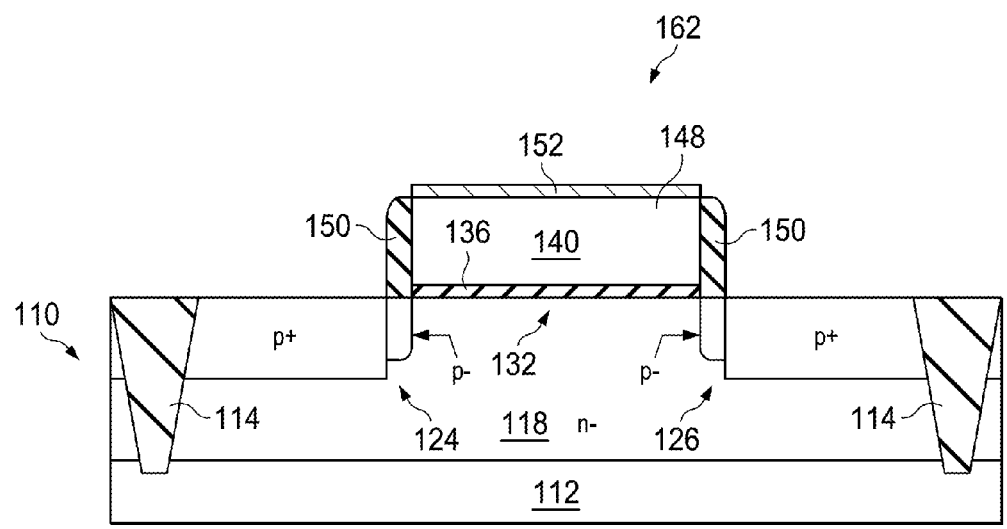
Figure 1E:
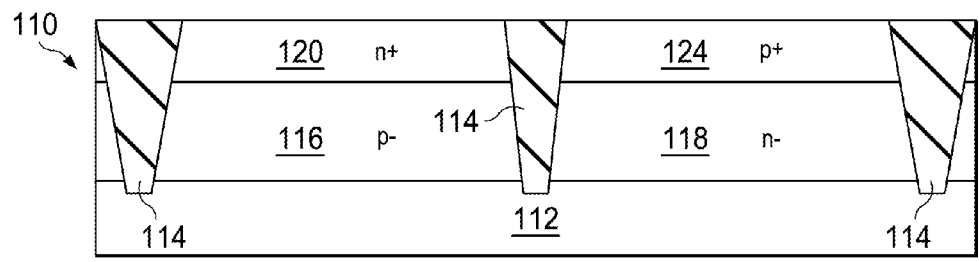
Figure 1F:
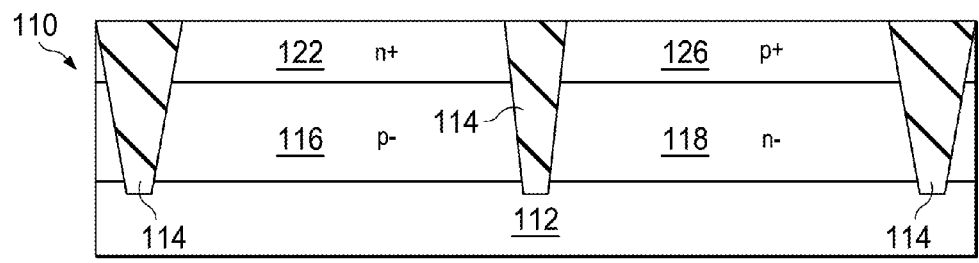
Figure 2A:
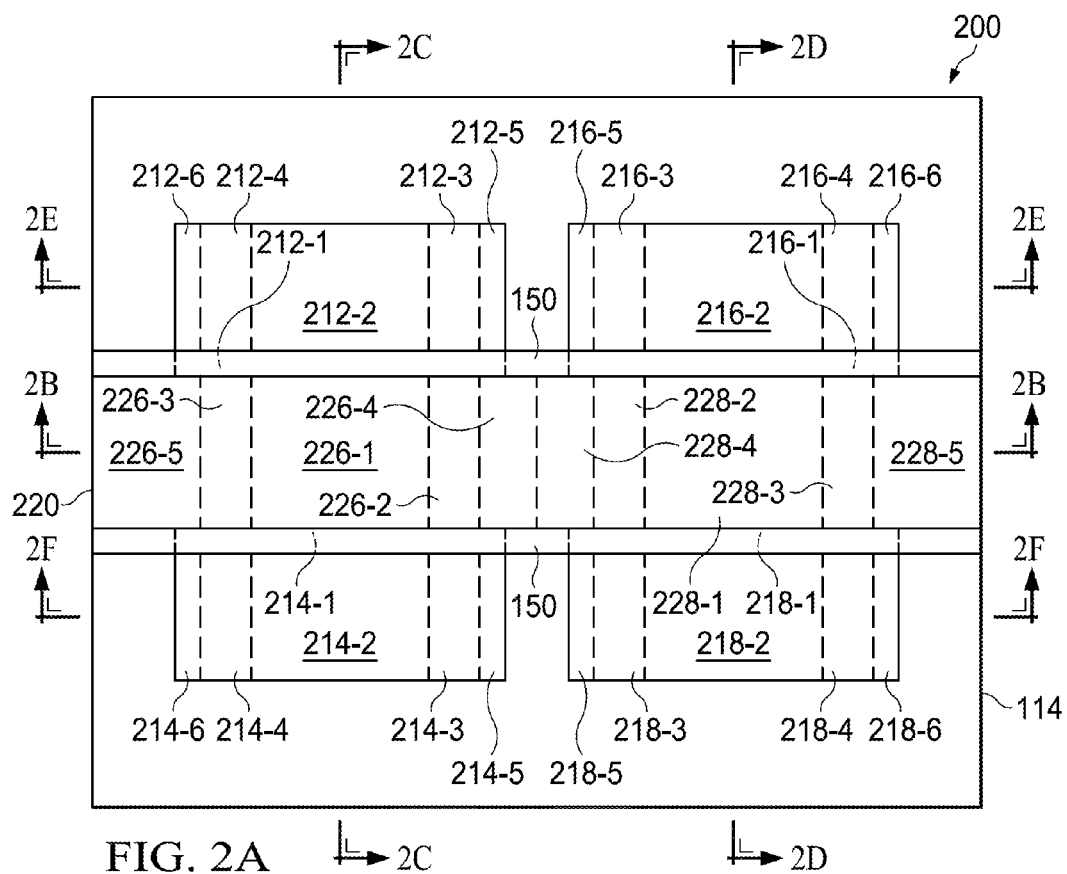
FIGS. 2A-2F are views illustrating an example of a semiconductor structure 200 in accordance with the present invention.
Figure 2B:
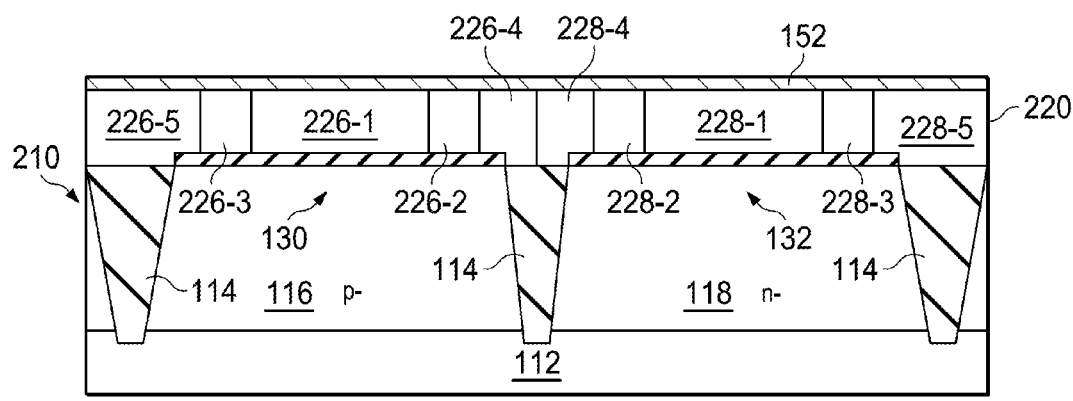
Figure 2C:
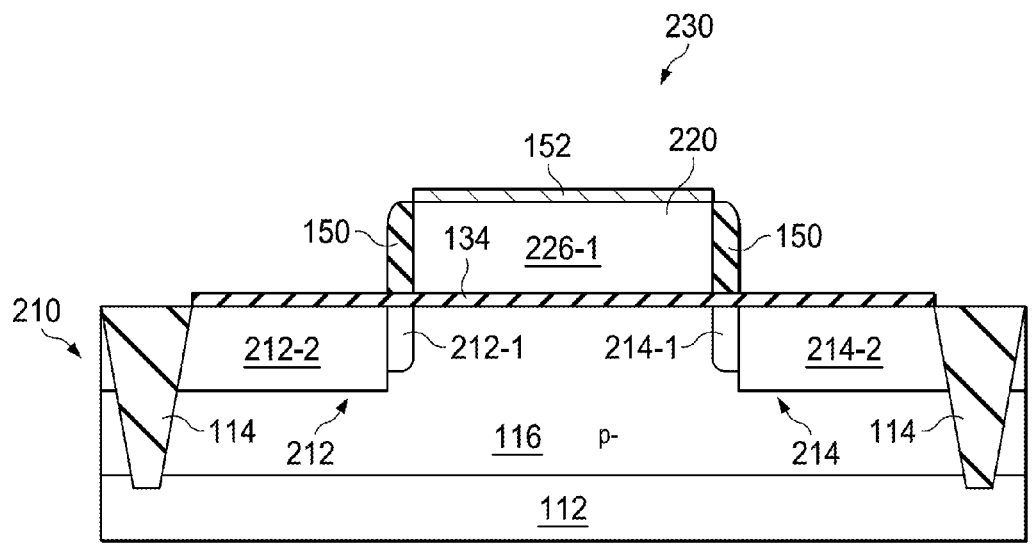
Figure 2D:
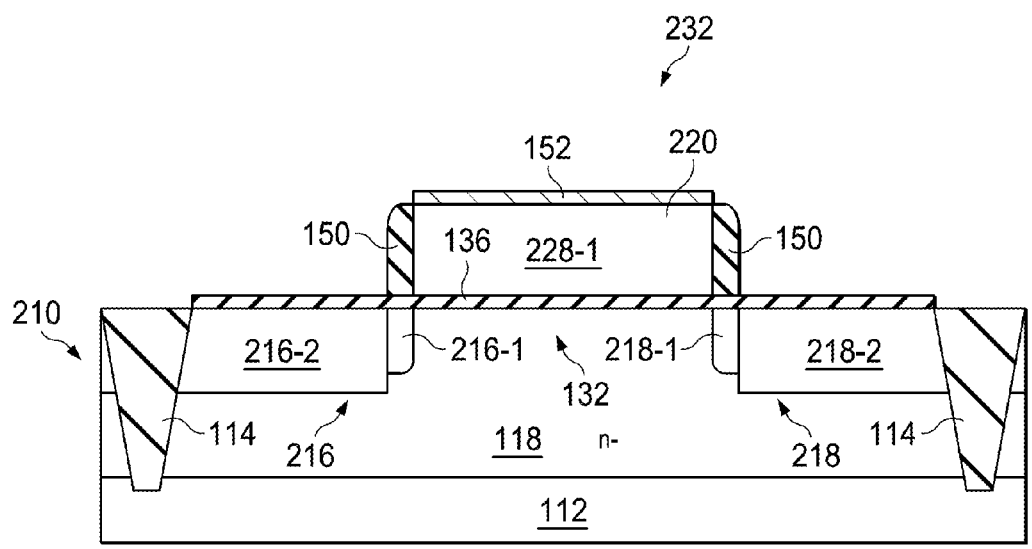
Figure 2E:
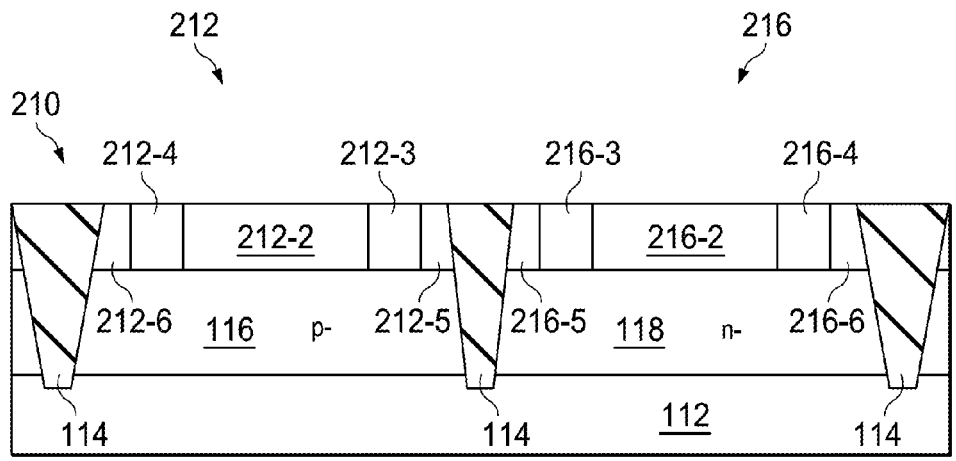
Figure 2F:
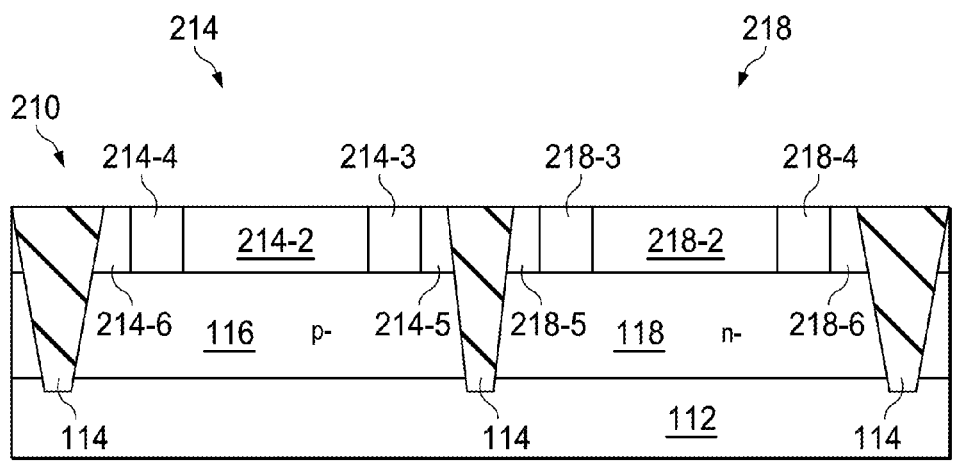
Figure 3A:
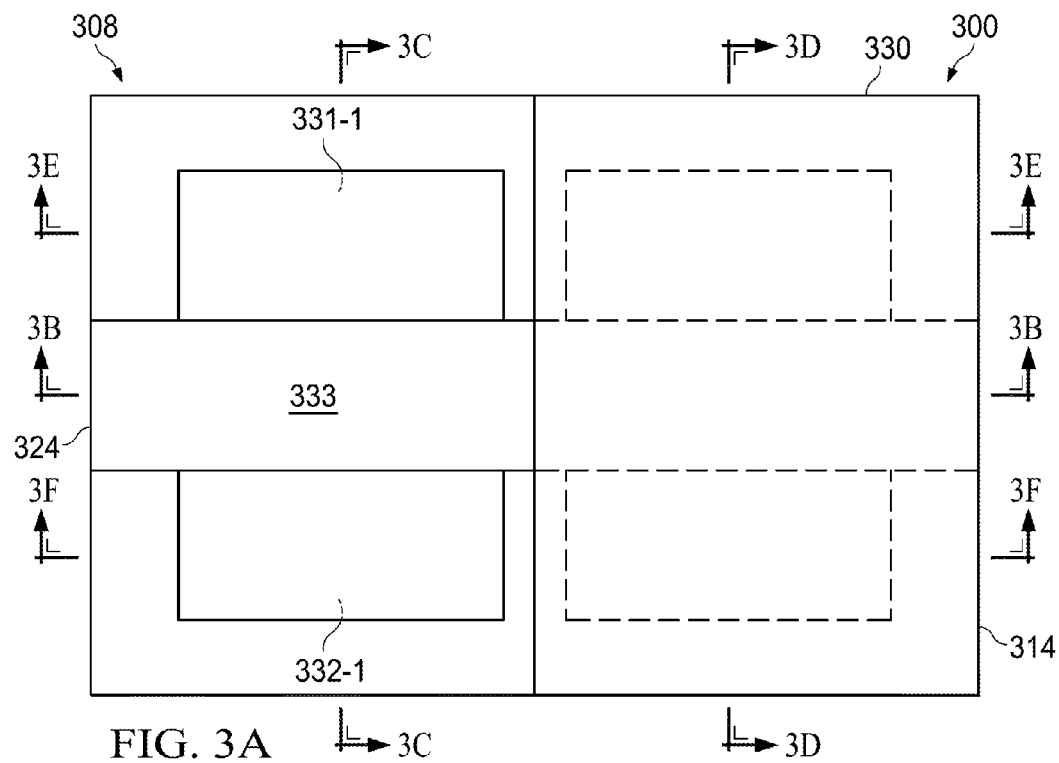
Figure 3B:
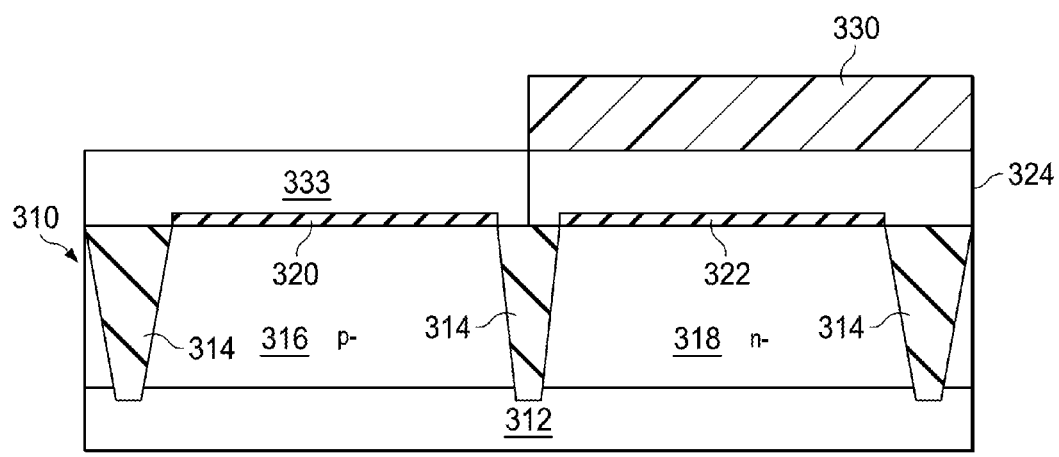
Figure 3C:
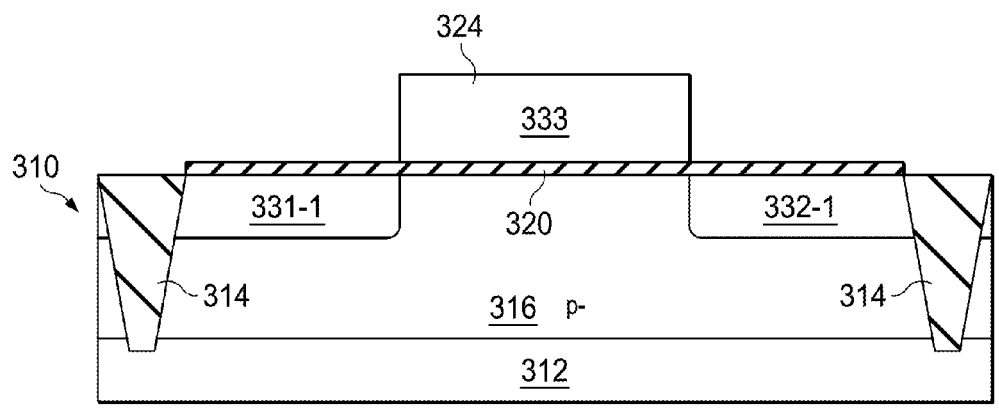
Figure 3D:
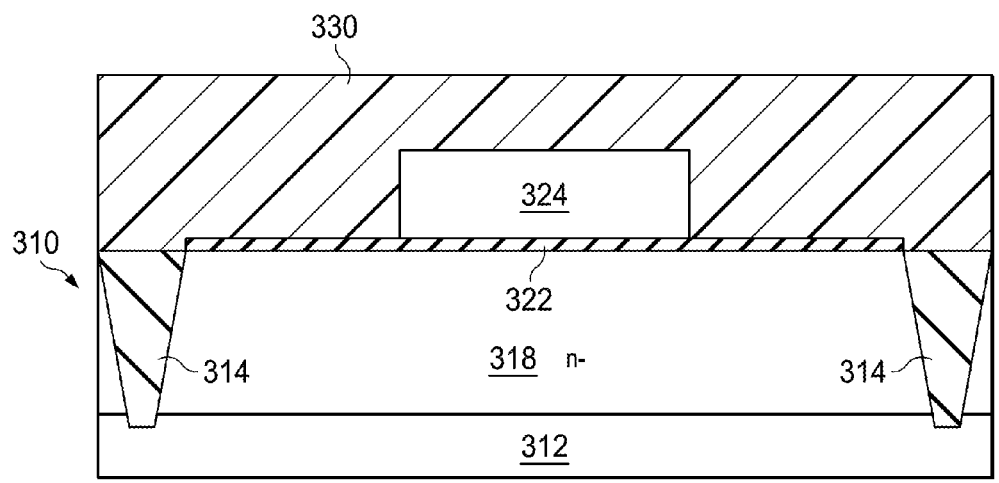
Figure 3E:
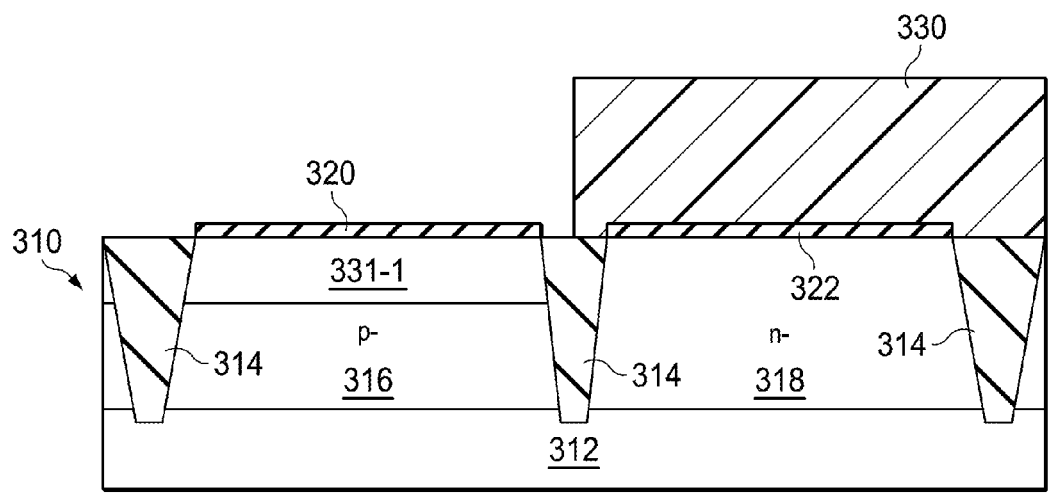
Figure 3F:
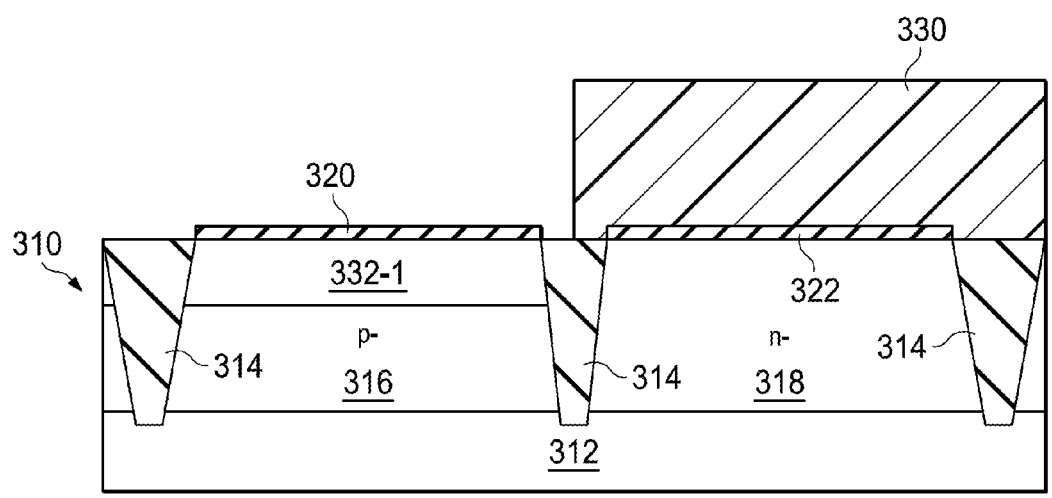
Figure 4A:
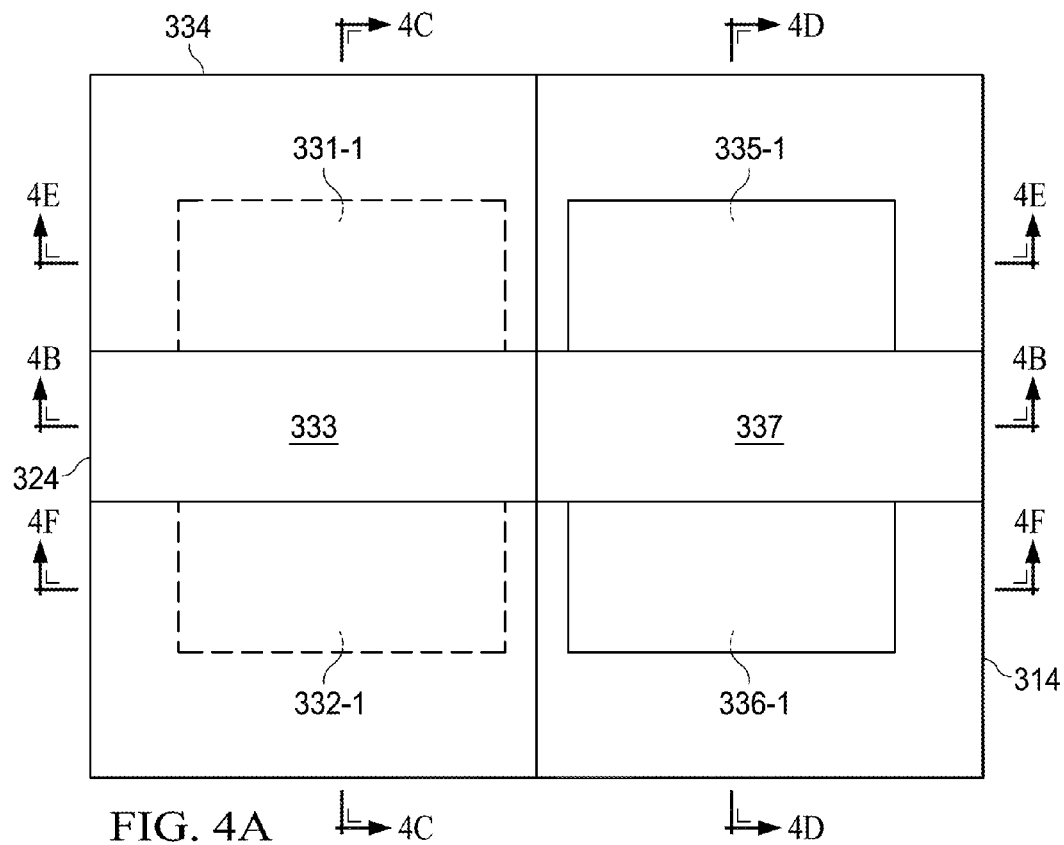
Figure 4B:
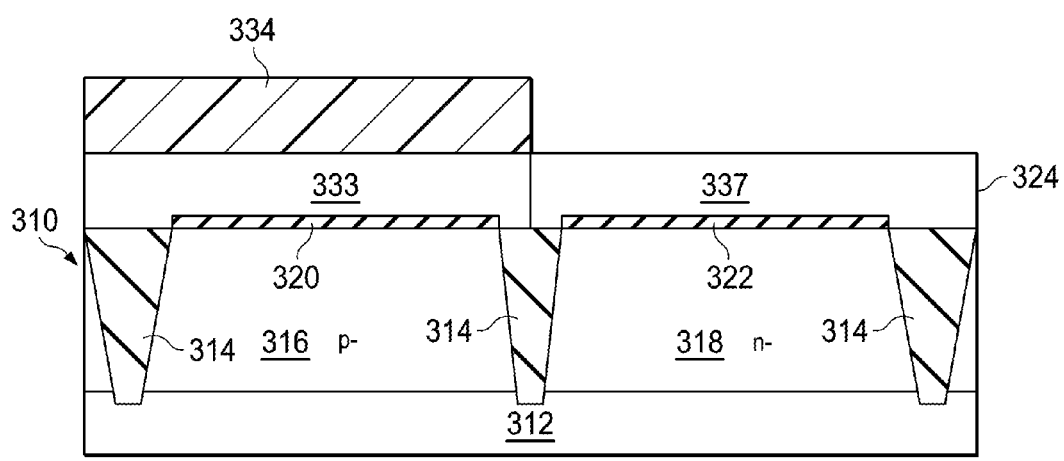
Figure 4C:
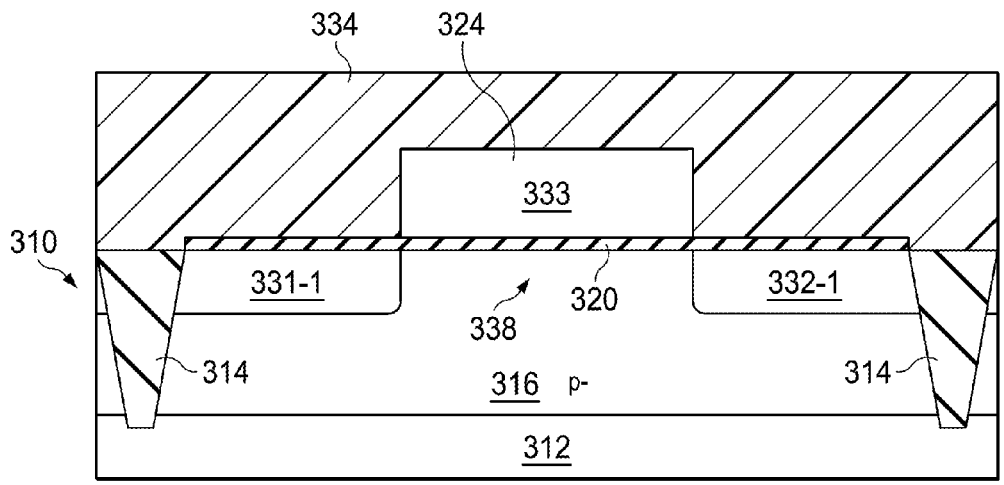
Figure 4D:
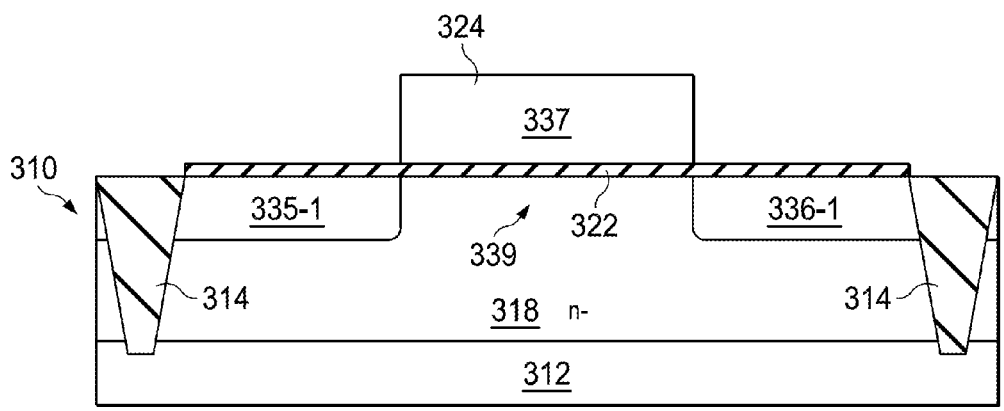
Figure 4E:
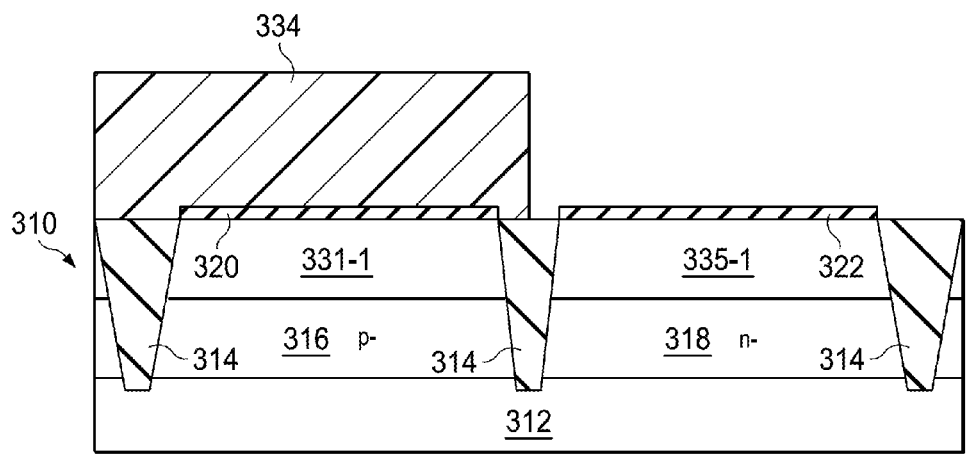
Figure 4F:
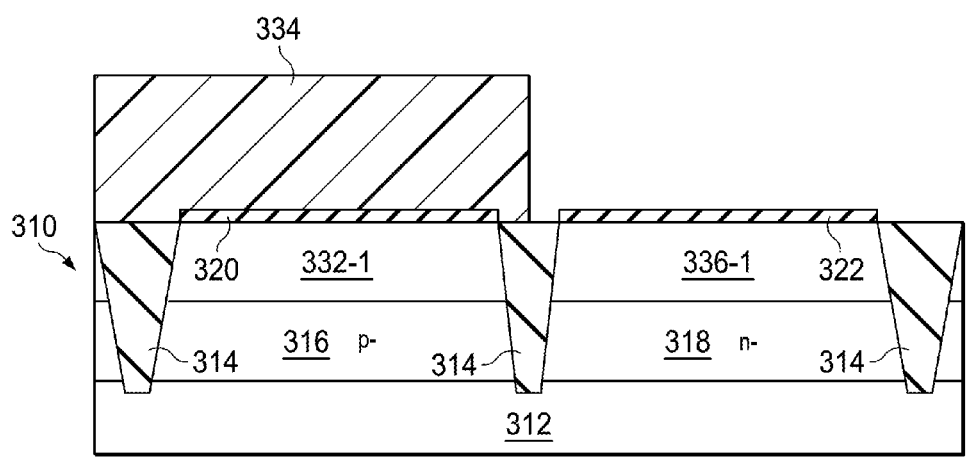
Figure 5A:
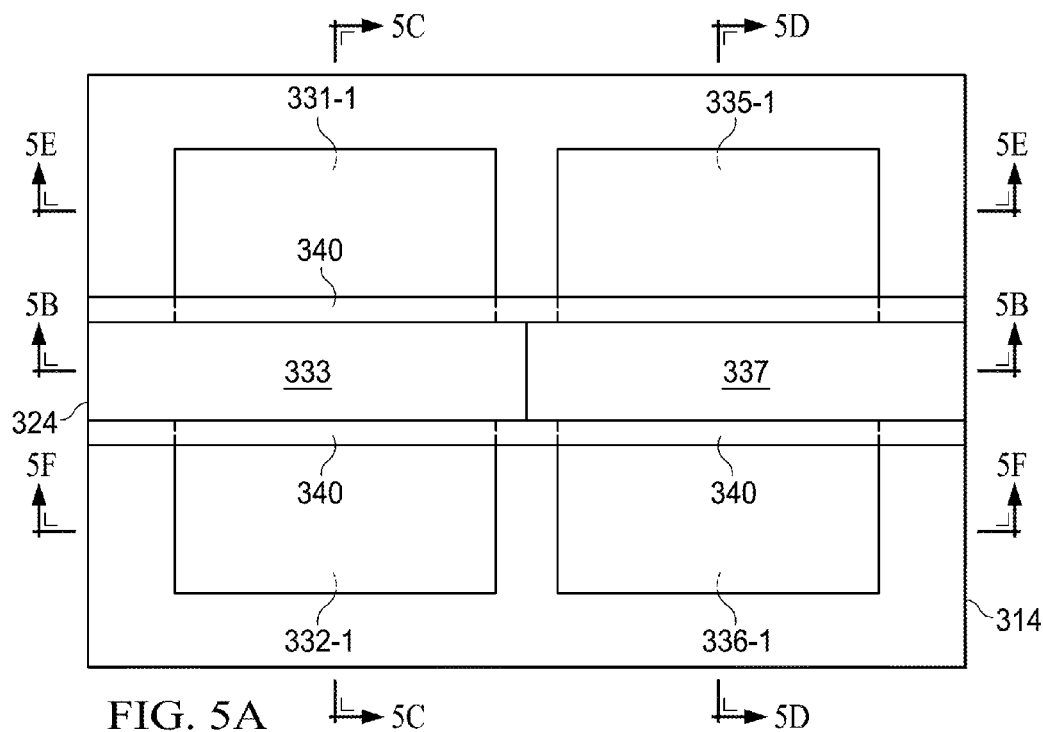
Figure 5B:
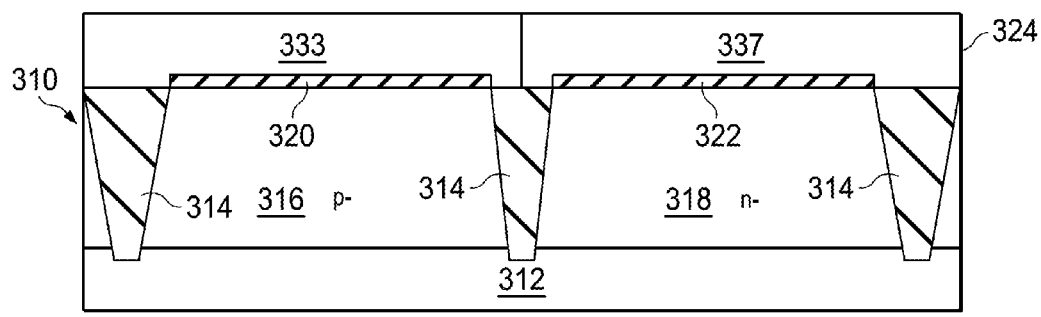
Figure 5C:
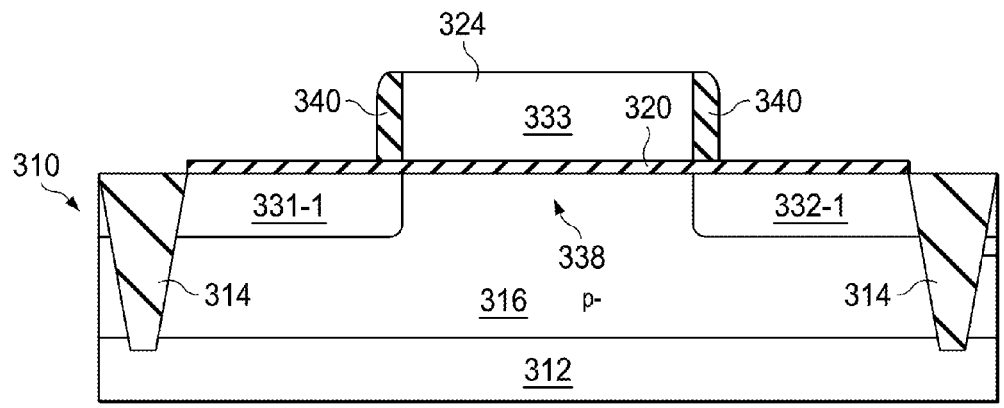
Figure 5D:
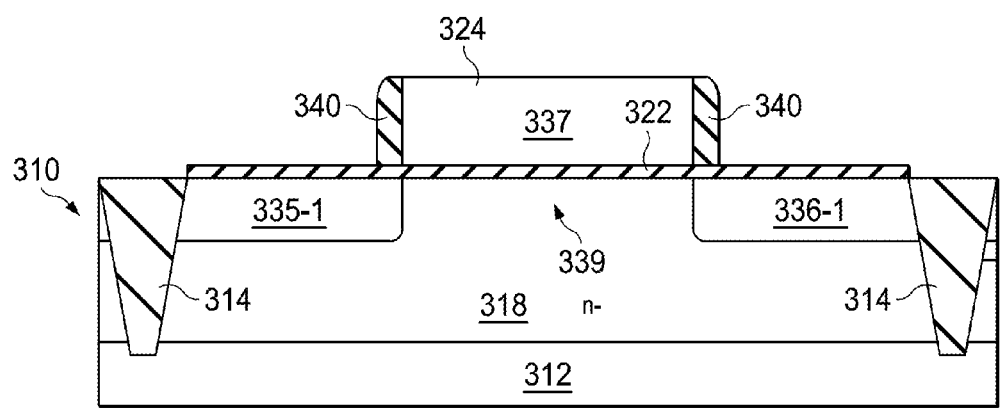
Figure 5E:
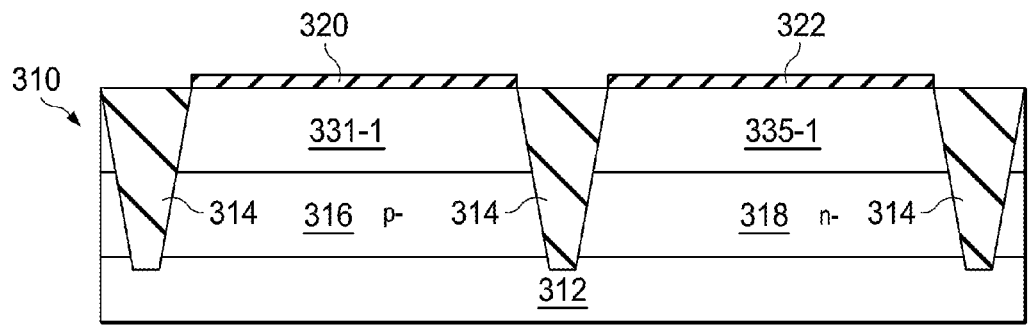
Figure 5F:
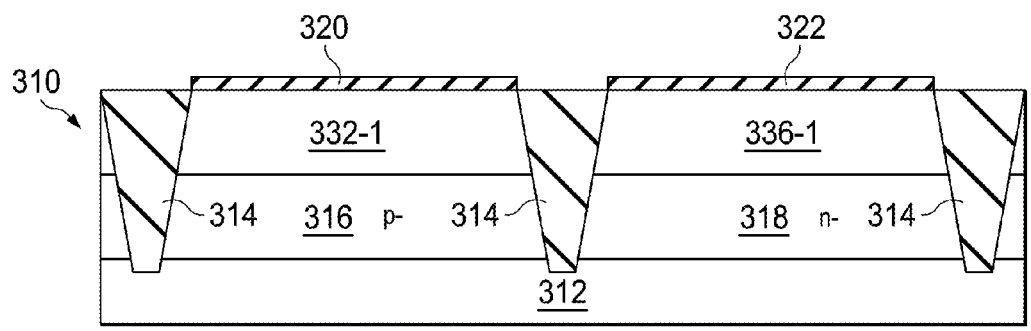
Figure 6A:
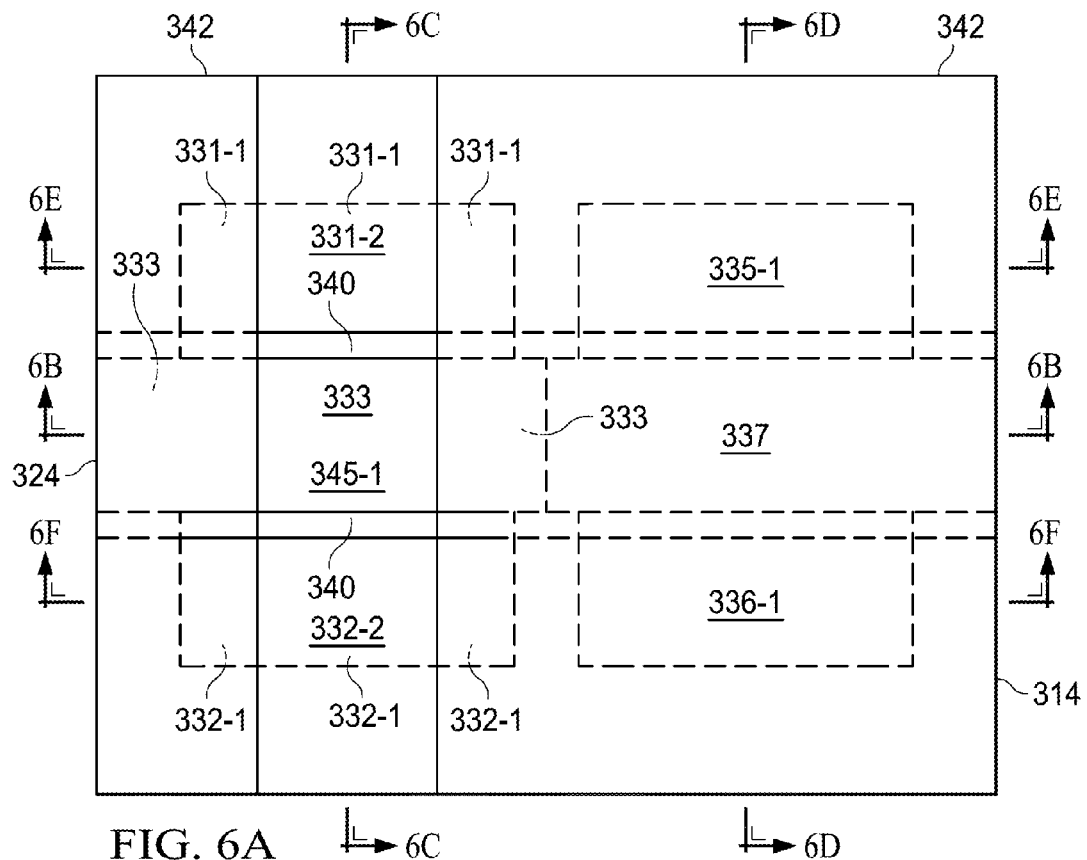
Figure 6B:
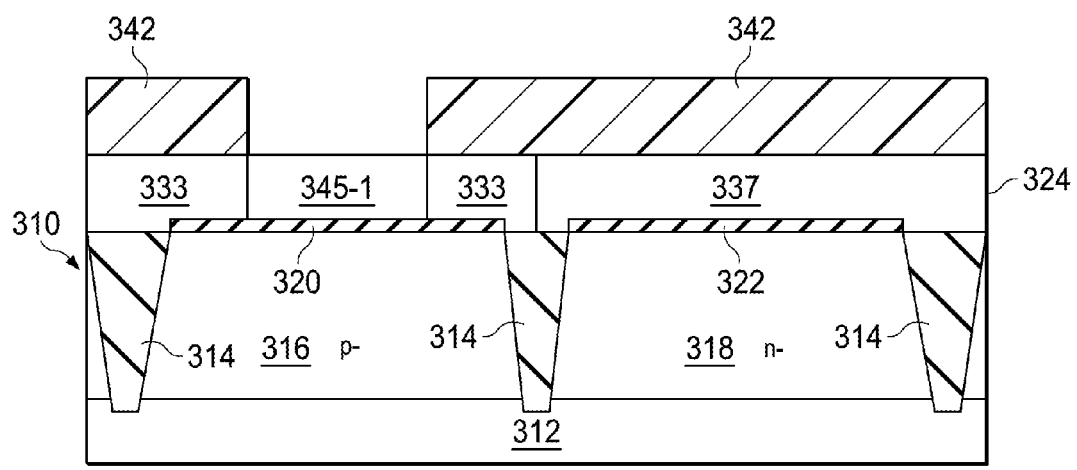
Figure 6C:
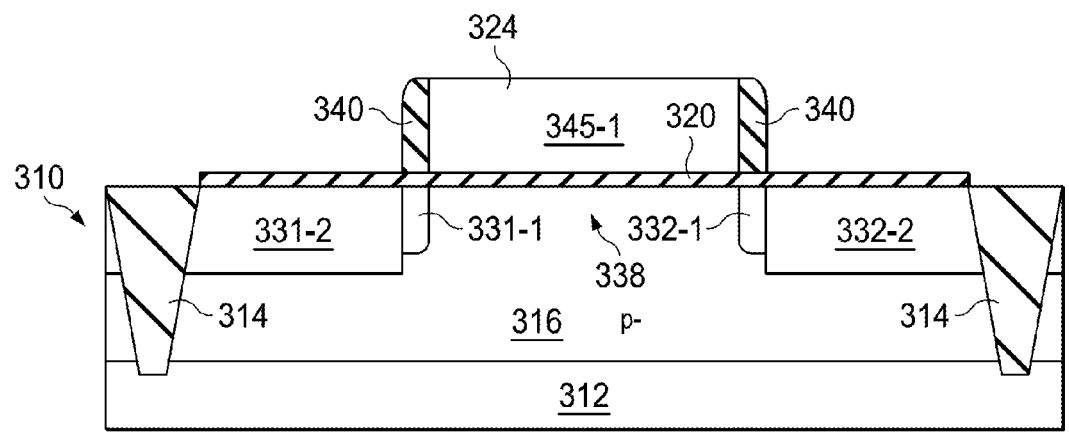
Figure 6D:
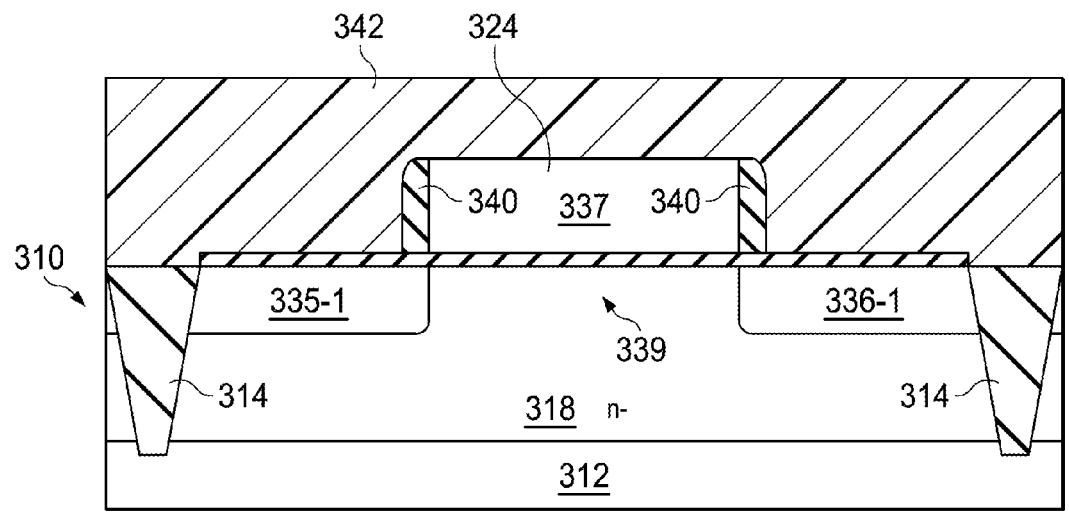
Figure 6E:
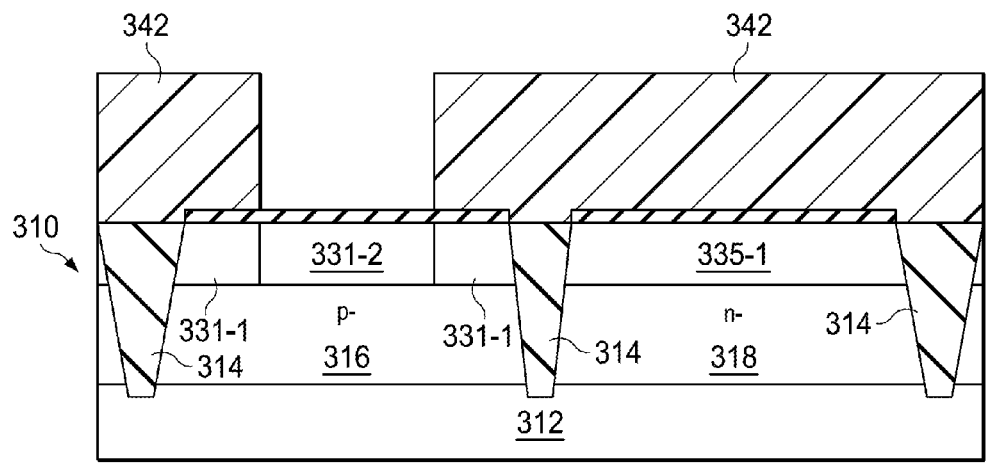
Figure 6F:
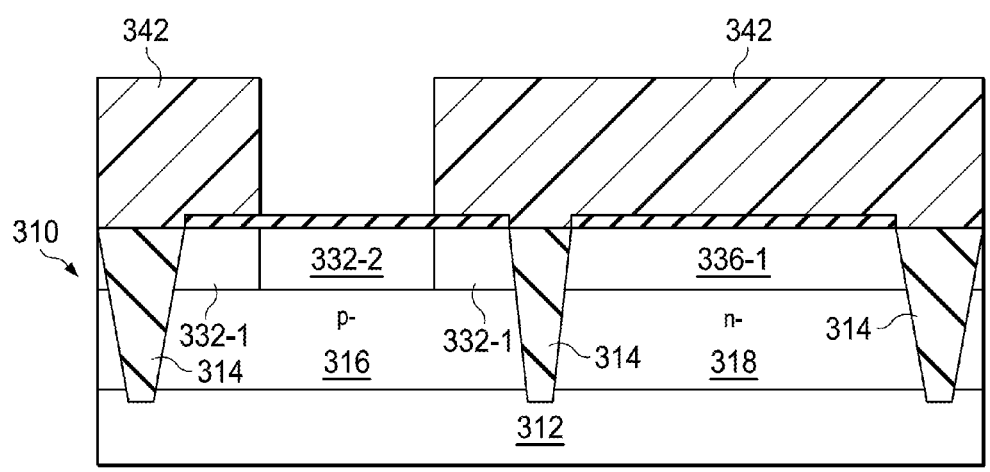
Figure 7A:
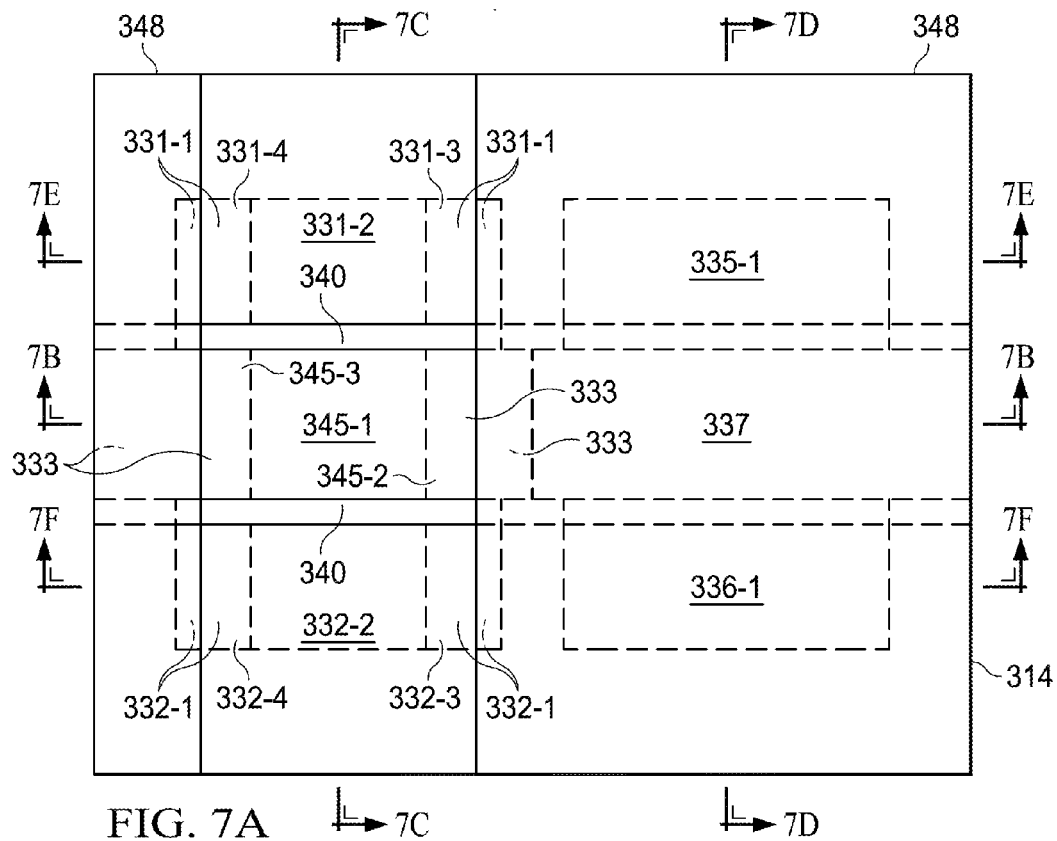
Figure 7B:
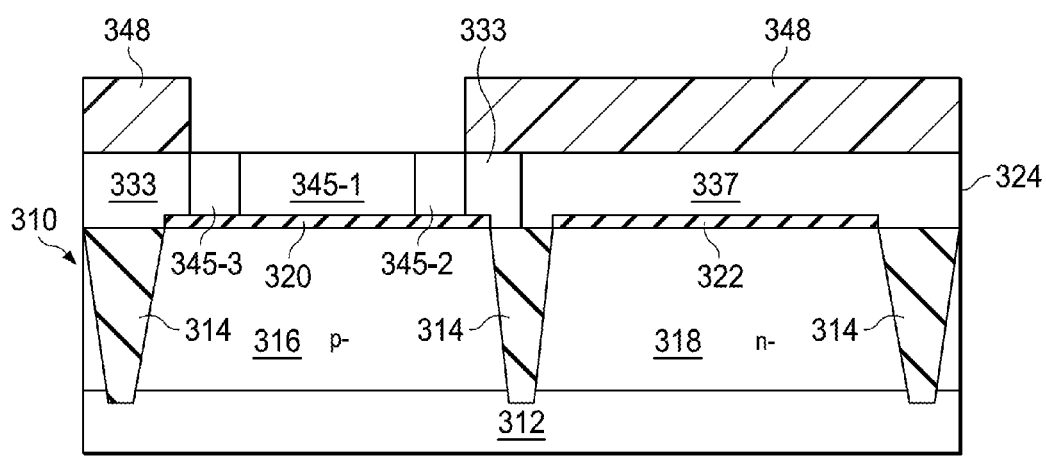
Figure 7C:
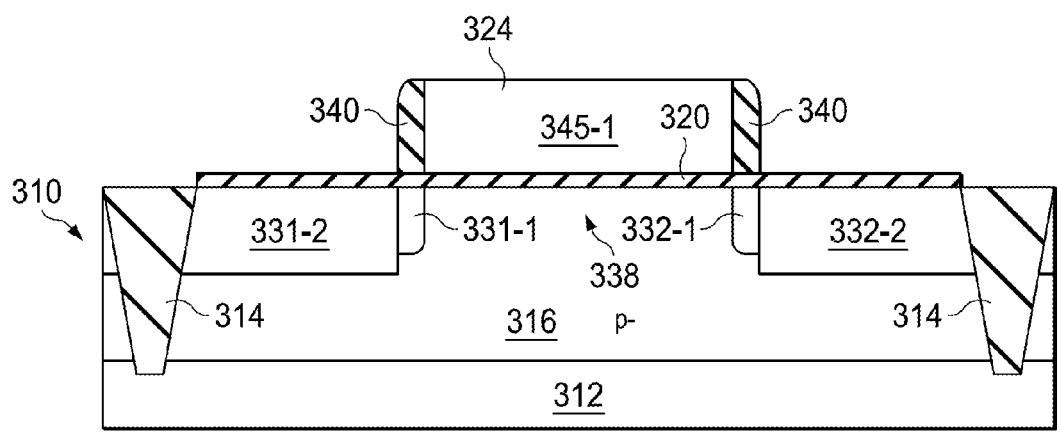
Figure 7D:
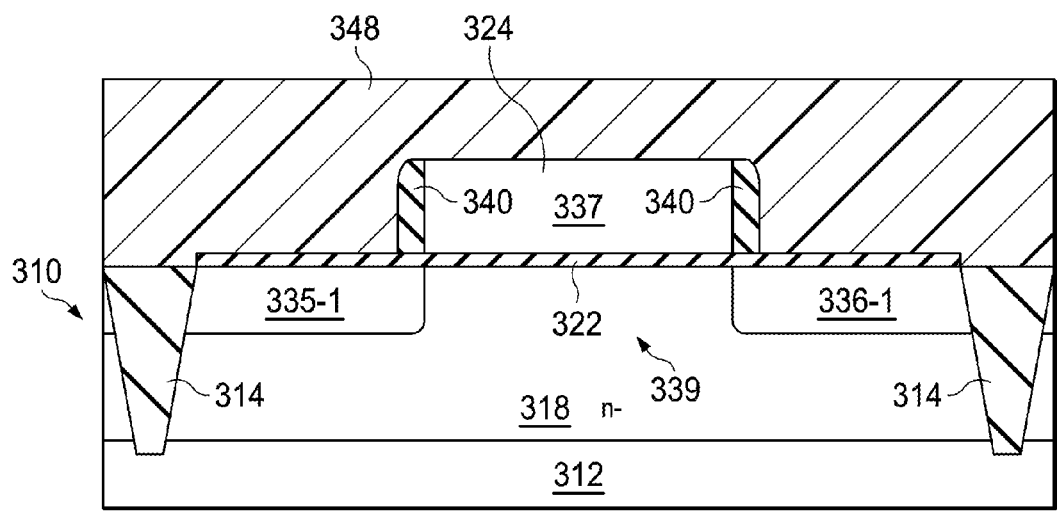
Figure 7E:
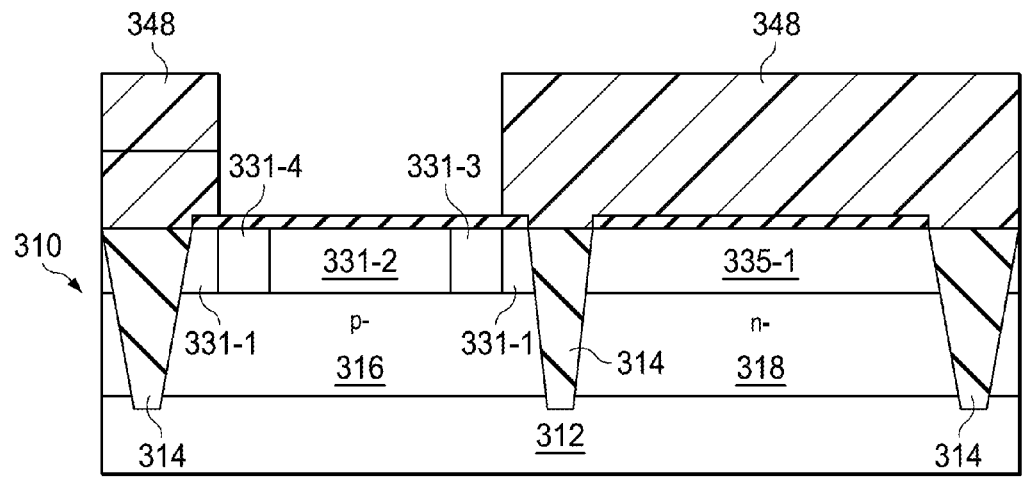
Figure 7F:
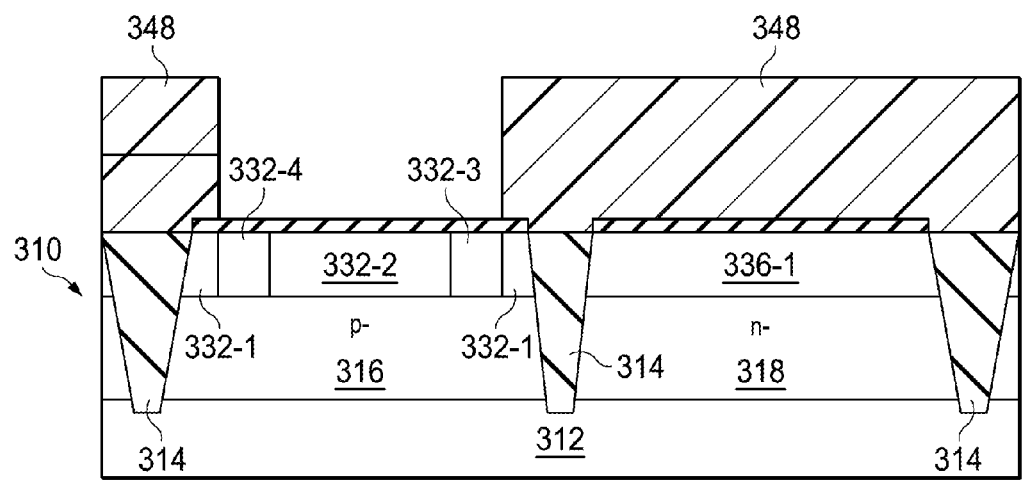
Figure 8A:
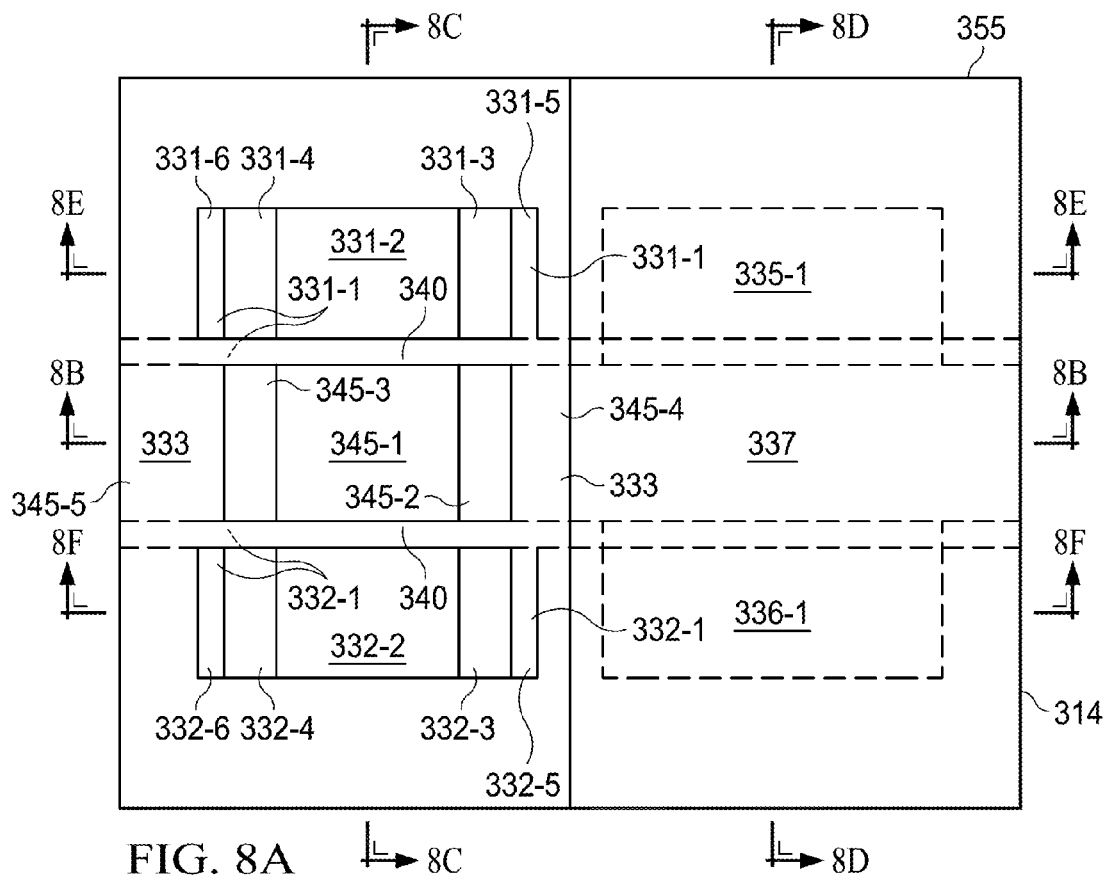
Figure 8B:
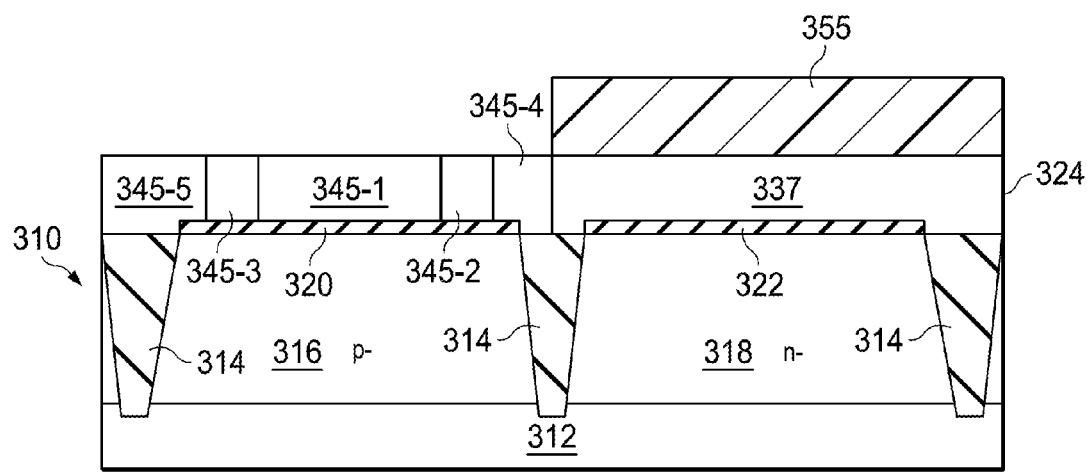
Figure 8C:
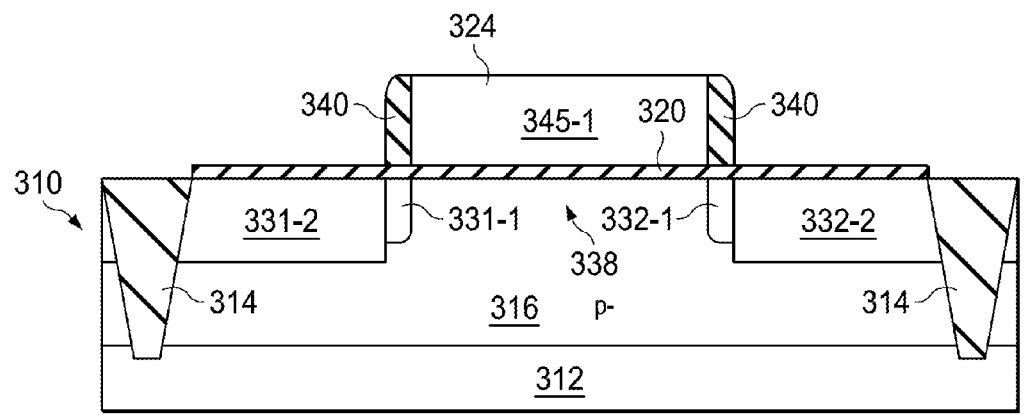
Figure 8D:
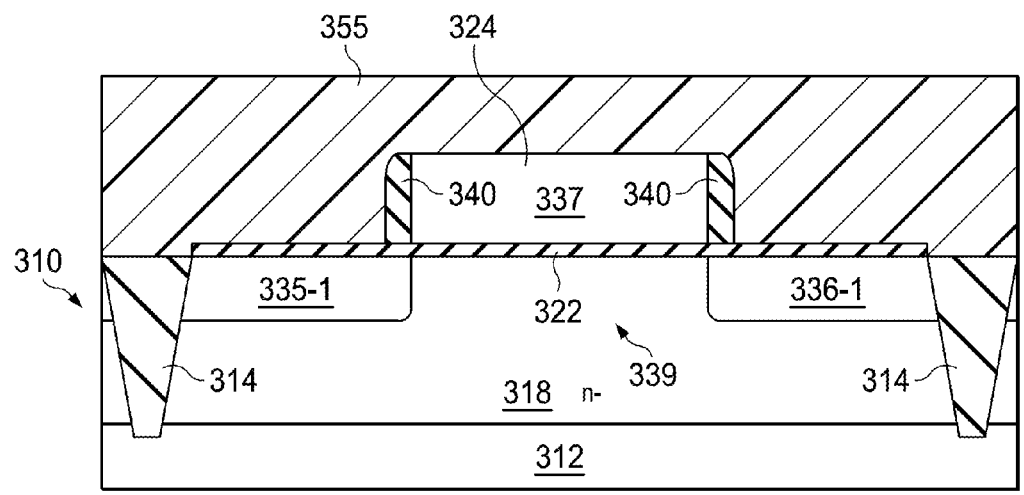
Figure 8E:
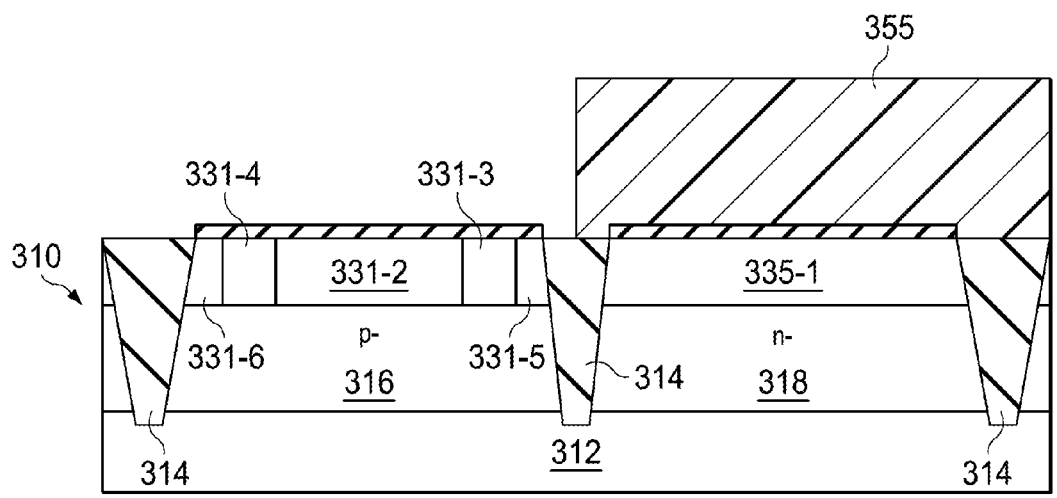
Figure 8F:
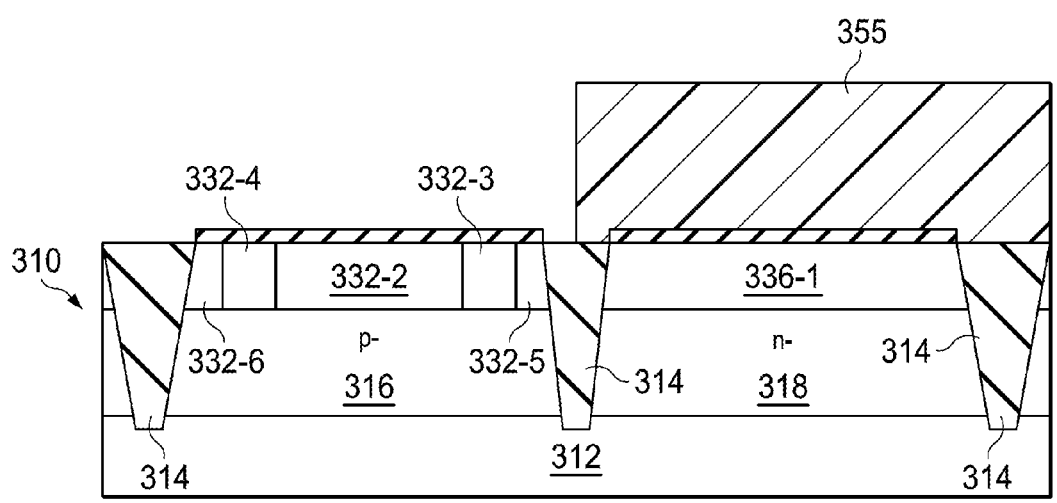
Figure 9A:
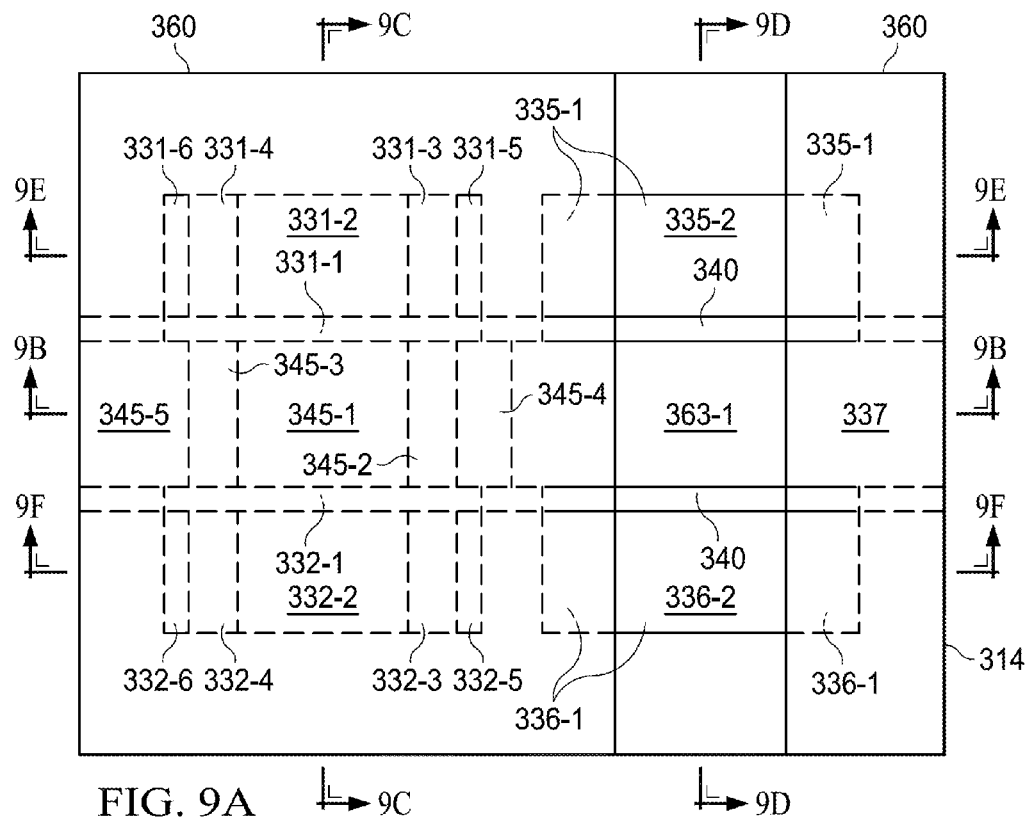
Figure 9B:
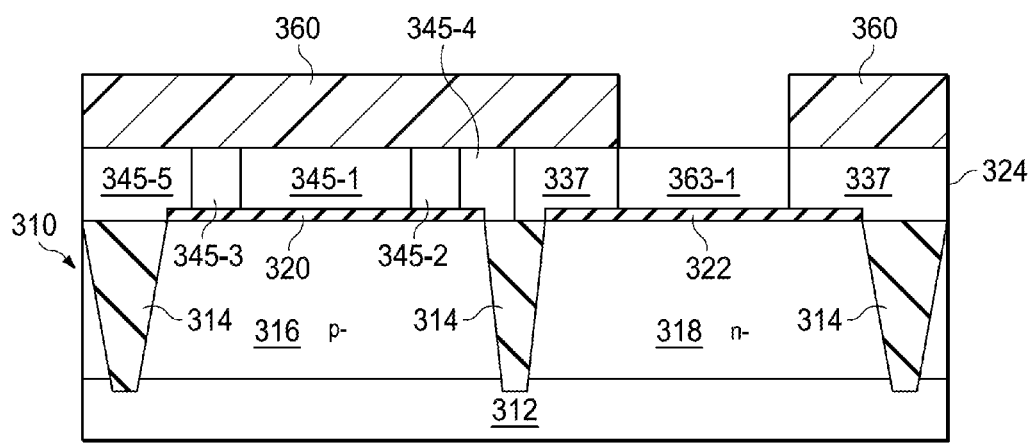
Figure 9C:
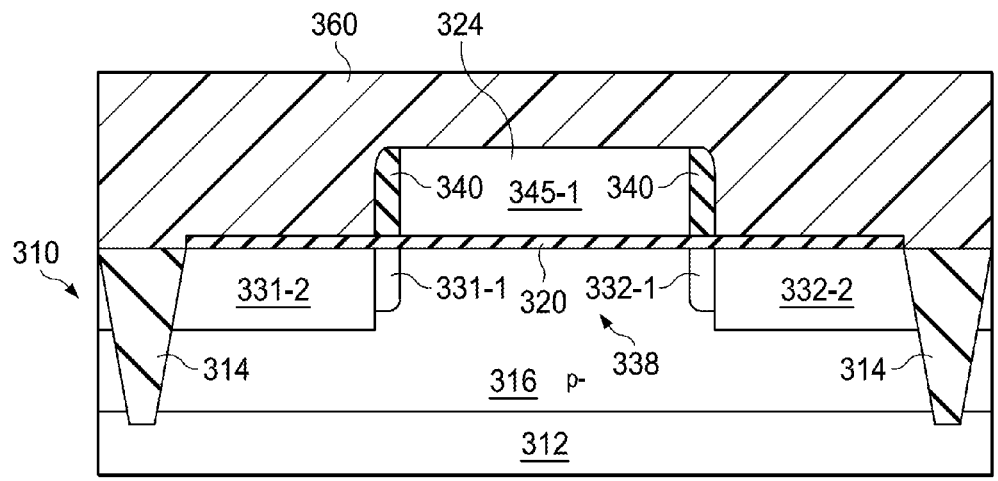
Figure 9D:
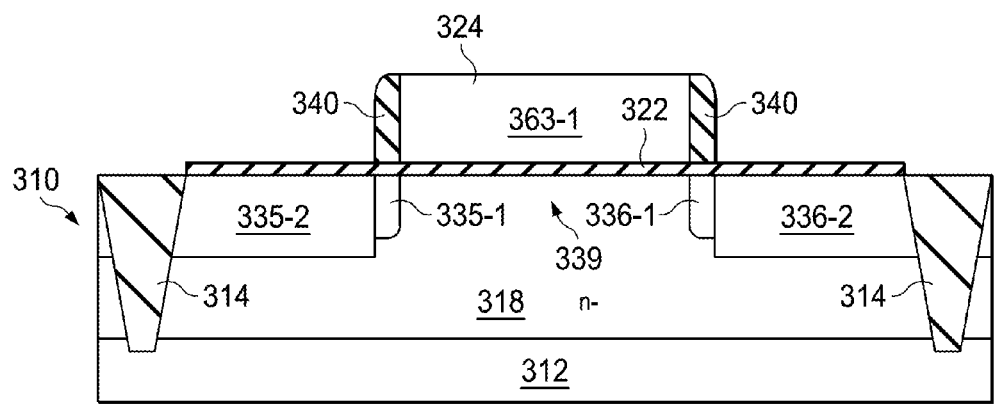
Figure 9E:
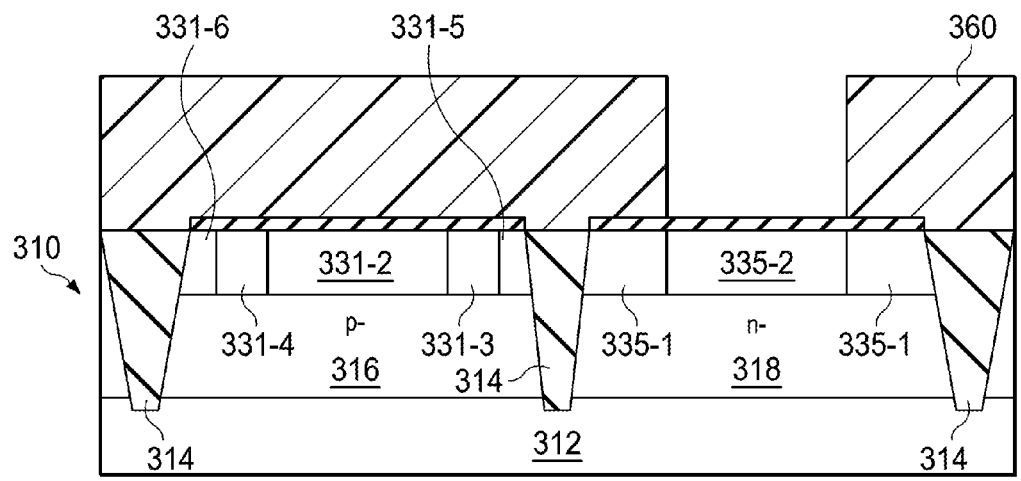
Figure 9F:
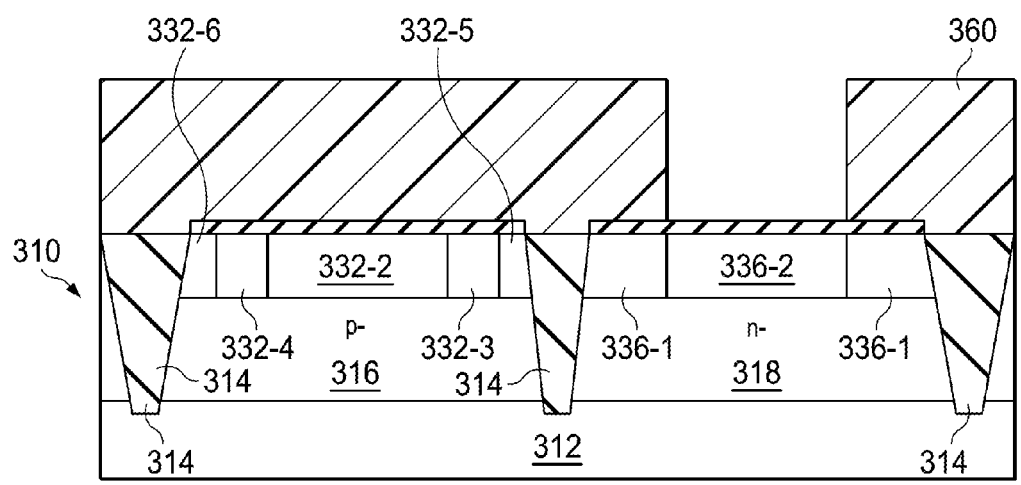
Figure 10A:
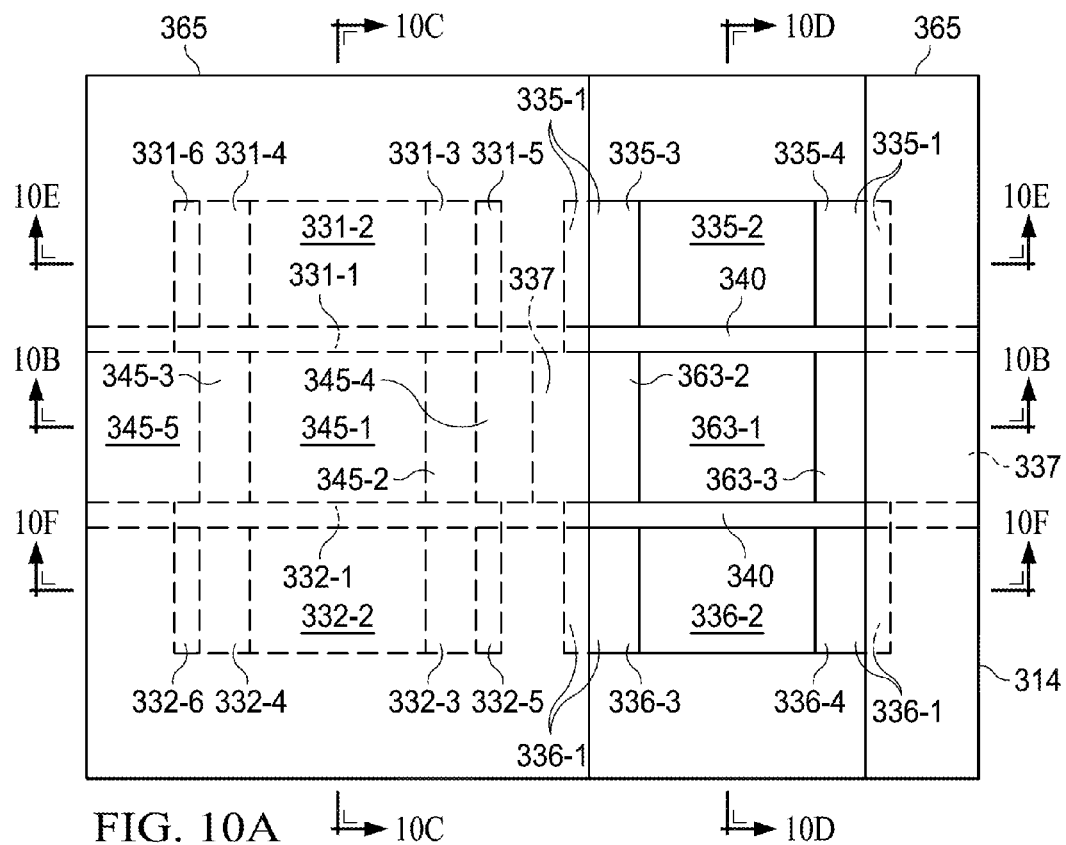
Figure 10B:
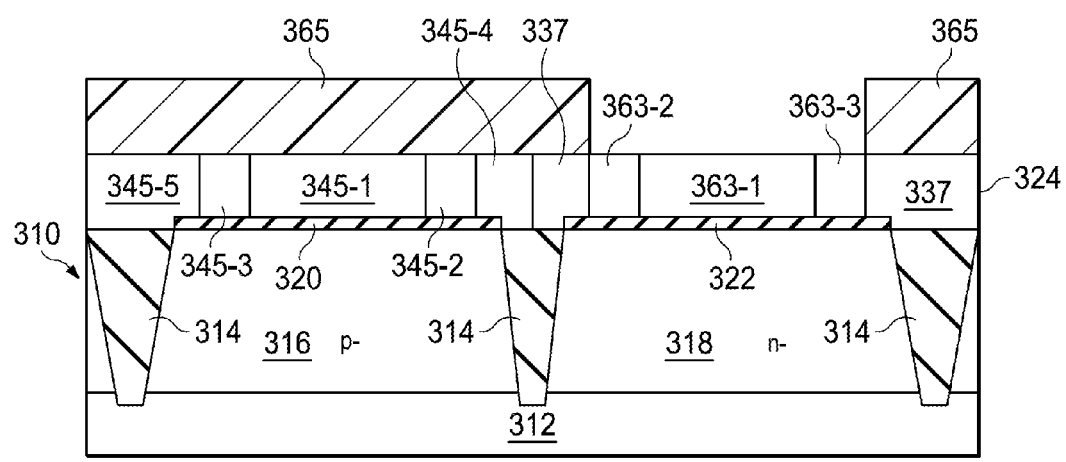
Figure 10C:
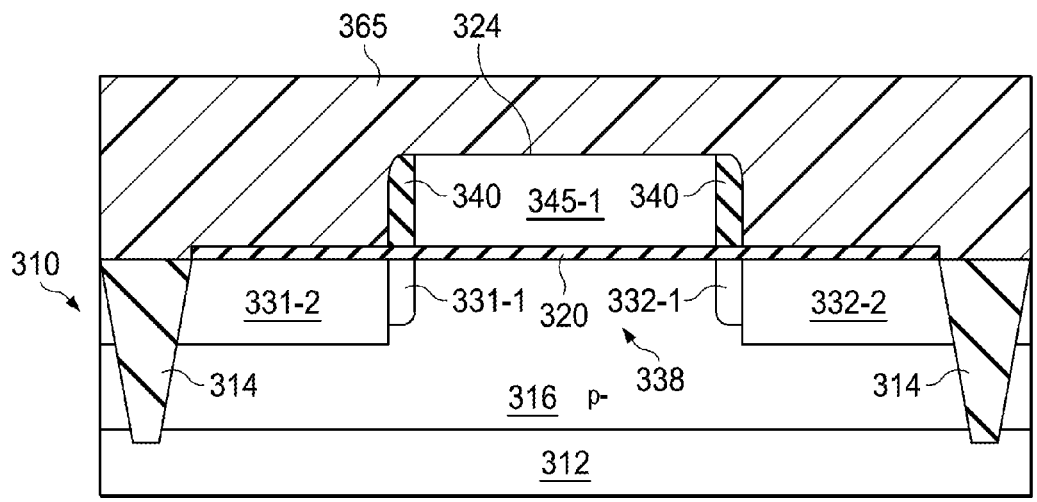
Figure 10D:
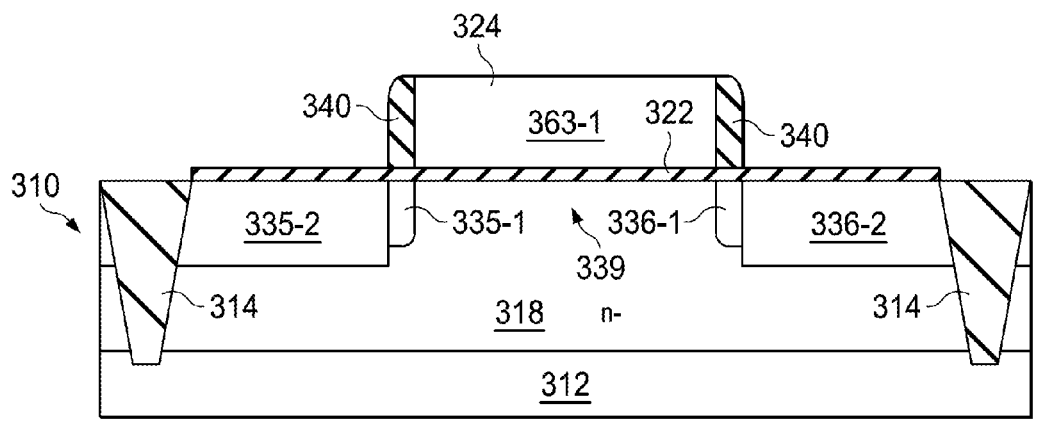
Figure 10E:
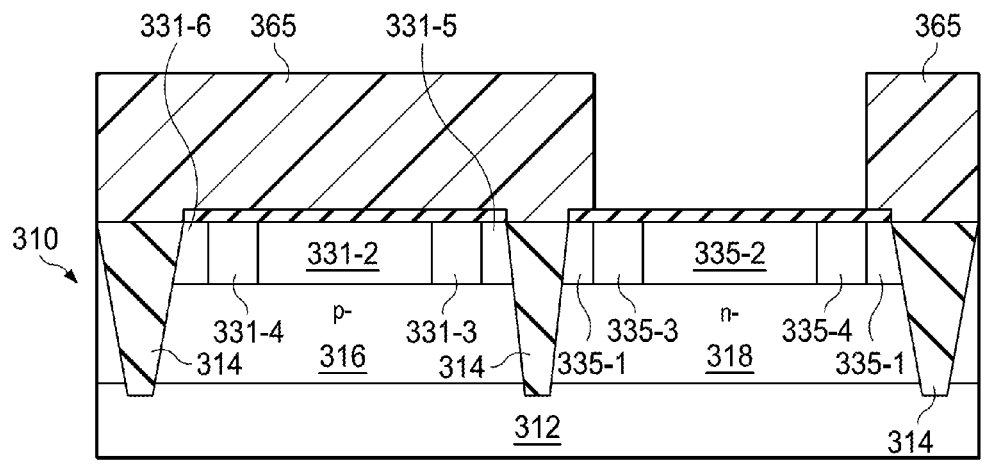
Figure 10F:
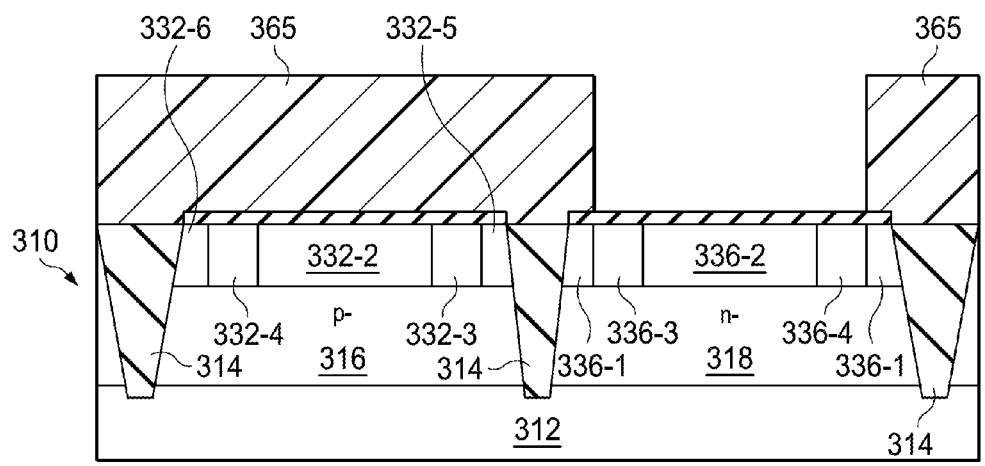
Figure 11A:
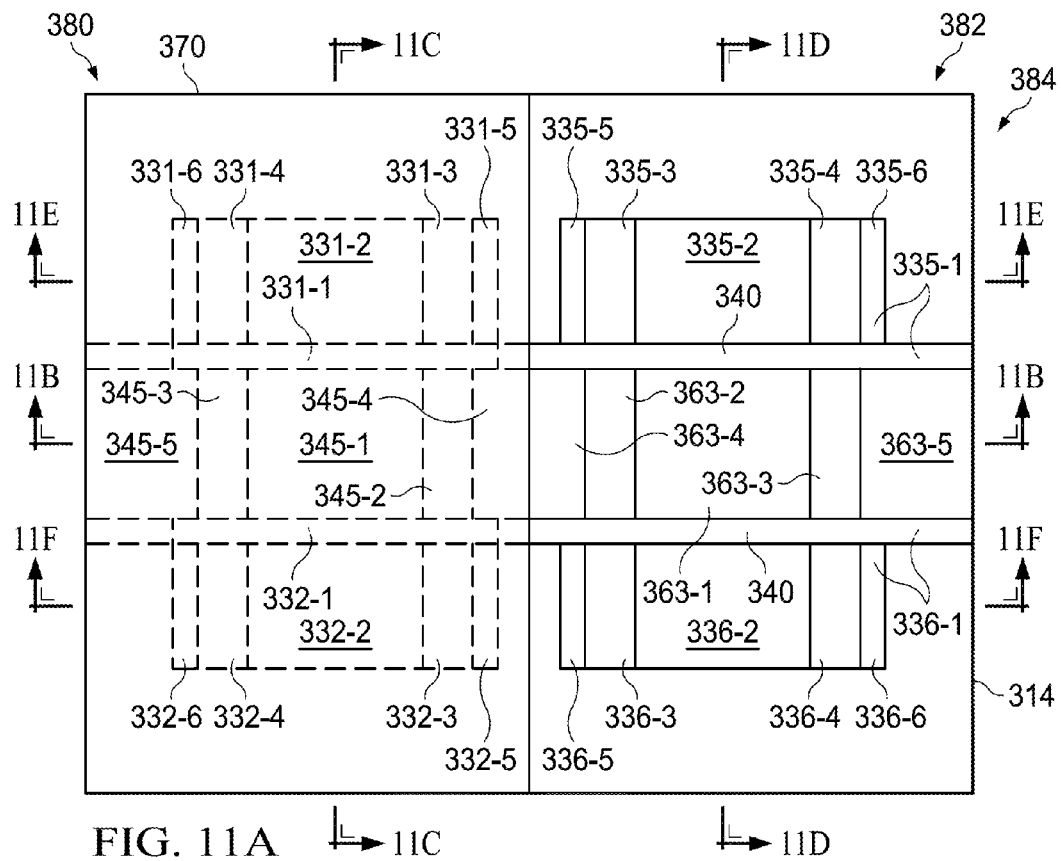
Figure 11B:
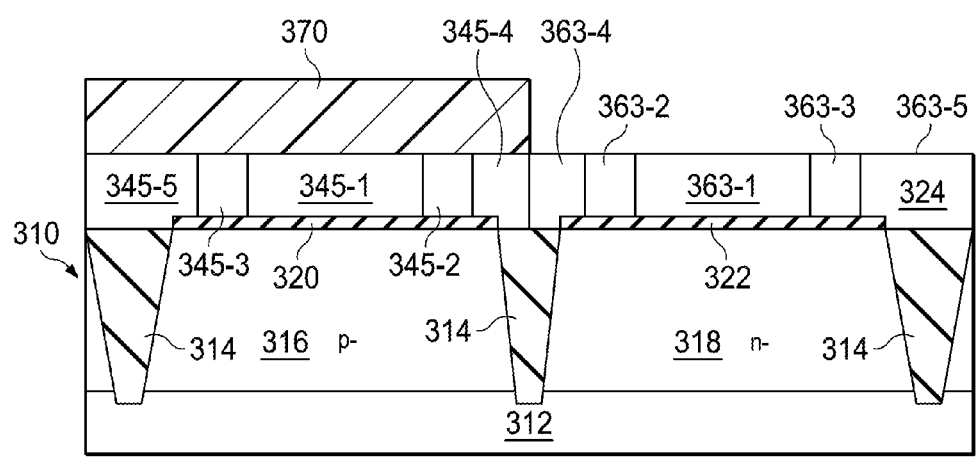
Figure 11C:
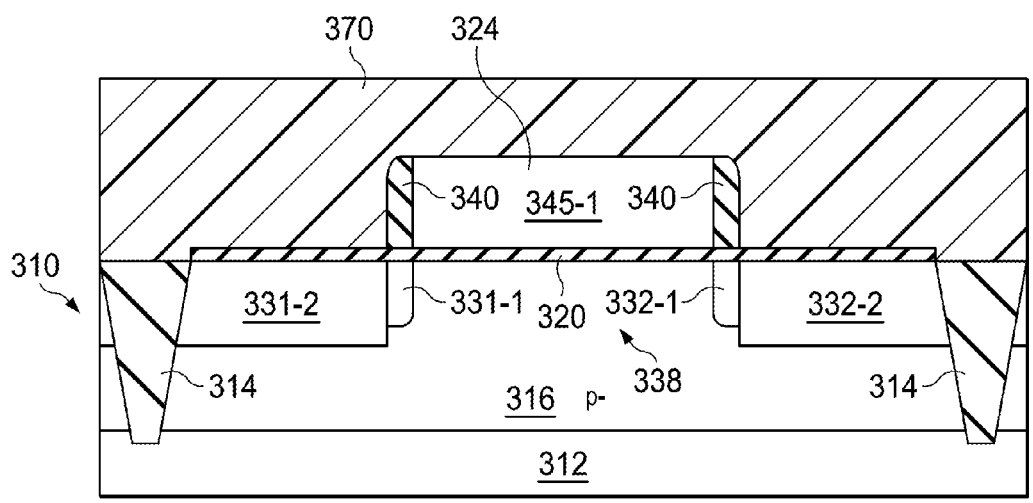
Figure 11D:
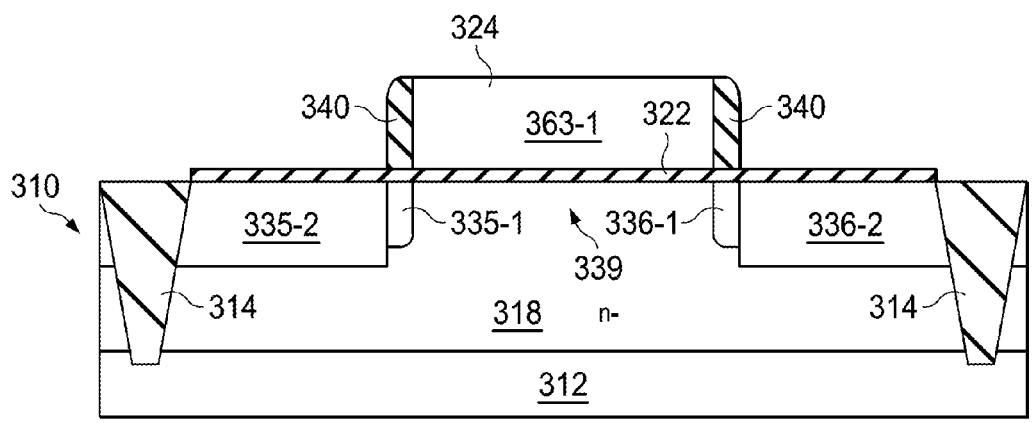
Figure 11E:
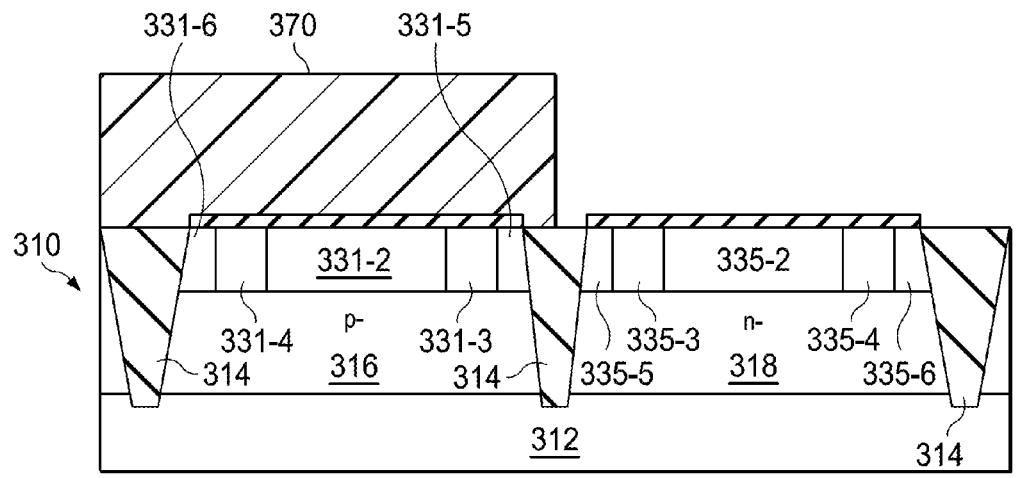
Figure 11F:
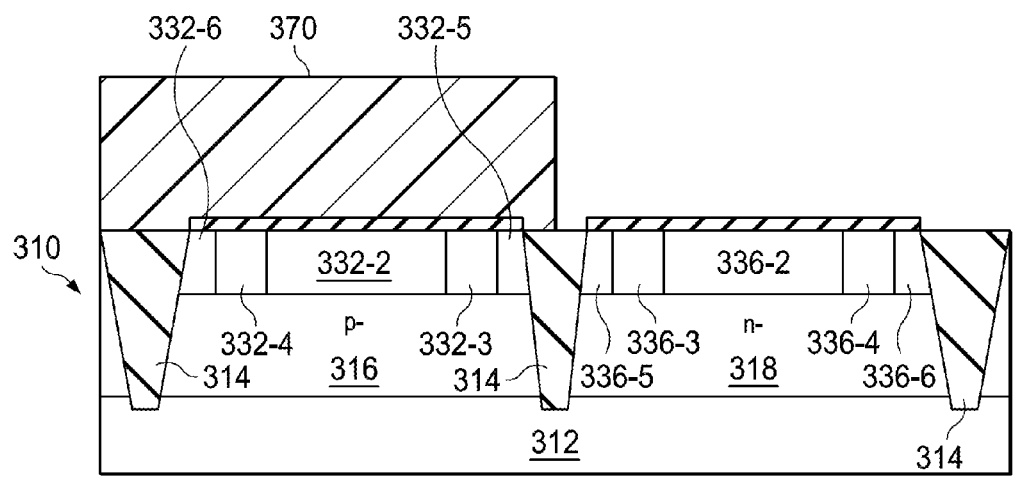

FIGS. 2A-2F show views that illustrate an example of a semiconductor structure 200 in accordance with the present invention. FIG. 2A shows a plan view, while FIG. 2B shows a cross-sectional view taken along line 2B-2B of FIG. 2A, FIG. 2C shows a cross-sectional view taken along line 2C-2C of FIG. 2A, FIG. 2D shows a cross-sectional view taken along line 2D-2D of FIG. 2A, FIG. 2E shows a cross-sectional view taken along line 2E-2E of FIG. 2A, and FIG. 2F shows a cross-sectional view taken along line 2F-2F of FIG. 2A. Semiconductor structure 200 is similar to semiconductor structure 100 and, as a result, utilizes the same reference numerals to designate the structures which are common to both devices.

As shown in FIGS. 2A-2F, semiconductor structure 200 differs from semiconductor structure 100 in that semiconductor structure 200 utilizes a semiconductor body 210 in lieu of semiconductor body 110. Semiconductor body 210, in turn, is the same as semiconductor body 110, except that semiconductor body 210 utilizes an n-type source 212 and an n-type drain 214 in lieu of n-type source 120 and n-type drain region 122, respectively.

In addition, semiconductor body 210 utilizes a p-type source 216 and a p-type drain 218 in lieu of p-type source 124 and p-type drain 126, respectively. As a result, source 212 and drain 214 touch, and are separated, by channel portion 130 of p-well 116, while source 216 and drain 218 touch, and are separated by, channel portion 132 of n-well 118.

N-type source 212 can have three or more source regions. In the present example, source 212 has six source regions, which include a first source region 212-1, a second source region 212-2, a third source region 212-3, a fourth source region 212-4, a fifth source region 212-5, and a sixth source region 212-6. As described in greater detail below, the fifth and sixth source regions 212-5 and 212-6 are relatively lightly doped and, therefore, are preferably as narrow as possible, being omitted when possible.

First source region 212-1 lies directly vertically below a portion of non-conductive side wall spacer 150, while second source region 212-2 touches first source region 212-1. Third source region 212-3 and fourth source region 212-4 each touch first source region 212-1 and second source region 212-2.

In addition, third source region 212-3 and fourth source region 212-4, which are spaced apart from each other, touch and lie on opposite sides of second source region 212-2. Further, fifth source region 212-5 touches first source region 212-1 and third source region 212-3, and sixth source region 212-6 touches first source region 212-1 and fourth source region 212-4. Fifth source region 212-5 and sixth source region 212-6 are spaced apart from each other.

First source region 212-1 has substantially a first n-type dopant concentration, while second source region 212-2 has substantially a second n-type dopant concentration that is greater than the first n-type dopant concentration. Third source region 212-3 and fourth source region 212-4 each has substantially a third n-type dopant concentration that is greater than the first n-type dopant concentration and less than the second n-type dopant concentration. Fifth source region 212-5 and sixth source region 212-6 each has substantially a fourth n-type dopant concentration that is greater than the first n-type dopant concentration and less than the third n-type dopant concentration.

Similarly, n-type drain 214 can have three or more drain regions. In the present example, drain 214 has six drain regions, which include a first drain region 214-1, a second drain region 214-2, a third drain region 214-3, a fourth drain region 214-4, a fifth drain region 214-5, and a sixth drain region 214-6. As described in greater detail below, the fifth and sixth drain regions 214-5 and 214-6 are relatively lightly doped and, therefore, are preferably as narrow as possible, being omitted when possible.

First drain region 214-1 lies directly vertically below a portion of non-conductive side wall spacer 150, while second drain region 214-2 touches first drain region 214-1. Third drain region 214-3 and fourth drain region 214-4 each touch first drain region 214-1 and second drain region 214-2.

In addition, third drain region 214-3 and fourth drain region 214-4, which are spaced apart from each other, touch and lie on opposite sides of second drain region 214-2. Further, fifth drain region 214-5 touches first drain region 214-1 and third drain region 214-3, while sixth drain region 214-6 touches first drain region 214-1 and fourth drain region 214-4. The fifth drain region 214-5 and the sixth drain region 214-6 are spaced apart from each other.

First drain region 214-1 has substantially the first n-type dopant concentration, while second drain region 214-2 has substantially the second n-type dopant concentration. Third drain region 214-3 and fourth drain region 212-4 each has substantially the third n-type dopant concentration, while fifth drain region 214-5 and sixth drain region 214-6 each has substantially the fourth n-type dopant concentration.

Like n-type source 212, p-type source 216 can have three or more source regions. In the present example, source 216 has six source regions, which include a first source region 216-1, a second source region 216-2, a third source region 216-3, a fourth source region 216-4, a fifth source region 216-5, and a sixth source region 216-6. As described in greater detail below, the fifth and sixth source regions 216-5 and 216-6 are relatively lightly doped and, therefore, are preferably as narrow as possible, being omitted when possible.

First source region 216-1 lies directly vertically below a portion of non-conductive side wall spacer 150, while second source region 216-2 touches first source region 216-1. Third source region 216-3 and fourth source region 216-4 each touch first source region 216-1 and second source region 216-2.

In addition, third source region 216-3 and fourth source region 216-4, which are spaced apart from each other, touch and lie on opposite sides of second source region 216-2. Further, fifth source region 216-5 touches first source region 216-1 and third source region 216-3, and sixth source region 216-6 touches first source region 216-1 and fourth source region 216-4. Fifth source region 216-5 and sixth source region 216-6 are spaced apart from each other.

First source region 216-1 has substantially a first p-type dopant concentration, while second source region 216-2 has substantially a second p-type dopant concentration that is greater than the first p-type dopant concentration. Third source region 216-3 and fourth source region 216-4 each has substantially a third p-type dopant concentration that is greater than the first p-type dopant concentration and less than the second p-type dopant concentration. Fifth source region 216-5 and sixth source region 216-6 each has substantially a fourth p-type dopant concentration that is greater than the first p-type dopant concentration and less than the third p-type dopant concentration.

Similarly, n-type drain 218 can have three or more drain regions. In the present example, drain 218 has six drain regions, which include a first drain region 218-1, a second drain region 218-2, a third drain region 218-3, a fourth drain region 218-4, a fifth drain region 218-5, and a sixth drain region 218-6. As described in greater detail below, the fifth and sixth drain regions 218-5 and 218-6 are relatively lightly doped and, therefore, are preferably as narrow as possible, being omitted when possible.

First drain region 218-1 lies directly vertically below a portion of non-conductive side wall spacer 150, while second drain region 218-2 touches first drain region 218-1. Third drain region 218-3 and fourth drain region 218-4 each touch first drain region 218-1 and second drain region 218-2.

In addition, third drain region 218-3 and fourth drain region 218-4, which are spaced apart from each other, touch and lie on opposite sides of second drain region 218-2. Further, fifth drain region 218-5 touches first drain region 218-1 and third drain region 218-3, while sixth drain region 218-6 touches first drain region 218-1 and fourth drain region 218-4. The fifth drain region 218-5 and the sixth drain region 218-6 are spaced apart from each other.

First drain region 218-1 has substantially the first p-type dopant concentration, while second drain region 218-2 has substantially the second p-type dopant concentration. Third drain region 218-3 and fourth drain region 218-4 each has substantially the third p-type dopant concentration, while fifth drain region 218-5 and sixth drain region 218-6 each has substantially the fourth p-type dopant concentration.

As further shown in FIGS. 2A-2F, semiconductor structure 200 also differs from semiconductor structure 100 in that semiconductor structure 200 utilizes a gate 220 in lieu of gate 140. As with gate 140, gate 220 touches trench isolation structure 114, gate insulation region 134, gate insulation region 136, and non-conductive side wall spacer 150. In addition, gate 220 lies over channel portion 130 and channel portion 132.

Gate 220, which can be implemented with, for example, polycrystalline silicon, can have two or more n-type gate regions that lie above channel portion 130, and two or more p-type gate regions that lie above channel portion 132. In the present example, gate 220 has five n-type gate regions that lie over channel portion 130, which include a first gate region 226-1, a second gate region 226-2, a third gate region 226-3, a fourth gate region 226-4, and a fifth gate region 226-5.

First gate region 226-1 lies directly vertically above a region of channel portion 130. Second gate region 226-2 and third gate region 226-3, which are spaced apart from each other, each touch and lie on opposite sides of first gate region 226-1. Second gate region 226-2 and third gate region 226-3 also each lie above a region of channel portion 130.

In addition, fourth gate region 226-4 touches second gate region 226-2, while fifth gate region 226-5 touches third gate region 226-3. Further, fourth gate region 226-4 and fifth gate region 226-5, which are spaced apart from each other, each lies above a region of channel portion 130 and a region of trench isolation structure 114.

Fourth gate region 226-4 is wide enough so that fourth gate region 226-4 has substantially a uniform dopant concentration (some diffusion occurs at the edges of fourth gate region 226-4) that is relatively light. In the present example, the extent to which fourth gate region 226-4 overlies channel portion 130 defines the widths of the fifth source and drain regions 212-5 and 214-5.

Since fourth gate region 226-4 is relatively lightly doped and defines the widths of the fifth source and drain regions 212-5 and 214-5, fourth gate region 226-4 overlies channel portion 130 as little as necessary, preferably not overlying channel portion 130 at all if possible. (The fifth source and drain regions 212-5 and 214-5 are eliminated when fourth gate region 226-4 does not overlies channel portion 130 at all.)

Fifth gate region 226-5 is wide enough so that fifth gate region 226-5 has substantially a uniform dopant concentration (some diffusion occurs at the edges of fifth gate region 226-5) that is relatively light. In the present example, the extent to which fifth gate region 226-5 overlies channel portion 130 defines the widths of the sixth source and drain regions 212-6 and 214-6. Since fifth gate region 226-5 is relatively lightly doped and defines the widths of the sixth source and drain regions 212-6 and 214-6, fifth gate region 226-5 overlies channel portion 130 as little as necessary, preferably not overlying channel portion 130 at all if possible. (The sixth source and drain regions 212-6 and 214-6 are eliminated when fifth gate region 226-5 does not overlies channel portion 130 at all.)

First gate region 226-1 has substantially the second n-type dopant concentration, while second gate region 226-2 and third gate region 226-3 each has substantially the third n-type dopant concentration. In addition, fourth gate region 226-4 and fifth gate region 226-5 each has substantially the fourth n-type dopant concentration.

Further in the present example, gate 220 has five gate regions that lie over channel portion 132, which include a first gate region 228-1, a second gate region 228-2, a third gate region 228-3, a fourth gate region 228-4, and a fifth gate region 228-5. First gate region 228-1 lies directly vertically above a region of channel portion 132.

Second gate region 228-2 and third gate region 228-3, which are spaced apart from each other, each touch and lie on opposite sides of first gate region 228-1. Second gate region 228-2 and third gate region 228-3 also each lie above a region of channel portion 132. In addition, fourth gate region 228-4 touches second gate region 228-2 and fourth gate region 226-4, while fifth gate region 228-5 touches third gate region 228-3. Further, fourth gate region 228-4 and fifth gate region 228-5, which are spaced apart from each other, each lies above a region of channel portion 132 and a region of trench isolation structure 114.

Fourth gate region 228-4 is wide enough so that fourth gate region 228-4 has substantially a uniform dopant concentration (some diffusion occurs at the edges of fourth gate region 228-4) that is relatively light. In the present example, the extent to which fourth gate region 228-4 overlies channel portion 132 defines the widths of the fifth source and drain regions 216-5 and 218-5.

Since fourth gate region 228-4 is relatively lightly doped and defines the widths of the fifth source and drain regions 216-5 and 218-5, fourth gate region 228-4 overlies channel portion 132 as little as necessary, preferably not overlying channel portion 132 at all if possible. (The fifth source and drain regions 216-5 and 218-5 are eliminated when fourth gate region 228-4 does not overlies channel portion 132 at all.)

Fifth gate region 228-5 is wide enough so that fifth gate region 228-5 has substantially a uniform dopant concentration (some diffusion occurs at the edges of fifth gate region 228-5) that is relatively light. In the present example, the extent to which fifth gate region 228-5 overlies channel portion 132 defines the widths of the sixth source and drain regions 216-6 and 218-6.

Since fifth gate region 228-5 is relatively lightly doped and defines the widths of the sixth source and drain regions 216-6 and 218-6, fifth gate region 228-5 overlies channel portion 132 as little as necessary, preferably not overlying channel portion 132 at all if possible. (The sixth source and drain regions 216-6 and 218-6 are eliminated when fifth gate region 228-5 does not overlies channel portion 132 at all.)

Further, the extent to which fifth gate region 228-5 overlies channel portion 132 defines the widths of the sixth source and drain regions 216-6 and 218-6. Fifth gate region 228-5 is relatively lightly doped and therefore overlies channel portion 132 as little as necessary, preferably not overlying channel portion 132 at all if possible.

First gate region 228-1 has substantially the second p-type dopant concentration, while second gate region 228-2 and third gate region 228-3 each has substantially the third p-type dopant concentration. In addition, fourth gate region 228-4 and fifth gate region 228-5 each has substantially the fourth p-type dopant concentration.

In addition, semiconductor structure 200 utilizes conductive structure 152 to touch and overlie gate 220 in the same manner that conductive structure 152 touches and overlies gate 140. (Although not shown, a silicide structure can also lie over each of the sources and drains of semiconductor structure 200.)

In operation, p-type well 116, n-type source 210, n-type drain 212, channel region 130, gate insulation region 134, and gate 220 form an NMOS transistor 230, while n-type well 118, p-type source 214, p-type drain 216, channel region 132, gate insulation region 136, and gate 220 form a PMOS transistor 232.

NMOS transistor 230 and PMOS transistor 232 operate the same as NMOS transistor 160 and PMOS transistor 162, except that gate region 226-4 touches gate region 228-4. Gate region 226-4 and gate region 228-4, in turn, have the widths which are necessary to allow gate region 226-4 and gate region 228-4 to each have a substantially low dopant concentration.

As a result, when gate 220 is subsequently annealed, very few dopant atoms from gate region 226-4 and gate region 228-4 diffuse into each other. Thus, the problem of gate cross diffusion is substantially reduced or eliminated, thereby substantially reducing or eliminating the threshold voltage shifts that results from gate cross diffusion.

FIGS. 3A-11A through 3F-11F show a series of views that illustrate an example of a method 300 of forming a semiconductor structure in accordance with the present invention. FIGS. 3A-11A show a series of plan views. FIGS. 3B-11B show a series of cross-sectional views taken along line 3B-3B of FIG. 3A through line 11B-11B of FIG. 11A, respectively. FIGS. 3C-11C show a series of cross-sectional views taken along line 3C-3C of FIG. 3A through line 11C-11C of FIG. 11A, respectively. FIGS. 3D-11D show a series of cross-sectional views taken along line 3D-3D of FIG. 3A through line 11D-11D of FIG. 11A, respectively. FIGS. 3E-11E show a series of cross-sectional views taken along line 3E-3E of FIG. 3A through line 11E-11E of FIG. 11A, respectively. FIGS. 3F-11F show a series of cross-sectional views taken along line 3F-3F of FIG. 3A through line 11F-11F of FIG. 11A, respectively.

As shown in FIGS. 3A-3F, method 300 utilizes a partially-completed conventionally-formed semiconductor structure 308 that includes a semiconductor body 310. Semiconductor body 310, in turn, includes a p-type single-crystal-silicon substrate 312, and a trench isolation structure 314 that touches substrate 312. Semiconductor body 310 also includes a p-type well 316 and an n-type well 318 that touch substrate 312 and trench isolation structure 314. (P-type well 316 can optionally be omitted such that all structures formed in p-well 316 can alternately be formed in p-type substrate 312.)

As additionally shown in FIGS. 3A-3F, semiconductor structure 308 also includes a gate insulation region 320 that touches and lies over p-type well 316, and a gate insulation region 322 that touches and lies over n-type well 318. Semiconductor structure 308 further includes a gate 324 that touches trench isolation structure 314, gate insulation region 320, and gate insulation region 322. Gate 324 can be implemented with, for example, polycrystalline silicon.

As further shown in FIGS. 3A-3F, method 300 begins by forming a patterned photoresist layer 330 that touches trench isolation structure 314, gate insulation region 322, and a portion of gate 324. Patterned photoresist layer 330 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

After patterned photoresist layer 330 has been formed, an n-type dopant, such as phosphorous or arsenic, is conventionally implanted into p-type well 316 and the exposed portion of gate 324. The implant forms a first n-type source region 331-1 and a first n-type drain region 332-1 in p-type well 316. The implant also forms an initial n-type gate region 333 in gate 324. Following the implant, patterned photoresist layer 330 is removed in a conventional fashion, such as with an ash process.

As shown in FIGS. 4A-4F, after patterned photoresist layer 330 has been removed, a patterned photoresist layer 334 is formed in a conventional manner to touch trench isolation structure 314, gate insulation region 320, and a portion of gate 324. After patterned photoresist layer 334 has been formed, a p-type dopant, such as boron, is conventionally implanted into n-type well 318 and the exposed portion of gate 324. The implant forms a first p-type source region 335-1 and a first p-type drain region 336-1 in n-type well 318. The implant also forms an initial p-type gate region 337 in gate 324.

Further, the first n-type source and drain regions 331-1 and 332-1 define a p-type channel portion 338 of p-type well 316 that lies between, touches, and separates the n-type source and drain regions 331-1 and 332-1. Similarly, the p-type source and drain regions 335-1 and 336-1 define an n-type channel portion 339 of n-type well 318 that lies between, touches, and separates the p-type source and drain regions 335-1 and 336-1.

Following the implant, patterned photoresist layer 334 is removed in a conventional fashion. After patterned photoresist layer 334 has been removed, first n-type source region 331-1, first n-type drain region 332-1, first p-type source region 335-1, first p-type drain region 336-1, initial n-type gate region 333, and initial p-type gate region 337 are driven in (e.g., annealed at 1100° C. in a neutral ambient such as $N_2$).

As shown in FIGS. 5A-5F, after the drive in, a non-conductive layer is deposited in a conventional manner to touch gate insulation region 320, gate insulation region 322, and gate 324. The non-conductive layer can be implemented with, for example, oxide. Following this, the non-conductive layer is anisotropically etched to form a side wall spacer 340 that laterally surrounds gate 324.

As shown in FIGS. 6A-6F, after side wall spacer 340 has been formed, an implant blocking structure 342 is formed to touch trench isolation structure 314, gate insulation region 320, gate insulation region 322, gate 324, and side wall spacer 340. As shown, implant blocking structure 342 has an opening that exposes portions of the first n-type source and drain regions 331-1 and 332-1 and a portion of initial n-type gate region 333, while protecting the first p-type source and drain regions 335-1 and 336-1 and initial p-type gate region 337. In the present example, implant blocking structure 342 is implemented with a conventionally-formed patterned photoresist layer. A conventionally-formed hard mask can alternately be used.

After implant blocking structure 342 has been formed, an n-type dopant, such as phosphorous or arsenic, is conventionally implanted through the opening into portions of the first n-type source and drain regions 331-1 and 332-1 and the exposed portion of initial n-type gate region 333. The implant forms a second n-type source region 331-2 that touches first n-type source region 331-1 and reduces the size of first n-type source region 331-1.

The implant also forms a second n-type drain region 332-2 that touches first n-type drain region 332-1 and reduces the size of first n-type drain region 332-1. The implant further forms a first n-type gate region 345-1 that touches initial n-type gate region 333 and reduces the size of initial n-type gate region 333.

As shown in FIGS. 7A-7F, following the formation of the second n-type source and drain regions 331-2 and 332-2 and first n-type gate region 345-1, implant blocking structure 342 is replaced with an implant blocking structure 348. As shown, implant blocking structure 348 has an opening that exposes the second n-type source and drain regions 331-2 and 332-2 and first n-type gate region 345-1, while exposing new portions of the first n-type source and drain regions 331-1 and 332-1 and a new portion of initial n-type gate region 333. In addition, implant blocking structure 348 continues to protect the p-type source and drain regions 335-1 and 336-1 and initial p-type gate region 337.

Implant blocking structure 342 can be replaced with implant blocking structure 348 in a number of ways. When implant blocking structure 342 is implemented with a conventionally-formed patterned photoresist layer, implant blocking structure 342 can be trimmed to form implant blocking structure 348.

A patterned photoresist layer can be trimmed by partially removing the patterned photoresist layer utilizing a conventional ash process, oxygen plasma, or other conventional wet/dry processes. Trimming a patterned photoresist layer increases the sizes of the openings in the patterned photoresist layer (and reduces the thickness of the patterned photoresist layer), and thereby increases the surface areas exposed by the patterned photoresist layer. Wet/dry processes can similarly be used to trim implant blocking structure 342 to form implant blocking structure 348 when implant blocking structure 342 is implemented as a hard mask.

Alternately, implant blocking structure 342 can be completely removed in a conventional fashion. After this, a new implant blocking structure with larger openings can be conventionally formed to form implant blocking structure 348. For example, a patterned photoresist layer or hard mask can be completely removed. After this, a new patterned photoresist layer or hard mask with larger openings can be formed.

Once implant blocking structure 348 has been formed, an n-type dopant, such as phosphorous or arsenic, is conventionally implanted through the opening into second n-type source region 331-2, second n-type drain region 332-2, first n-type gate region 345-1, the newly exposed portions of the first n-type source and drain regions 331-1 and 332-1, and the newly exposed portion of initial n-type gate region 333.

The implant increases the dopant concentrations of the second n-type source and drain regions 331-2 and 332-2 and first n-type gate region 345-1. The implant also forms third and fourth n-type source regions 331-3 and 331-4 that touch first n-type source region 331-1 and further reduce the size of first n-type source region 331-1.

The implant additionally forms third and fourth n-type drain regions 332-3 and 332-4 that touch first n-type drain region 332-1 and further reduce the size of first n-type drain region 332-1. The implant further forms second and third n-type gate regions 345-2 and 345-3 that touch initial n-type gate region 333 and further reduce the size of initial n-type gate region 333.

As shown in FIGS. 8A-8F, following the formation of the third and fourth n-type source regions 331-3 and 331-4, the third and fourth n-type drain regions 332-3 and 332-4, and the second and third n-type gate regions 345-2 and 345-3, implant blocking structure 348 is replaced with an implant blocking structure 355.

As shown, implant blocking structure 355 has an opening that exposes the second, third, and fourth n-type source regions 331-2, 331-3, and 331-4, the second, third, and fourth n-type drain regions 332-2, 332-3, and 332-4, and the first, second, and third n-type gate regions 345-1, 345-2, and 345-3. The opening in implant blocking structure 355 also exposes new portions of the first n-type source and drain regions 331-1 and 332-1, and the remaining portion of n-type gate region 333. In addition, implant blocking structure 355 continues to protect the first p-type source and drain regions 335-1 and 331 and initial p-type gate region 337.

As with implant blocking structure 342, implant blocking structure 348 can be replaced with implant blocking structure 355 in a number of ways. When implant blocking structure 348 is implemented with a conventionally-formed patterned photoresist layer or a conventionally-formed hard mask, implant blocking structure 348 can be trimmed to form implant blocking structure 355.

Alternately, implant blocking structure 348 can be completely removed in a conventional fashion. After this, a new implant blocking structure with larger openings can be conventionally formed to form implant blocking structure 355. For example, a patterned photoresist layer or hard mask can be completely removed. After this, a new patterned photoresist layer or hard mask with larger openings can be formed.

Once implant blocking structure 355 has been formed, an n-type dopant, such as phosphorous or arsenic, is conventionally implanted through the opening with a relatively light dose into the second, third, and fourth n-type source regions 331-2, 331-3, and 331-4, the second, third, and fourth n-type drain regions 332-2, 332-3, and 332-4, the first, second, and third n-type gate regions 345-1, 345-2, and 345-3, the newly exposed portions of the first n-type source and drain regions 331-1 and 332-1, and the remaining portion of initial n-type gate region 333.

The implant increases the dopant concentrations of the second, third, and fourth n-type source regions 331-2, 331-3, and 331-4, the second, third, and fourth n-type drain regions 332-2, 332-3, and 332-4, and the first, second, and third n-type gate regions 345-1, 345-2, and 345-3. The implant also forms relatively lightly doped fifth and sixth n-type source regions 331-5 and 331-6 that touch first n-type source region 331-1 and leave the first n-type source region 331-1 lying below side wall spacer 340.

The implant further forms relatively lightly doped fifth and sixth n-type drain regions 332-5 and 332-6 that touch first n-type drain region 332-1 and leave the first n-type drain region 332-1 lying below side wall spacer 340. The implant additionally forms relatively lightly doped fourth and fifth n-type gate regions 345-4 and 345-5 that eliminate the remaining portions of initial n-type gate region 333. Following the implant, implant blocking structure 355 is removed in a conventional manner.

As shown in FIGS. 9A-9F, after implant blocking structure 355 has been removed, an implant blocking structure 360 is formed to touch trench isolation structure 314, gate insulation region 320, gate insulation region 322, gate 324, and side wall spacer 340. As shown, implant blocking structure 360 has an opening that exposes portions of the first p-type source and drain regions 335-1 and 336-1 and a portion of initial p-type gate region 337.

In addition, implant blocking structure 360 protects the second, third, fourth, fifth, and sixth n-type source regions 331-2, 331-3, 331-4, 331-5, and 331-6, the second, third, fourth, fifth, and sixth n-type drain regions 332-2, 332-3, 332-4, 332-5, and 332-6, and the first, second, third, fourth, and fifth n-type gate regions 345-1, 345-2, 345-3, 345-4, and 345-5. In the present example, implant blocking structure 360 is implemented with a conventionally-formed patterned photoresist layer. A conventionally-formed hard mask can alternately be used.

After implant blocking structure 360 has been formed, a p-type dopant, such as boron, is conventionally implanted through the opening into the first p-type source and drain regions 335-1 and 336-1 and the exposed portion of p-type gate region 337. The implant forms a second p-type source region 335-2 that touches first p-type source region 335-1 and reduces the size of first p-type source region 335-1.

The implant also forms a second p-type drain region 336-2 that touches first p-type drain region 336-1 and reduces the size of first p-type drain region 336-1. The implant further forms a first p-type gate region 363-1 that touches initial p-type gate region 337 and reduces the size of initial p-type gate region 337.

As shown in FIGS. 10A-10F, following the formation of the second p-type source and drain regions 335-2 and 336-2 and first p-type gate region 363-1, implant blocking structure 360 is replaced with an implant blocking structure 365. As shown, implant blocking structure 365 has an opening that exposes the second p-type source and drain regions 335-2 and 336-2 and first p-type gate region 363-1, while exposing new portions of the first p-type source and drain regions 335-1 and 336-1 and a new portion of initial p-type gate region 337.

In addition, implant blocking structure 365 continues to protect the second, third, fourth, fifth, and sixth n-type source regions 331-2, 331-3, 331-4, 331-5, and 331-6, the second, third, fourth, fifth, and sixth n-type drain regions 332-2, 332-3, 332-4, 332-5, and 332-6, and the first, second, third, fourth, and fifth n-type gate regions 345-1, 345-2, 345-3, 345-4, and 345-5.

Implant blocking structure 360 can be replaced with implant blocking structure 365 in a number of ways. When implant blocking structure 360 is implemented with a conventionally-formed patterned photoresist layer or a conventionally-formed hard mask, implant blocking structure 360 can be trimmed to form implant blocking structure 365.

Alternately, implant blocking structure 360 can be completely removed in a conventional fashion. After this, a new implant blocking structure with larger openings can be conventionally formed to form implant blocking structure 365. For example, a patterned photoresist layer or hard mask can be completely removed. After this, a new patterned photoresist layer or hard mask with larger openings can be formed.

Once implant blocking structure 365 has been formed, a p-type dopant, such as boron, is conventionally implanted through the opening into second p-type source region 335-2, second p-type drain region 336-2, first p-type gate region 363-1, the newly exposed portions of the first p-type source and drain regions 335-1 and 336-1, and the newly exposed portion of initial p-type gate region 337.

The implant increases the dopant concentrations of the second p-type source and drain regions 335-2 and 336-2 and first p-type gate region 363-1. The implant also forms third and fourth p-type source regions 335-3 and 335-4 that touch first n-type source region 335-1 and further reduce the size of first p-type source region 335-1.

The implant additionally forms third and fourth p-type drain regions 336-3 and 336-4 that touch first p-type drain region 336-1 and further reduce the size of first p-type drain region 336-1. The implant further forms second and third p-type gate regions 363-2 and 363-3 that touch initial p-type gate region 337 and further reduce the size of initial p-type gate region 337.

As shown in FIGS. 11A-11F, following the formation of the third and fourth p-type source regions 335-3 and 335-4, the third and fourth p-type drain regions 336-3 and 336-4, and the second and third p-type gate regions 363-2 and 363-3, implant blocking structure 365 is replaced with an implant blocking structure 370.

As shown, implant blocking structure 370 has an opening that exposes the second, third, and fourth p-type source regions 335-2, 335-3, and 335-4, the second, third, and fourth p-type drain regions 336-2, 336-3, and 336-4, and the first, second, and third p-type gate regions 363-1, 363-2, and 363-3. The opening in implant blocking structure 370 also exposes new portions of the first p-type source and drain regions 335-1 and 336-1, and the remaining portion of p-type gate region 337.

In addition, implant blocking structure 370 continues to protect the second, third, fourth, fifth, and sixth n-type source regions 331-2, 331-3, 331-4, 331-5, and 331-6, the second, third, fourth, fifth, and sixth n-type drain regions 332-2, 332-3, 332-4, 332-5, and 332-6, and the first, second, third, fourth, and fifth n-type gate regions 345-1, 345-2, 345-3, 345-4, and 345-5.

As with implant blocking structure 360, implant blocking structure 365 can be replaced with implant blocking structure 370 in a number of ways. When implant blocking structure 365 is implemented with a conventionally-formed patterned photoresist layer or a conventionally-formed hard mask, implant blocking structure 365 can be trimmed to form implant blocking structure 370.

Alternately, implant blocking structure 365 can be completely removed in a conventional fashion. After this, a new implant blocking structure with larger openings can be conventionally formed to form implant blocking structure 370. For example, a patterned photoresist layer or hard mask can be completely removed. After this, a new patterned photoresist layer or hard mask with larger openings can be formed.

Once implant blocking structure 370 has been formed, a p-type dopant, such as boron, is conventionally implanted through the opening with a relatively light dose into the second, third, and fourth p-type source regions 335-2, 335-3, and 335-4, the second, third, and fourth p-type drain regions 336-2, 336-3, and 336-4, the first, second, and third p-type gate regions 363-1, 363-2, and 363-3, the newly exposed portions of the first p-type source and drain regions 335-1 and 336-1, and the remaining portion of initial p-type gate region 337.

The implant increases the dopant concentrations of the second, third, and fourth p-type source regions 335-2, 335-3, and 335-4, the second, third, and fourth p-type drain regions 336-2, 336-3, and 336-4, and the first, second, and third p-type gate regions 363-1, 363-2, and 363-3. The implant also forms relatively lightly doped fifth and sixth p-type source regions 335-5 and 335-6 that touch first p-type source region 335-1 and leave the first p-type source region 335-1 lying below side wall spacer 340.

The implant further forms relatively lightly doped fifth and sixth p-type drain regions 336-5 and 336-6 that touch first p-type drain region 336-1 and leave the first p-type drain region 336-1 lying below side wall spacer 340. The implant additionally forms relatively lightly doped fourth and fifth p-type gate regions 363-4 and 363-5 that eliminate the remaining portions of initial p-type gate region 337. Following the implant, implant blocking structure 370 is removed in a conventional manner.

After implant blocking structure 370 has been removed, the first, second, third, fourth, fifth, and sixth n-type source regions 331-1, 331-2, 331-3, 331-4, 331-5, and 331-6, the first, second, third, fourth, fifth and sixth n-type drain regions 332-1, 332-2, 332-3, 332-4, 332-5, and 332-6, the first, second, third, fourth, fifth, and sixth p-type source regions 335-1, 335-2, 335-3, 335-4, 335-5, and 335-6, the first, second, third, fourth, fifth, and sixth p-type drain regions 336-1, 336-2, 336-3, 336-4, 336-5, and 336-6, the first, second, third, fourth, and fifth n-type gate regions 345-1, 345-2, 345-3, 345-4, and 345-5, and the first, second, third, fourth, and fifth p-type gate regions 363-1, 363-2, 363-3, 363-4, and 363-5 are driven in (e.g., annealed at 1100° C. in a neutral ambient such as $N_2$).

After the drive in, method 300 continues with conventional steps, including the conventional formation of a silicide region on the top surface of gate 324, and the optional formation of silicide regions on the top surfaces of the second, third, fourth, fifth, and sixth n-type source regions 331-1, 331-2, 331-3, 331-4, 331-5, and 331-6, the second, third, fourth, fifth and sixth n-type drain regions 332-1, 332-2, 332-3, 332-4, 332-5, the second, third, fourth, fifth, and sixth p-type source regions 335-1, 335-2, 335-3, 335-4, 335-5, and 335-6, and the first, second, third, fourth, fifth, and sixth p-type drain regions 336-1, 336-2, 336-3, 336-4, 336-5, and 336-6.

In the present example, the first n-type source and drain regions 331-1 and 332-1 each has substantially a first n-type dopant concentration, and the second n-type source and drain regions 331-2 and 332-2 each has substantially a second n-type dopant concentration. In addition, the third and fourth n-type source regions 331-3 and 331-4 and the third and fourth n-type drain regions 332-3 and 332-4 each has substantially a third n-type dopant concentration.

Further, the fifth and sixth n-type source regions 331-5 and 331-6 and the fifth and sixth n-type drain regions 332-5 and 332-6 each has substantially a fourth n-type dopant concentration. In addition, the first n-type gate region 345-1 has substantially the second n-type dopant concentration, the second and third n-type gate regions 345-2 and 345-3 have substantially the third n-type dopant concentration, and the fourth and fifth n-type gate regions 345-4 and 345-5 have substantially the fourth n-type dopant concentration.

The second n-type dopant concentration is greater than the first n-type dopant concentration. The third n-type dopant concentration is greater than the first n-type dopant concentration, and less than the second n-type dopant concentration. The fourth n-type dopant concentration is greater than the first n-type dopant concentration, and less than the third n-type dopant concentration.

Further, the first p-type source and drain regions 335-1 and 336-1 each has substantially a first p-type dopant concentration, and the second p-type source and drain regions 335-2 and 336-2 each has substantially a second p-type dopant concentration. In addition, the third and fourth p-type source regions 335-3 and 335-4 and the third and fourth p-type drain regions 336-3 and 336-4 each has substantially a third p-type dopant concentration.

Further, the fifth and sixth p-type source regions 335-5 and 335-6 and the fifth and sixth n-type drain regions 336-5 and 336-6 each has substantially a fourth p-type dopant concentration. In addition, the first p-type gate region 363-1 has substantially the second p-type dopant concentration, the second and third n-type gate regions 363-2 and 363-3 have substantially the third p-type dopant concentration, and the fourth and fifth p-type gate regions 363-4 and 363-5 have substantially the fourth p-type dopant concentration.

The second p-type dopant concentration is greater than the first p-type dopant concentration. The third p-type dopant concentration is greater than the first p-type dopant concentration, and less than the second p-type dopant concentration. The fourth p-type dopant concentration is greater than the first p-type dopant concentration, and less than the third p-type dopant concentration.

In the present example, p-type well 316, the first, second, third, fourth, fifth, and sixth n-type source regions 331-1, 331-2, 331-3, 331-4, 331-5, and 331-6, the first, second, third, fourth, fifth and sixth n-type drain regions 332-1, 332-2, 332-3, 332-4, 332-5, and 332-6, channel portion 338, gate insulation region 320, the first, second, third, fourth, and fifth n-type gate regions 345-1, 345-2, 345-3, 345-4, and 345-5 form an NMOS transistor 380.

Further, n-type well 318, the first, second, third, fourth, fifth, and sixth p-type source regions 335-1, 335-2, 335-3, 335-4, 335-5, and 335-6, the first, second, third, fourth, fifth, and sixth p-type drain regions 336-1, 336-2, 336-3, 336-4, 336-5, and 336-6, channel portion 339, gate insulation region 322, and the first, second, third, fourth, and fifth p-type gate regions 363-1, 363-2, 363-3, 363-4, and 363-5 form a PMOS transistor 382. NMOS transistor 380 and PMOS transistor 382 form a semiconductor structure 384.

One of the advantages of the present example is that since fourth n-type gate region 345-4 and fourth p-type gate region 363-4, which touch each other, are relatively lightly doped, the threshold voltage shifts that result from gate cross diffusion during the drive in are substantially reduced or eliminated. Another advantage is that the CMOS devices within a semiconductor circuit can be customized to have different widths.

Figure 12A:
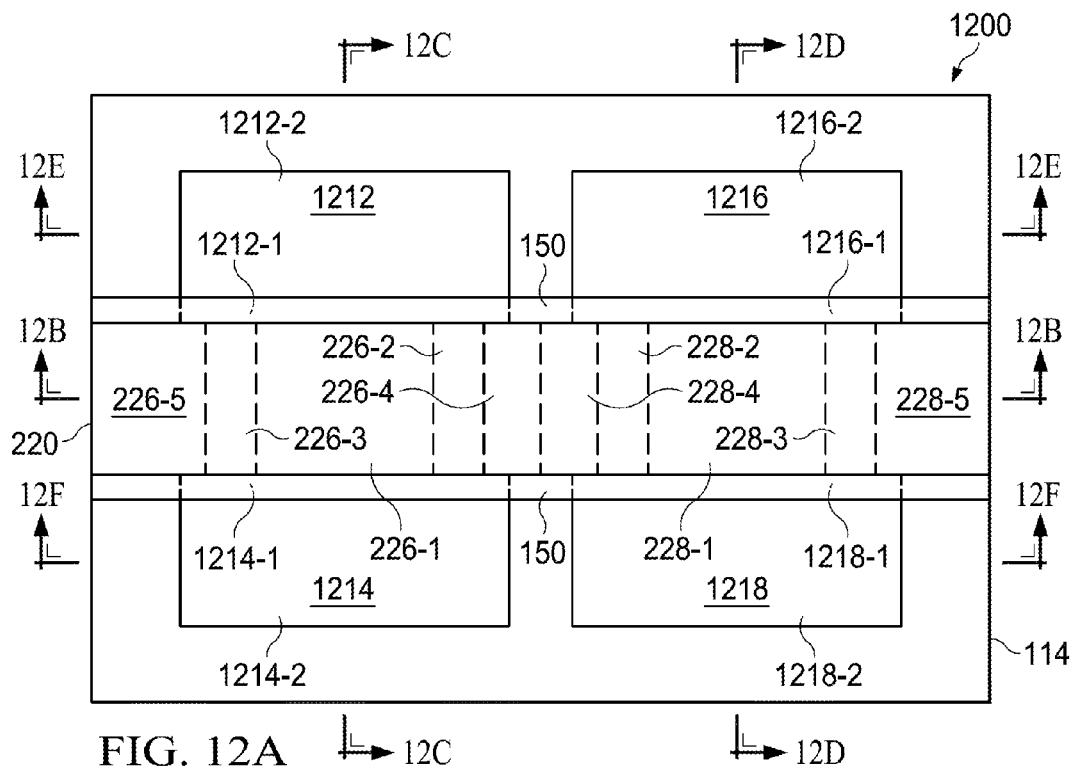
FIGS. 12A-12F are views illustrating an example of a semiconductor structure 1200 in accordance with an alternate embodiment of the present invention.
Figure 12B:
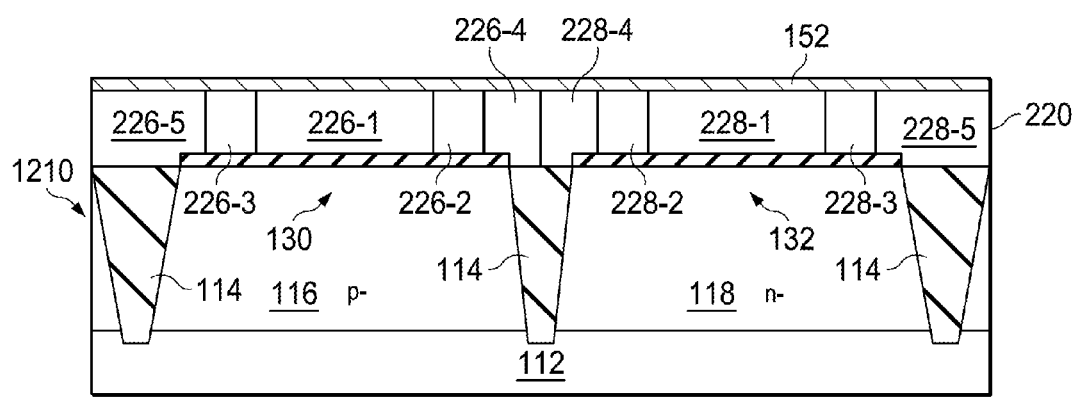
Figure 12C:
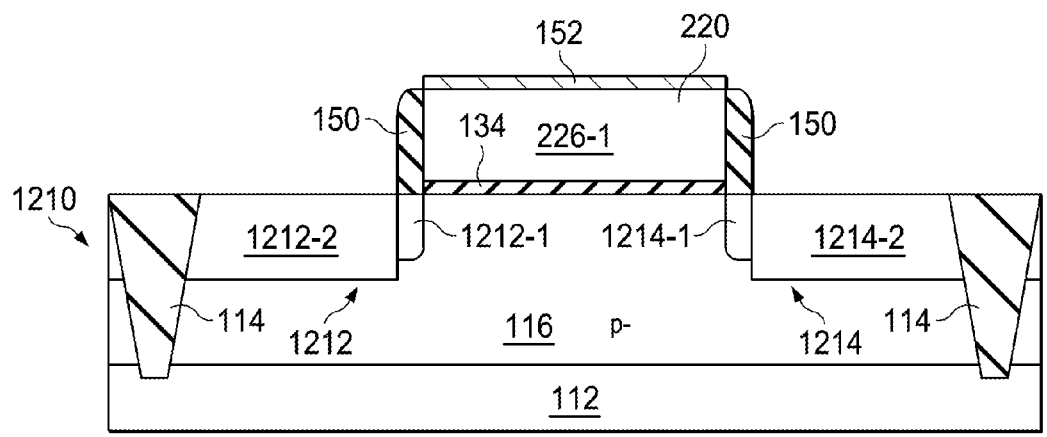
Figure 12D:
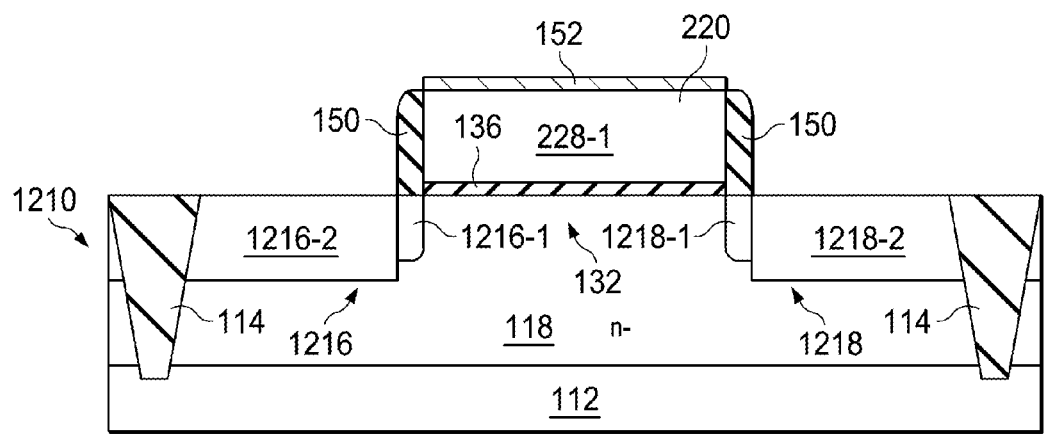
Figure 12E:
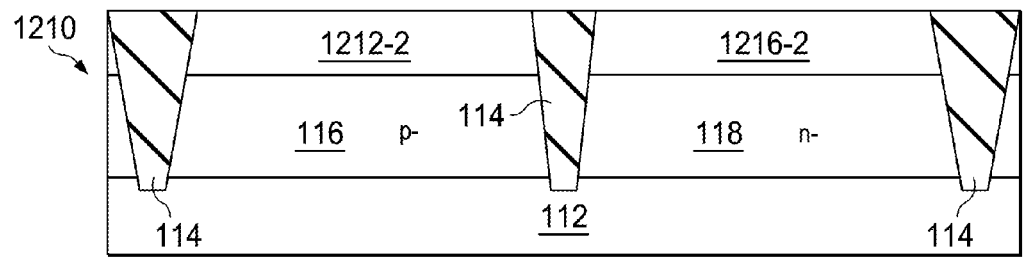
Figure 12F:
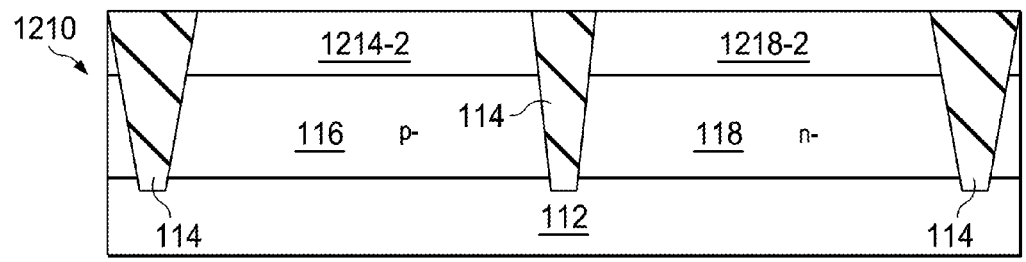

FIGS. 12A-12F show views that illustrate an example of a semiconductor structure 1200 in accordance with an alternate embodiment of the present invention. FIG. 12A shows a plan view, while FIG. 12B shows a cross-sectional view taken along line 12B-12B of FIG. 2A, FIG. 12C shows a cross-sectional view taken along line 12C-12C of FIG. 2A, FIG. 12D shows a cross-sectional view taken along line 12D-12D of FIG. 2A, FIG. 12E shows a cross-sectional view taken along line 12E-12E of FIG. 2A, and FIG. 12F shows a cross-sectional view taken along line 12F-12F of FIG. 12A. Semiconductor structure 1200 is similar to semiconductor structure 200 and, as a result, utilizes the same reference numerals to designate the structures which are common to both devices.

As shown in FIGS. 12A-12F, semiconductor structure 1200 differs from semiconductor structure 200 in that semiconductor structure 1200 utilizes a semiconductor body 1210 in lieu of semiconductor body 210. Semiconductor body 1210, in turn, is the same as semiconductor body 210, except that semiconductor body 210 utilizes an n-type source 1212 and an n-type drain 1214 in lieu of n-type source 212 and n-type drain region 214, respectively.

In addition, semiconductor body 1210 utilizes a p-type source 1216 and a p-type drain 1218 in lieu of p-type source 216 and p-type drain 218, respectively. As a result, source 1212 and drain 1214 touch, and are separated, by channel portion 130 of p-well 116, while source 1216 and drain 1218 touch, and are separated by, channel portion 132 of n-well 118.

Unlike n-type source 212, which can have three or more source regions, n-type source 1212 in the present example has only two source regions, a lightly-doped (n–) source region 1212-1 and a heavily-doped (n+) source region 1212-2. In addition, n-type drain 1214 in the present example has only two drain regions, a lightly-doped (n–) drain region 1214-1 and a heavily-doped (n+) drain region 1214-2.

Similarly, p-type source 1216 in the present example has only two source regions, a lightly-doped (p–) source region 1216-1 and a heavily-doped (p+) source region 1216-2. In addition, p-type drain 1218 in the present example has only two drain regions, a lightly-doped (p–) drain region 1218-1 and a heavily-doped (p+) drain region 1218-2. (Alternately, source 1212, drain 1214, source 1216, and drain 1218 can each have only one region with a substantially uniform dopant concentration.)

FIGS. 13A-24A through 13F-24F show a series of views that illustrate an example of a method 1300 of forming a semiconductor device in accordance with the alternate embodiment of the present invention. FIGS. 13A-24A show a series of plan views. FIGS. 13B-24B show a series of cross-sectional views taken along line 13B-13B of FIG. 13A through line 24B-24B of FIG. 24A, respectively. FIGS. 13C-24C show a series of cross-sectional views taken along line 13C-13C of FIG. 13A through line 24C-24C of FIG. 24A, respectively.

Figure 13A:
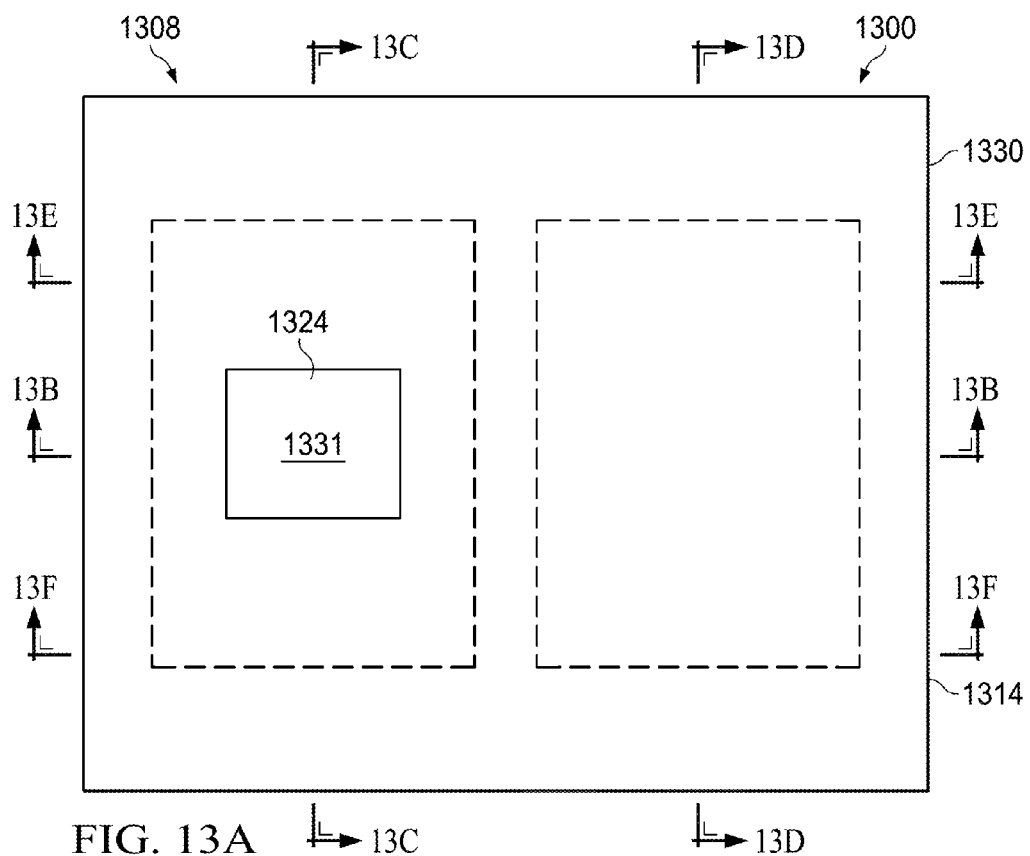
Figure 13B:
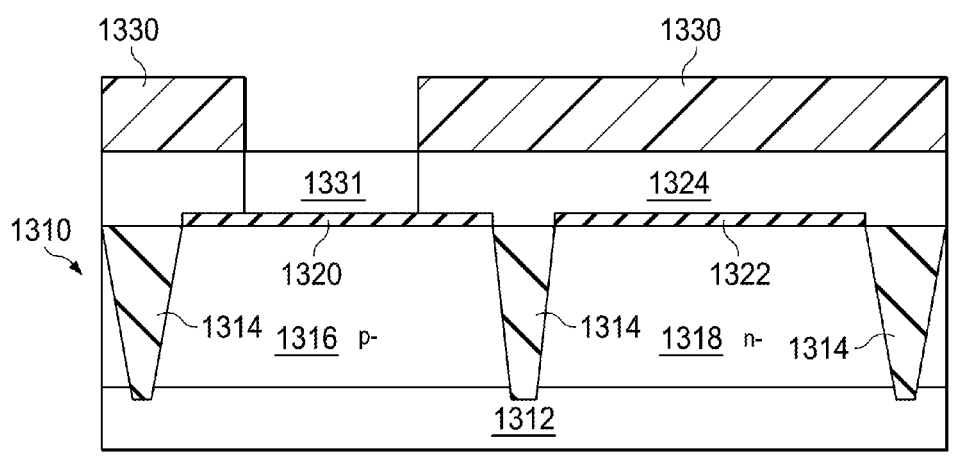
Figure 13C:
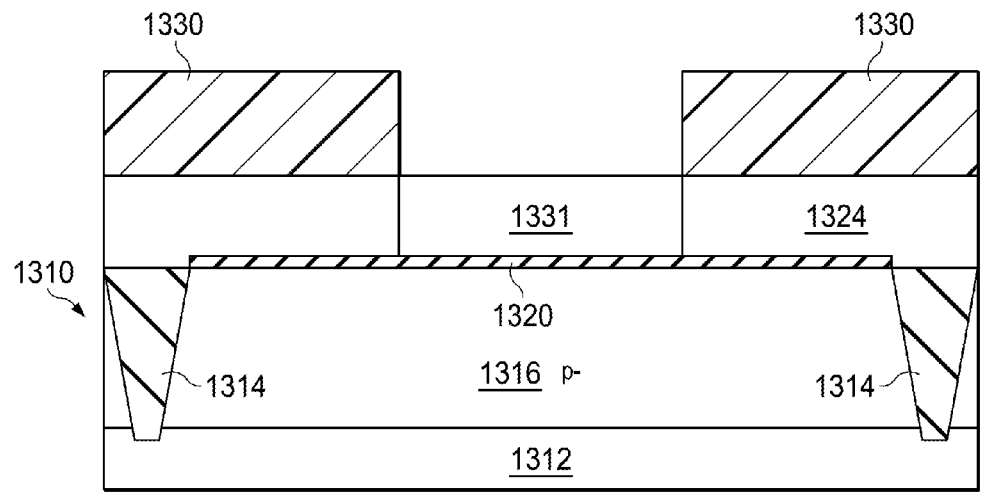
Figure 13D:
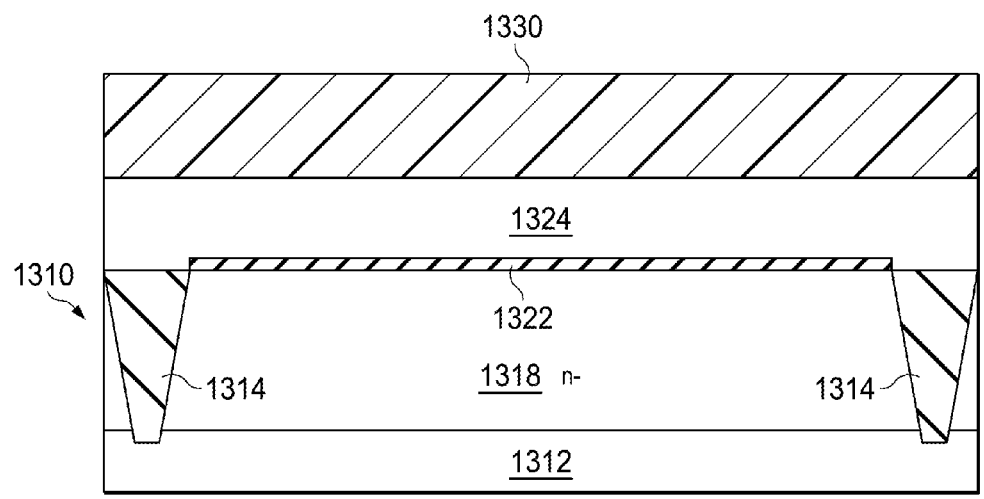
Figure 13E:
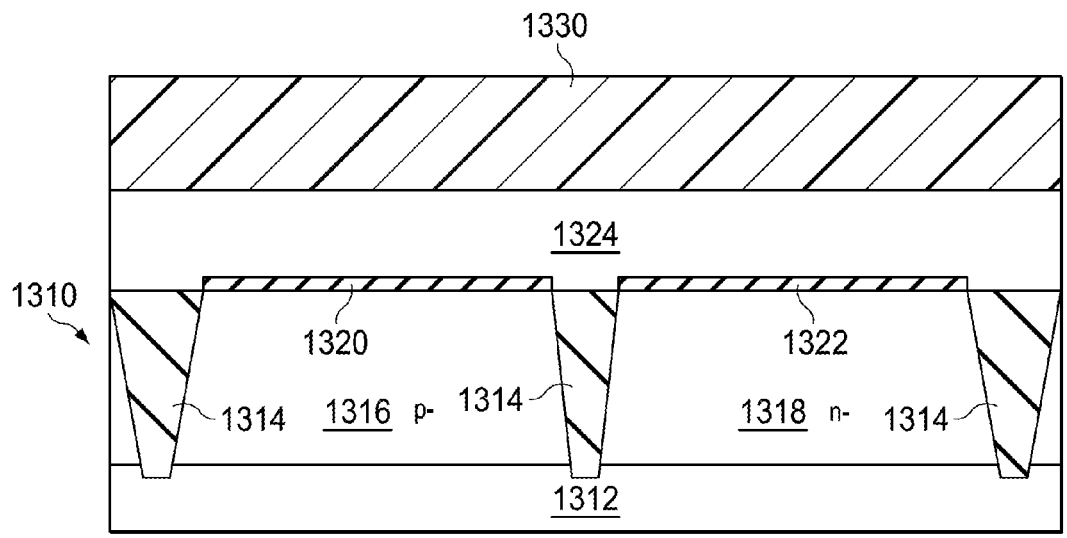
Figure 13F:
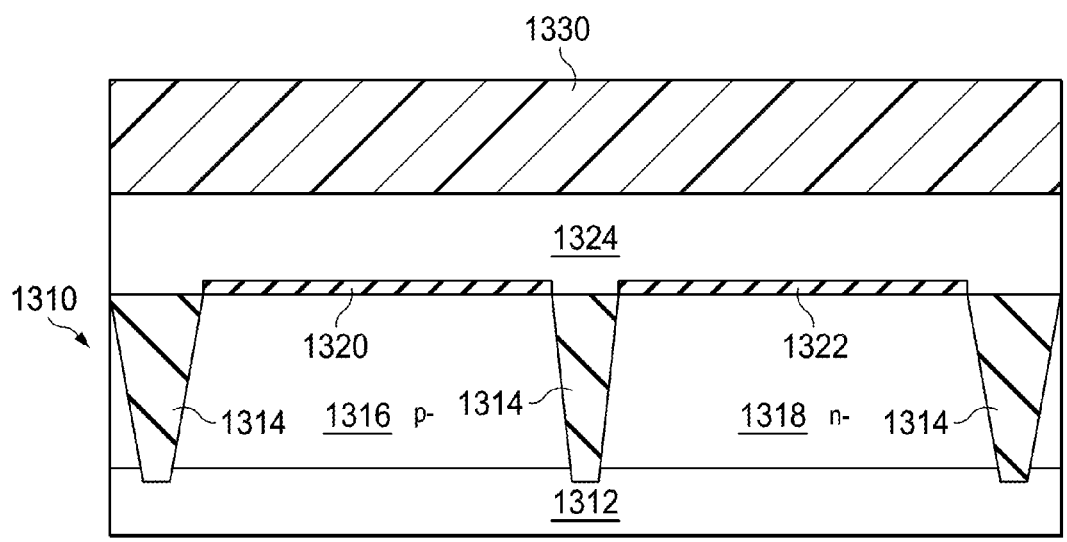
Figure 14A:
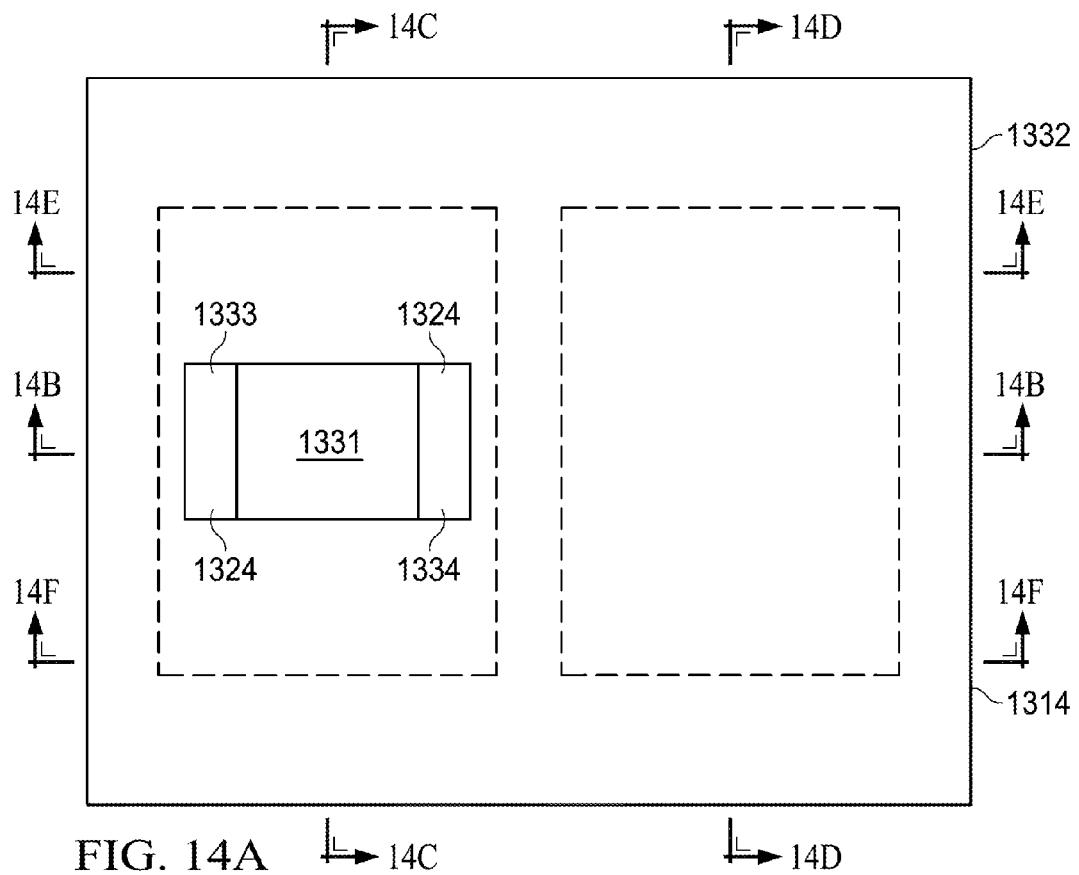
Figure 14B:
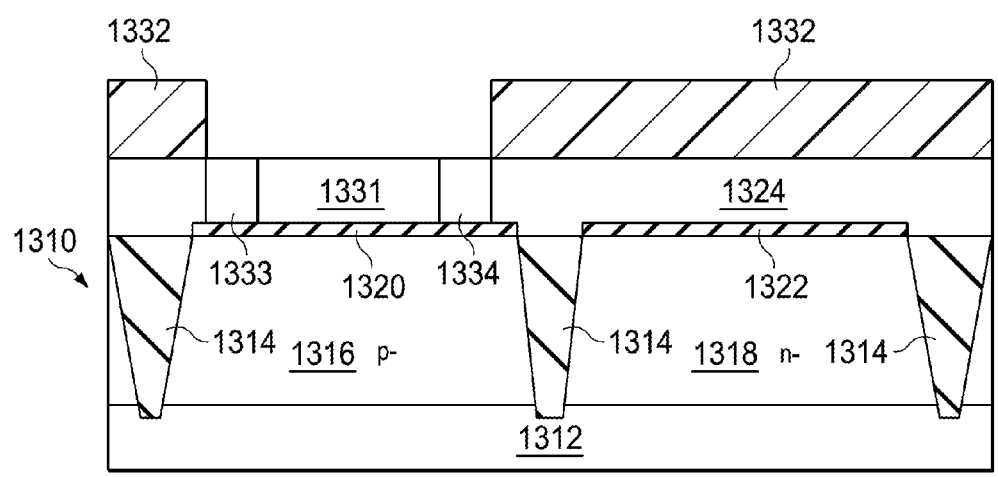
Figure 14C:
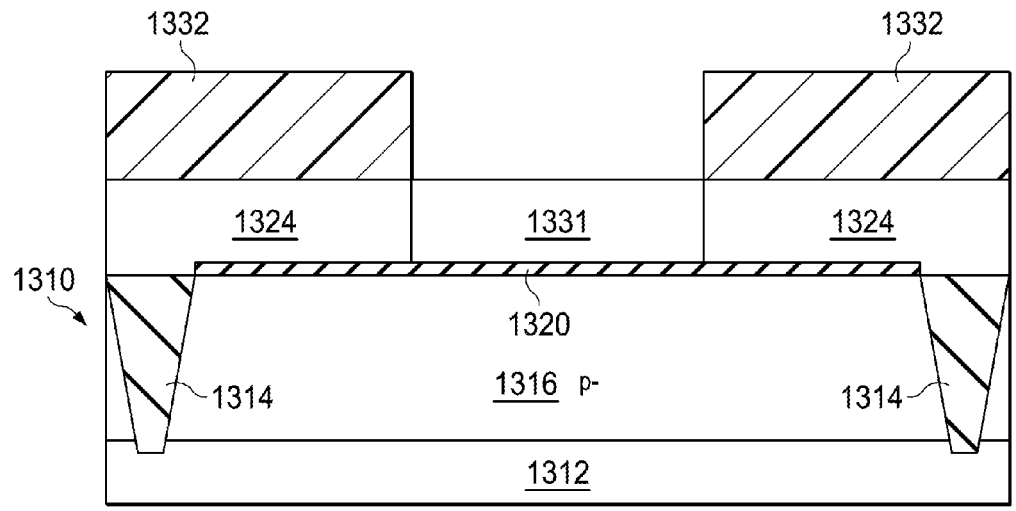
Figure 14D:
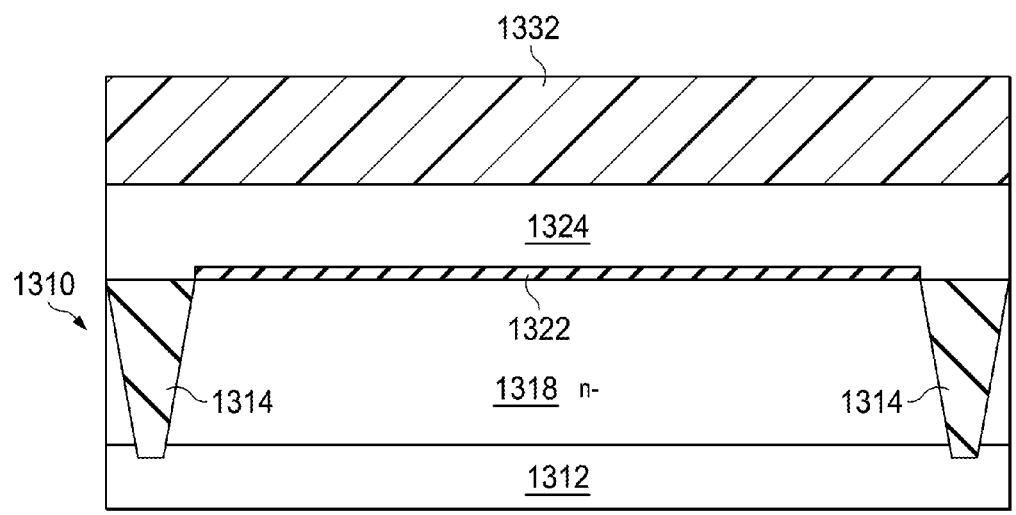
Figure 14E:
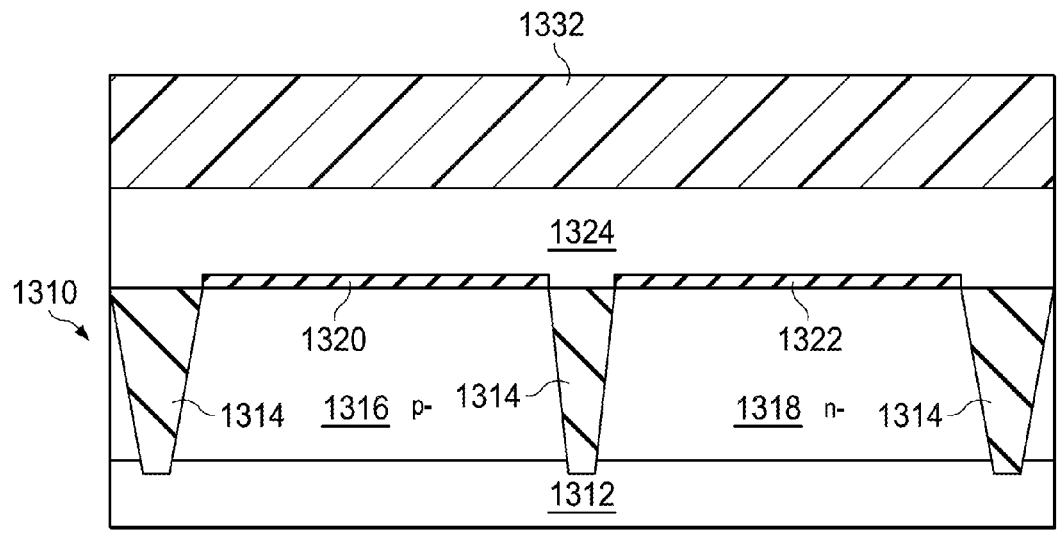
Figure 14F:
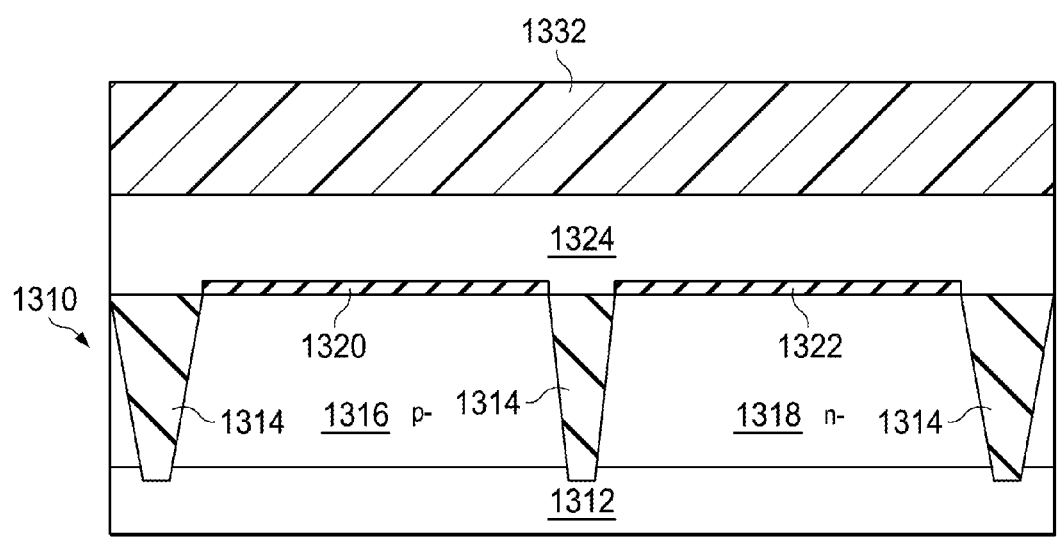
Figure 15A:
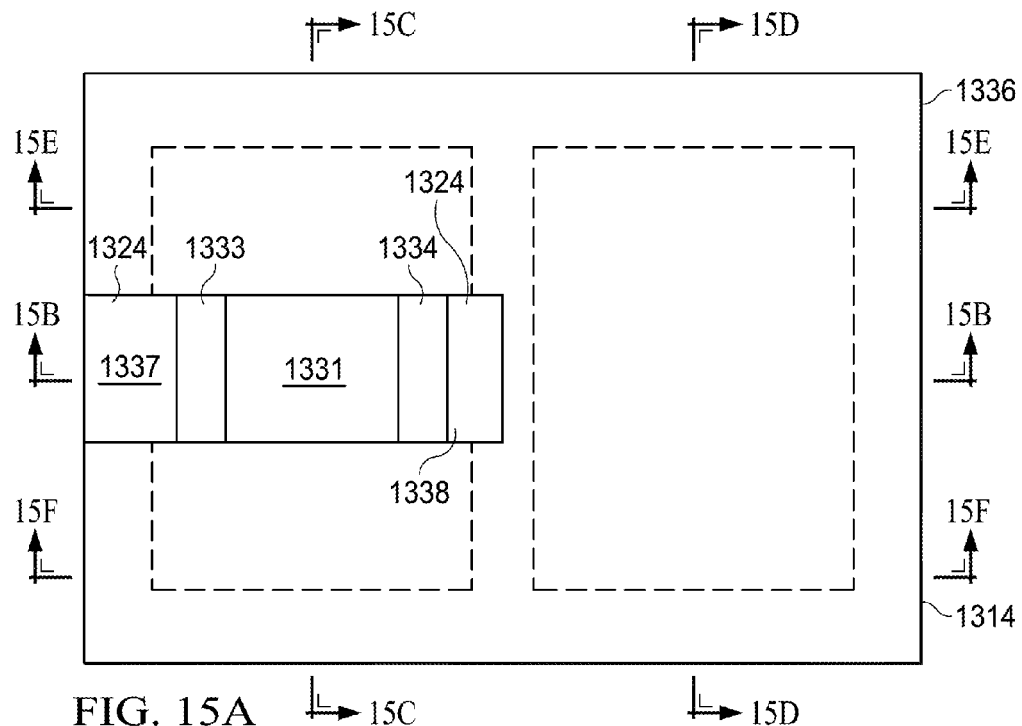
Figure 15B:
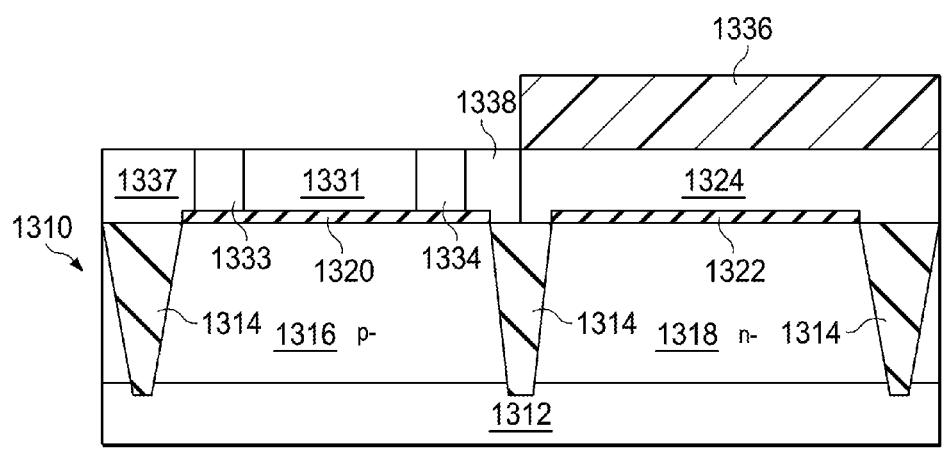
Figure 15C:
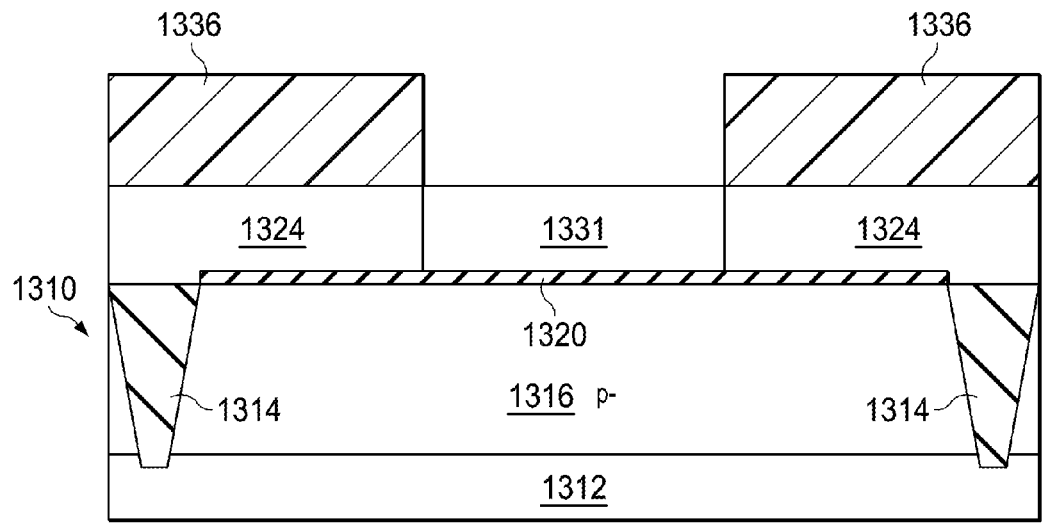
Figure 15D:
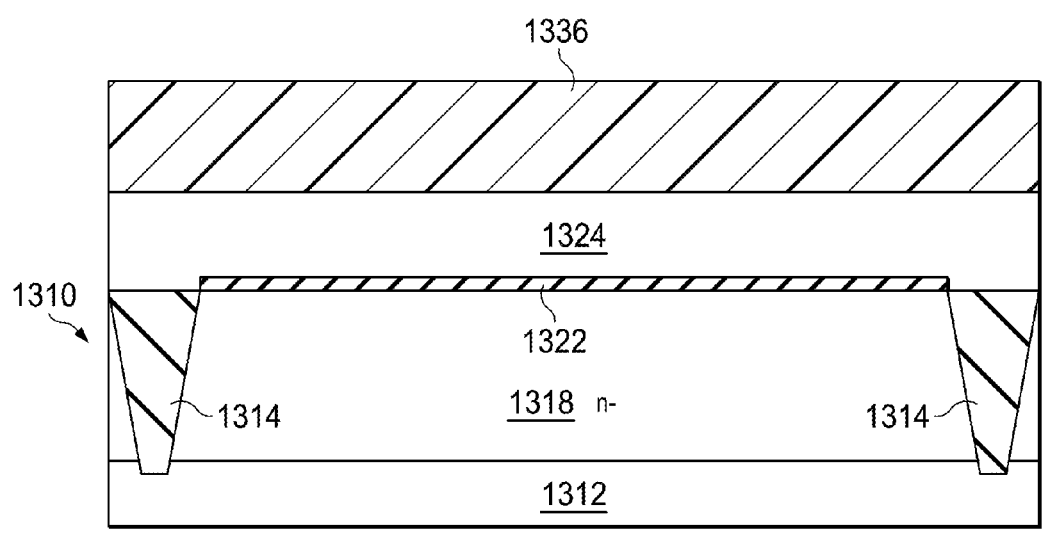
Figure 15E:
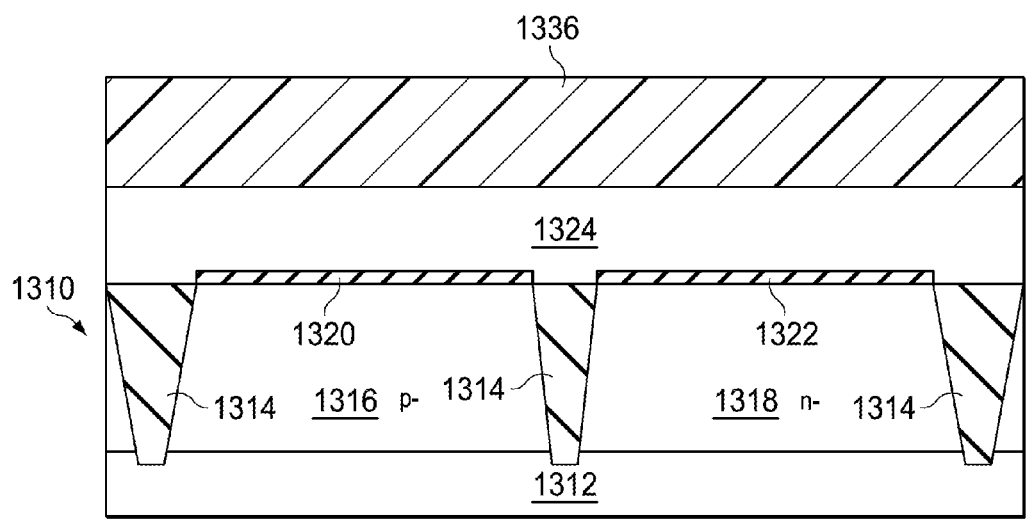
Figure 15F:
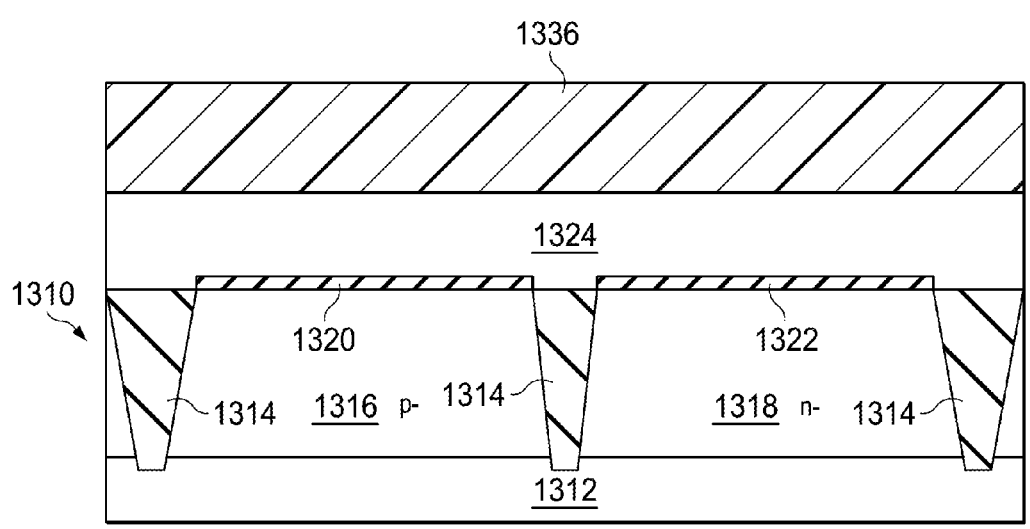
Figure 16A:
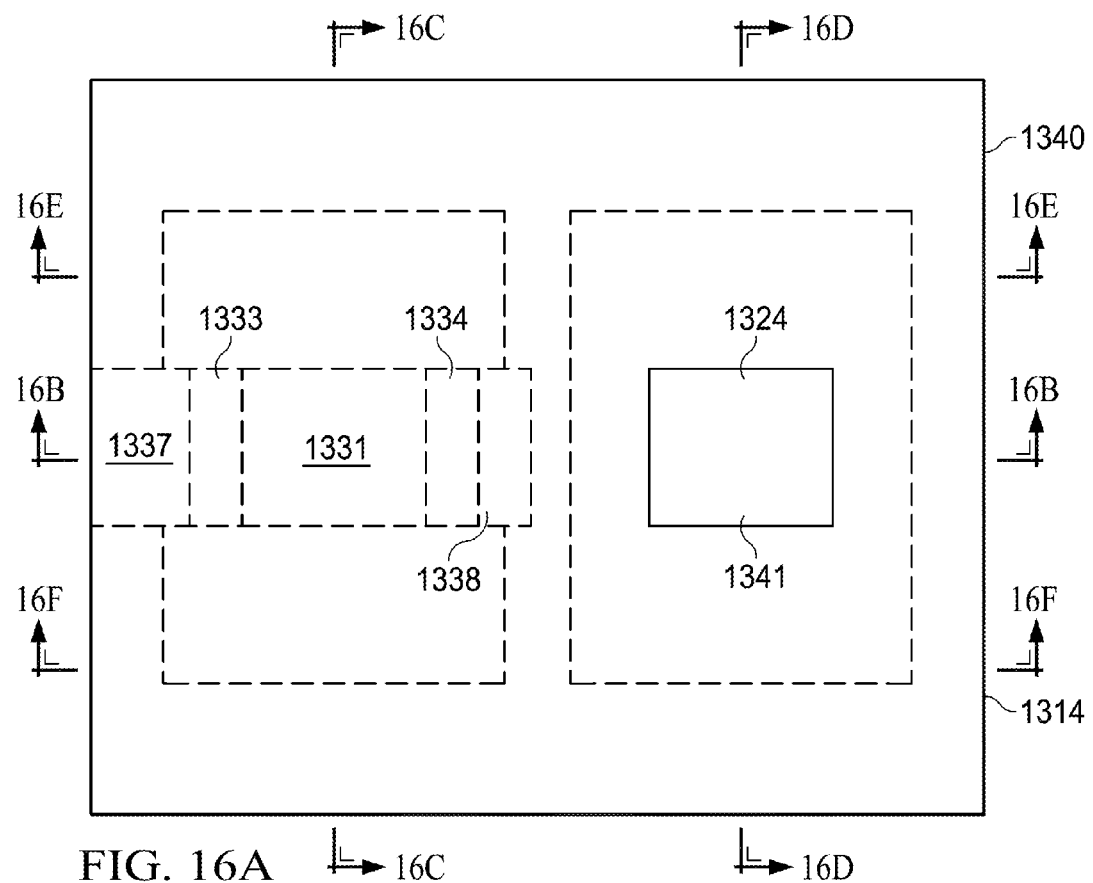
Figure 16B:
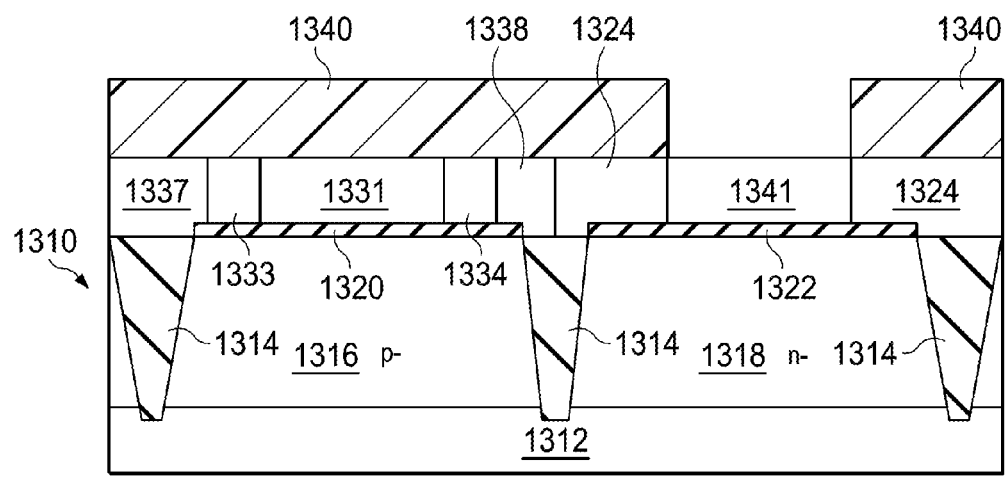
Figure 16C:
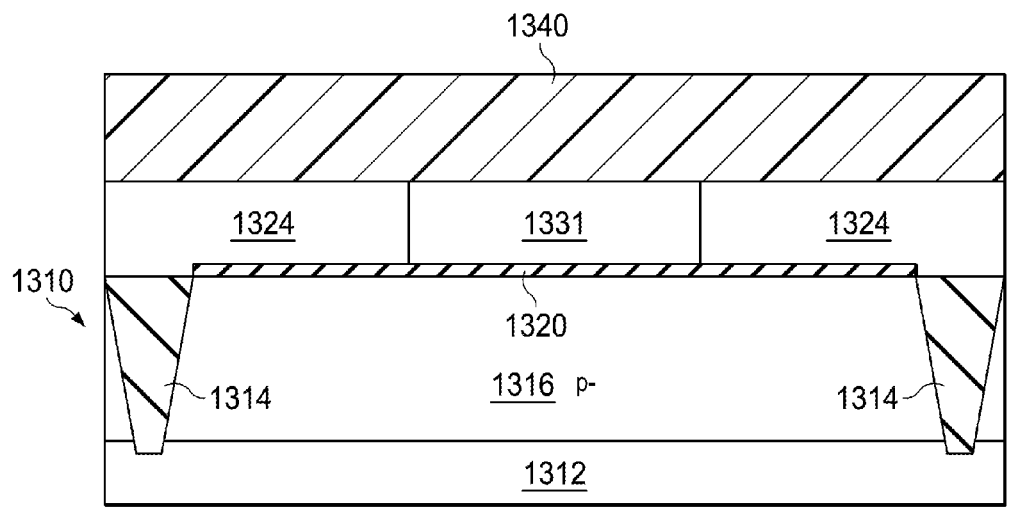
Figure 16D:
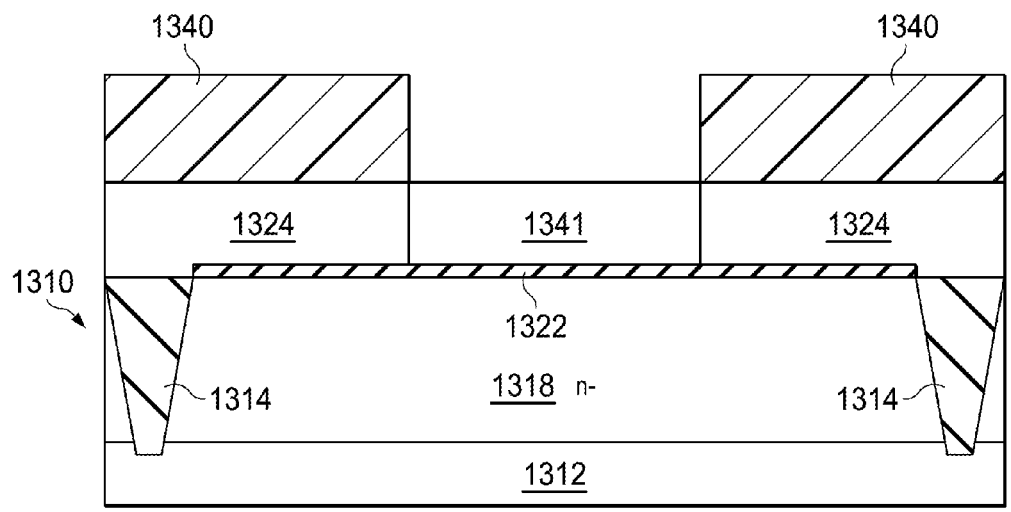
Figure 16E:
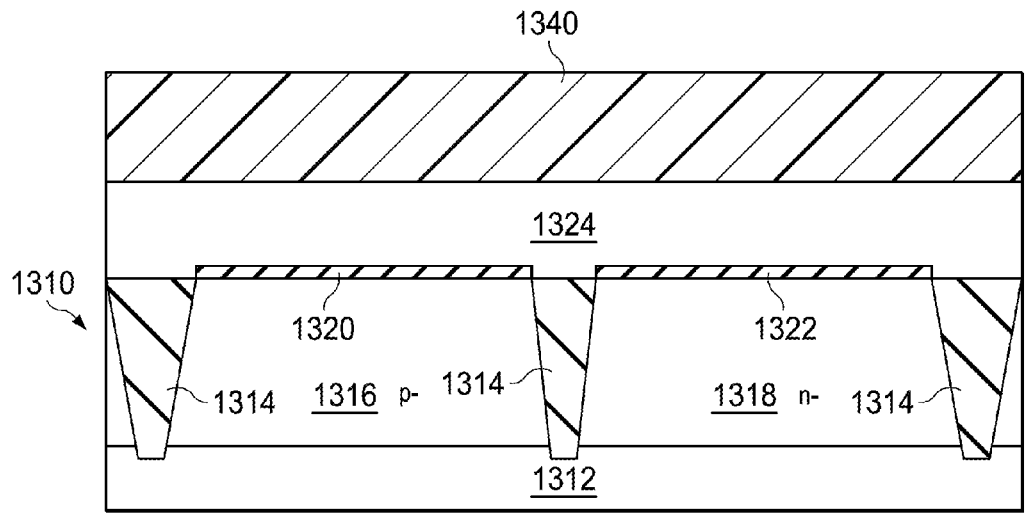
Figure 16F:
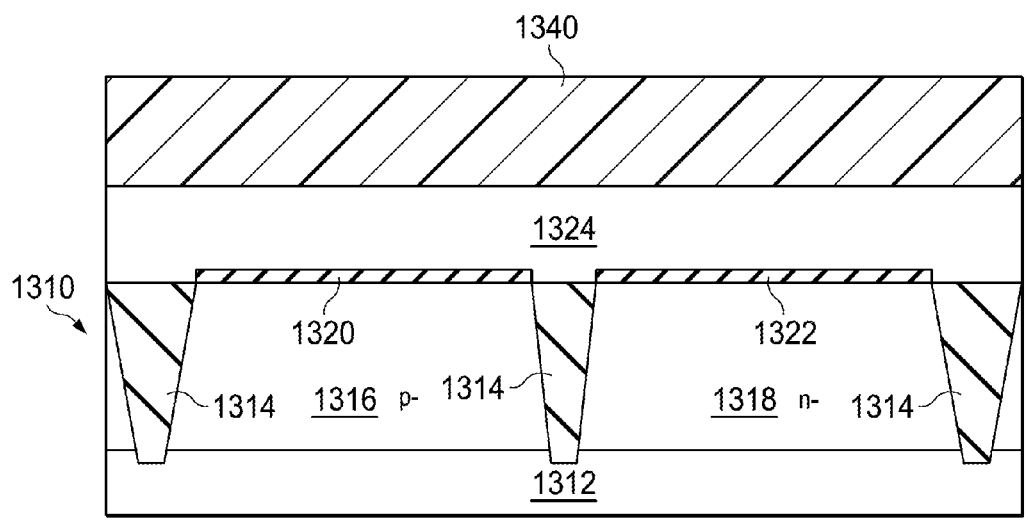
Figure 17A:
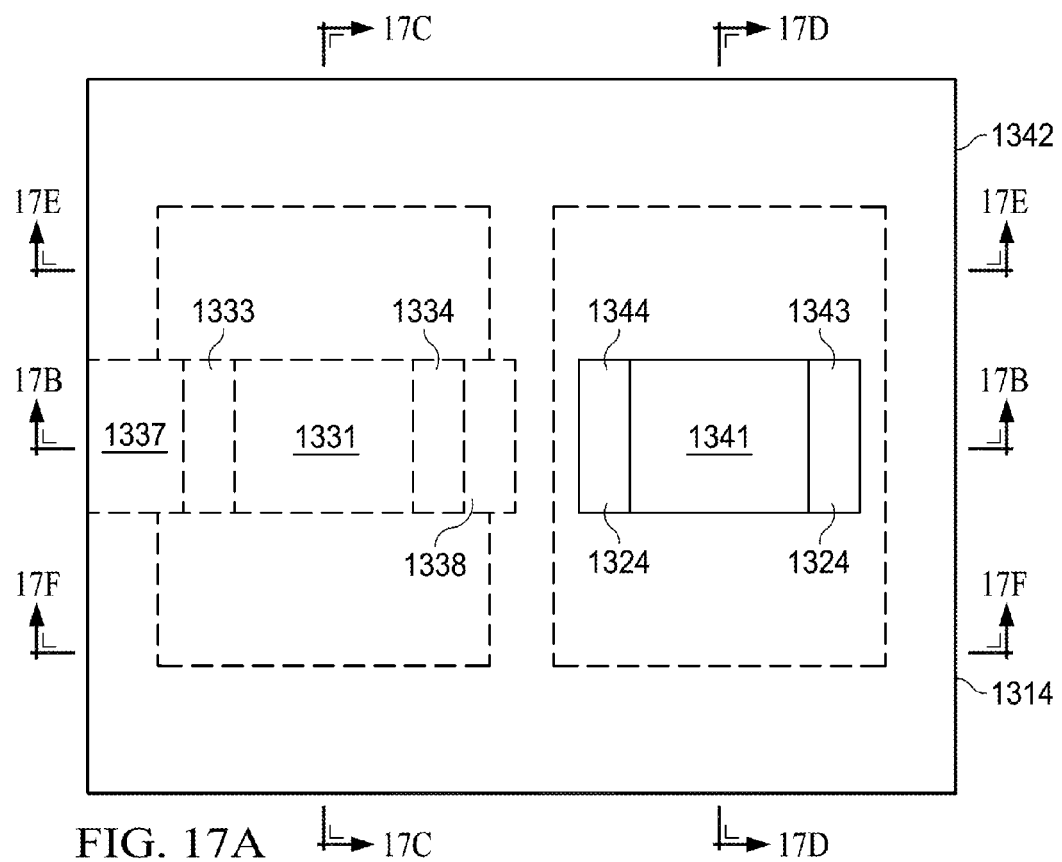
Figure 17B:
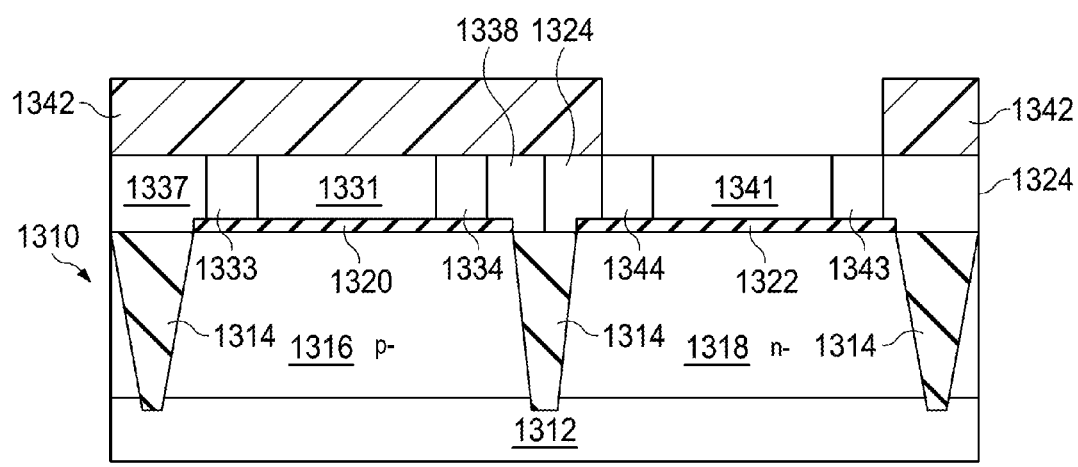
Figure 17C:
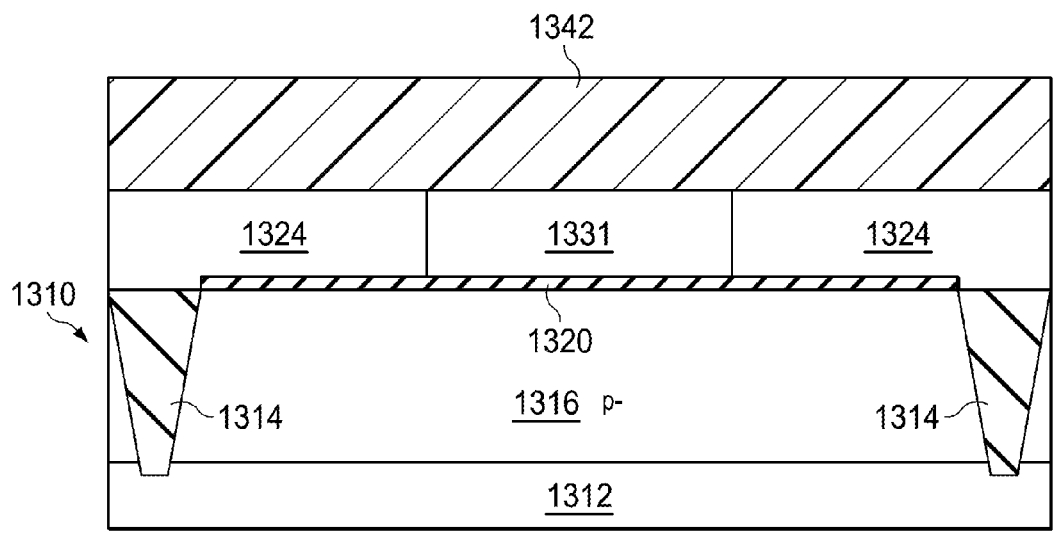
Figure 17D:
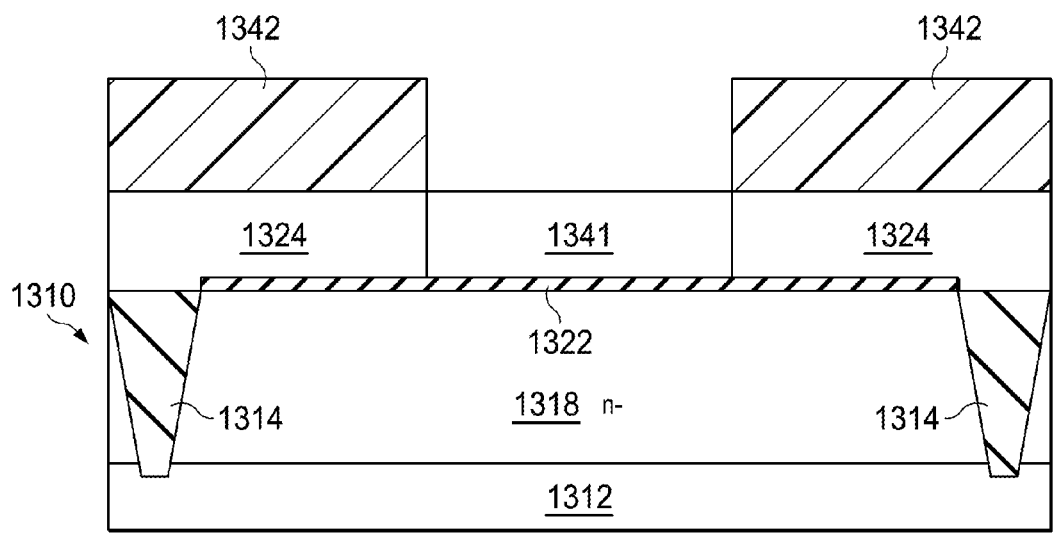
Figure 17E:
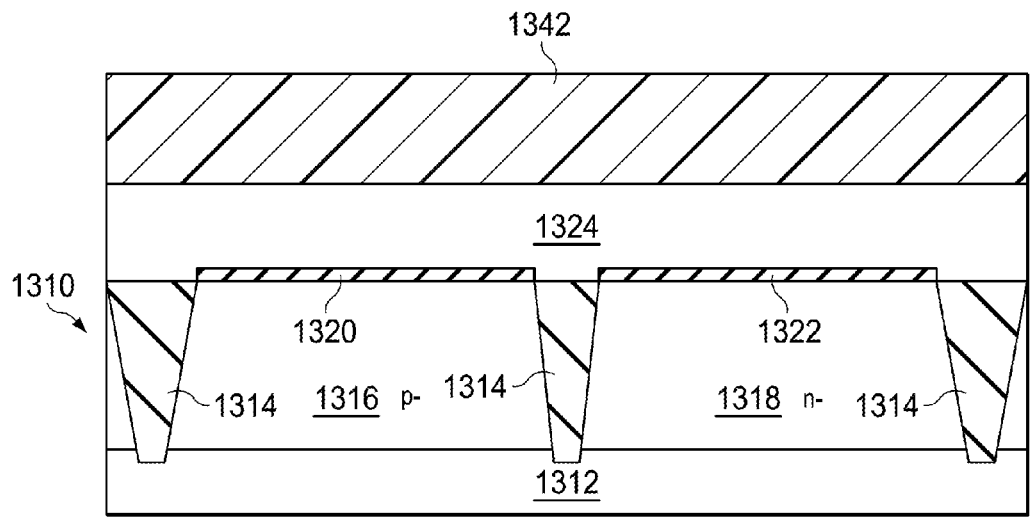
Figure 17F:
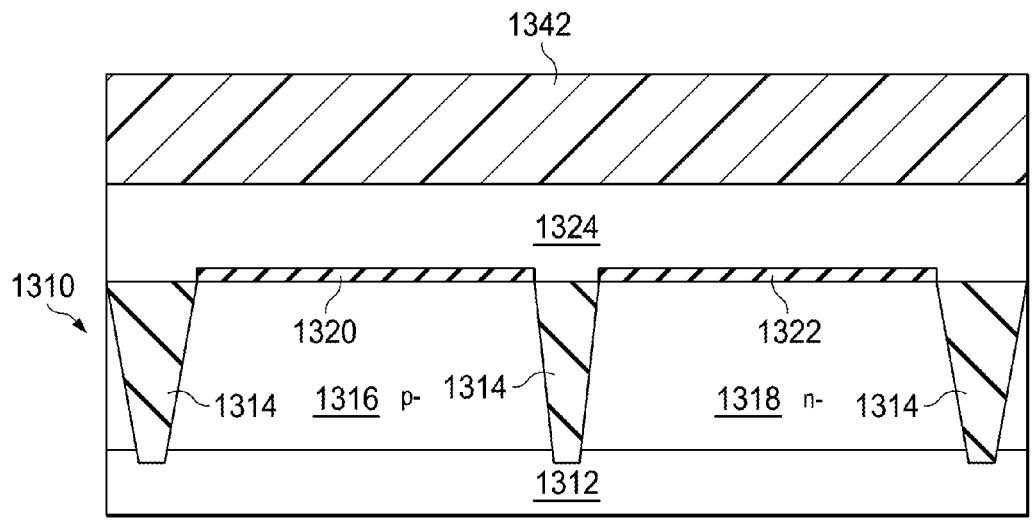
Figure 18A:
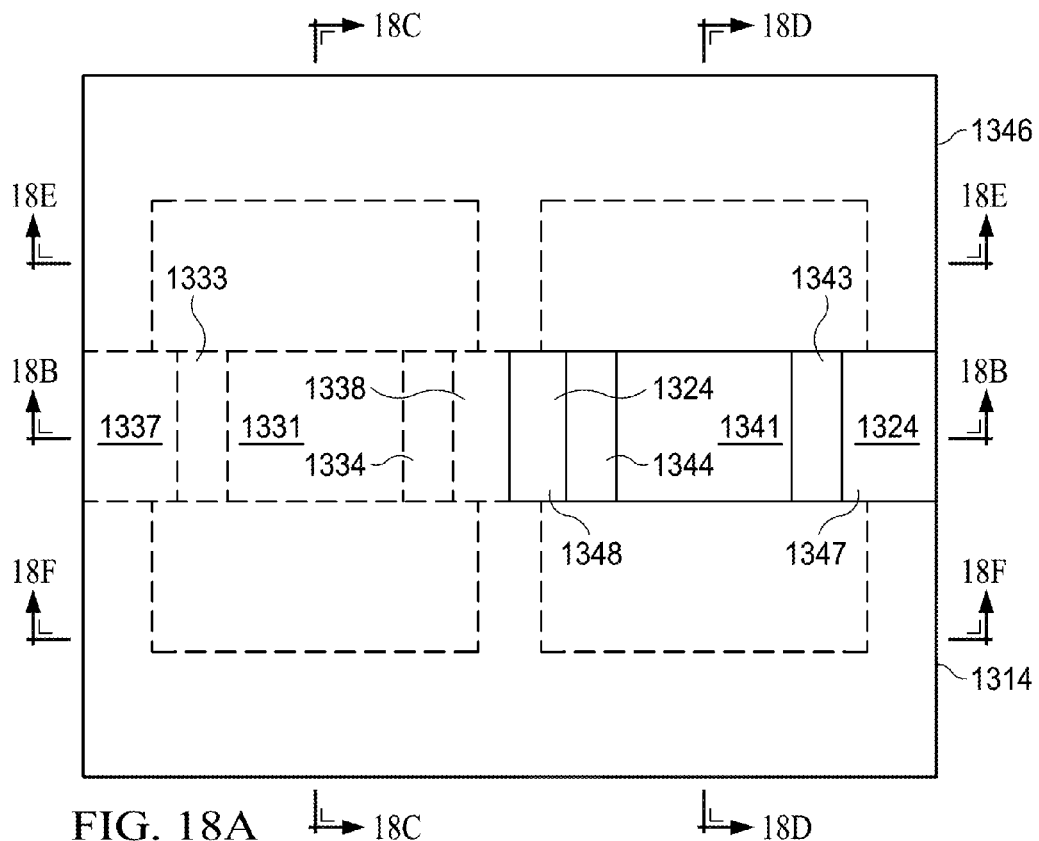
Figure 18B:
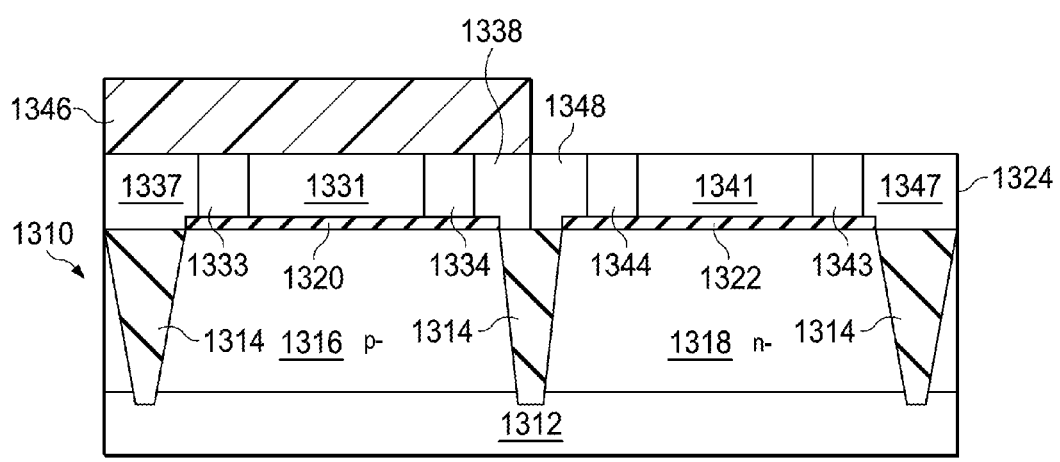
Figure 18C:
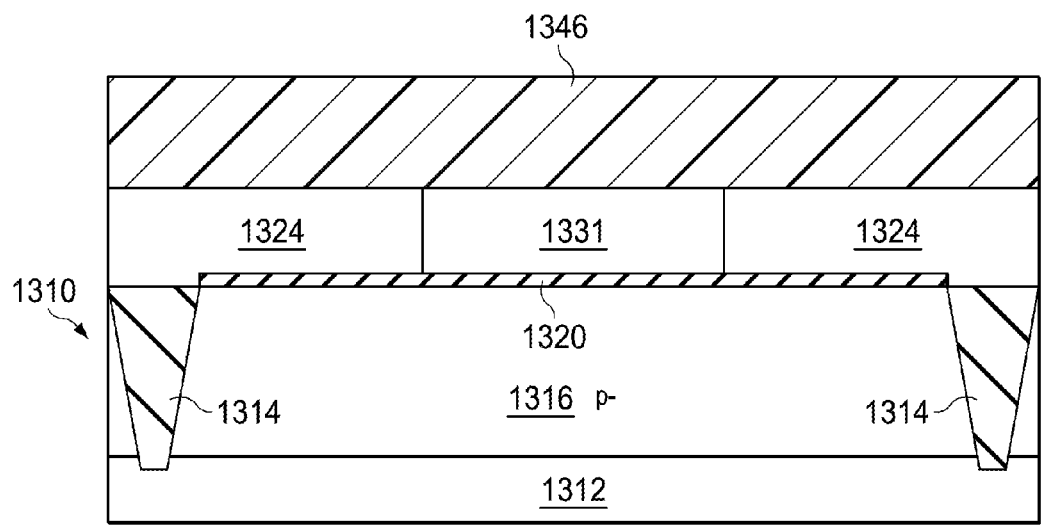
Figure 18D:
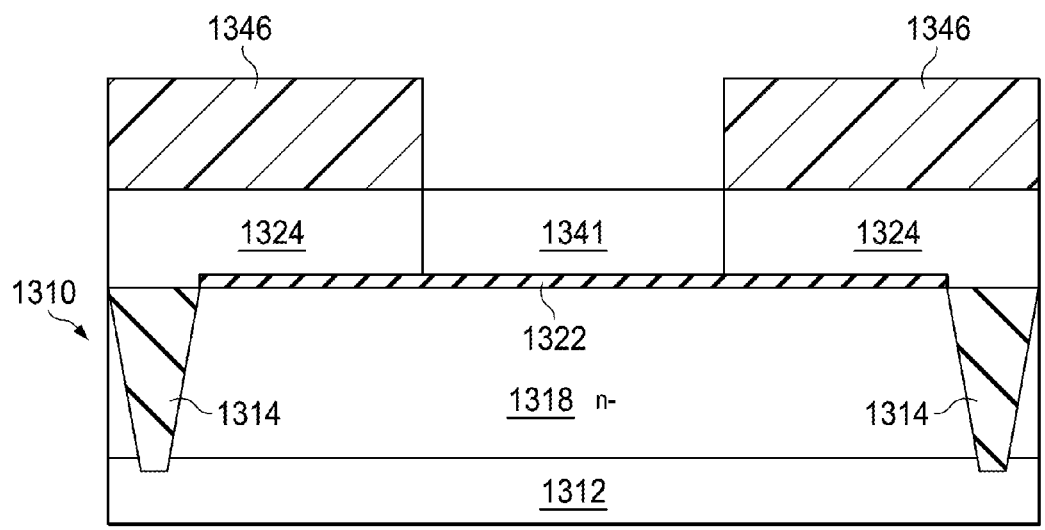
Figure 18E:
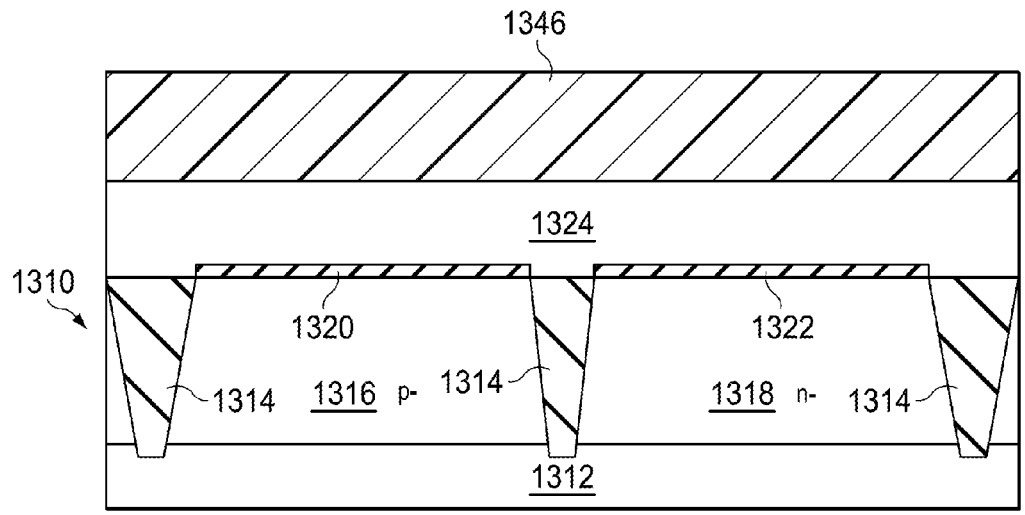
Figure 18F:
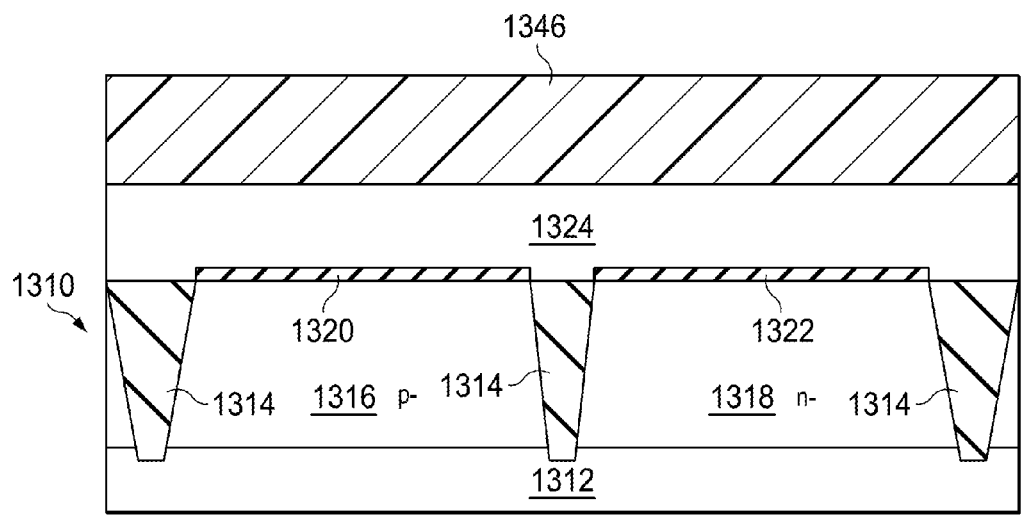
Figure 19A:
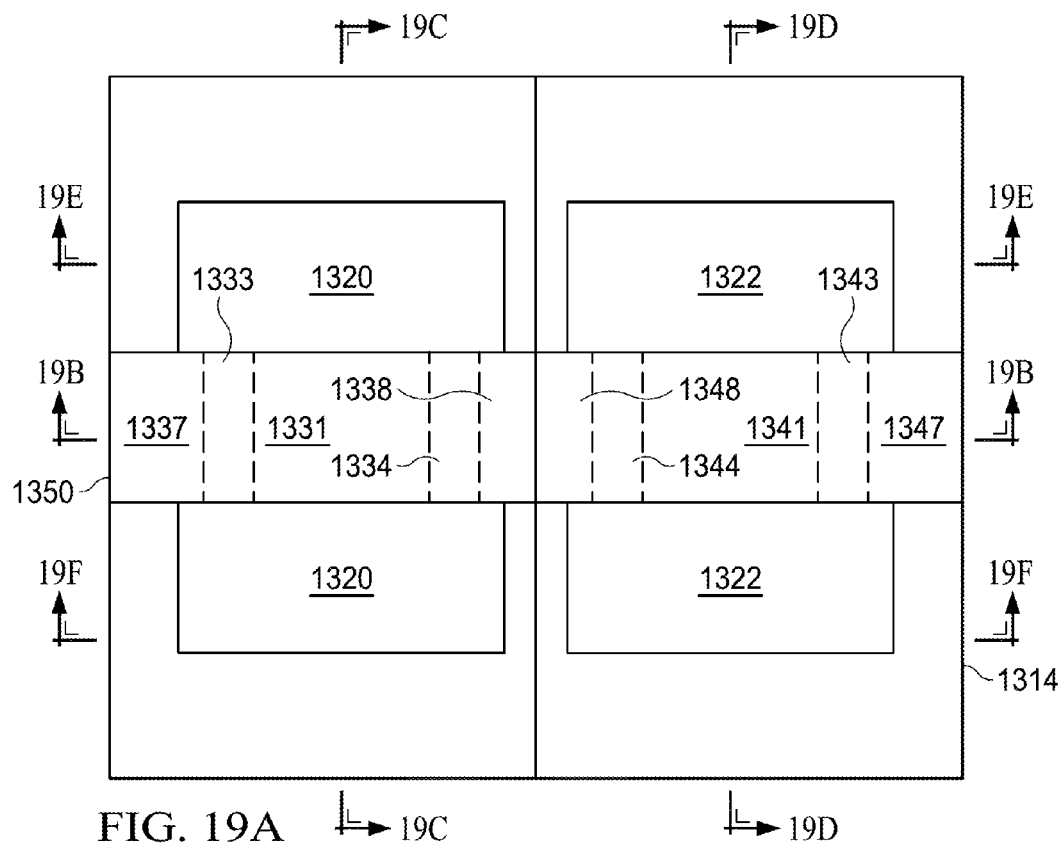
Figure 19B:
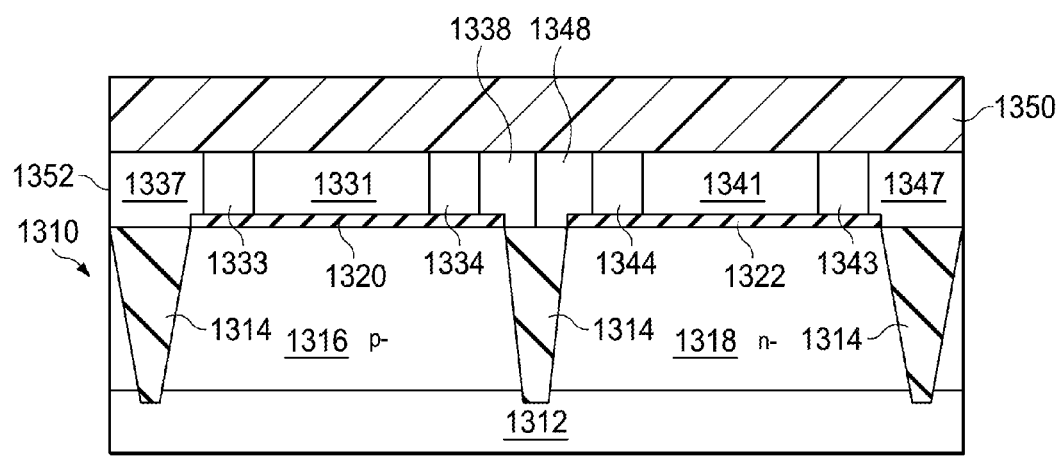
Figure 19C:
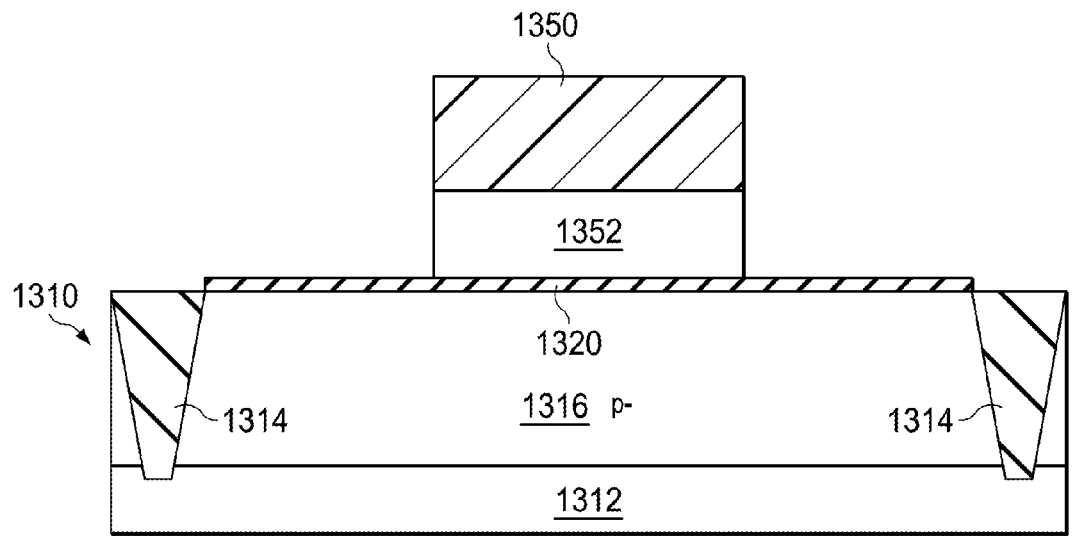
Figure 19D:
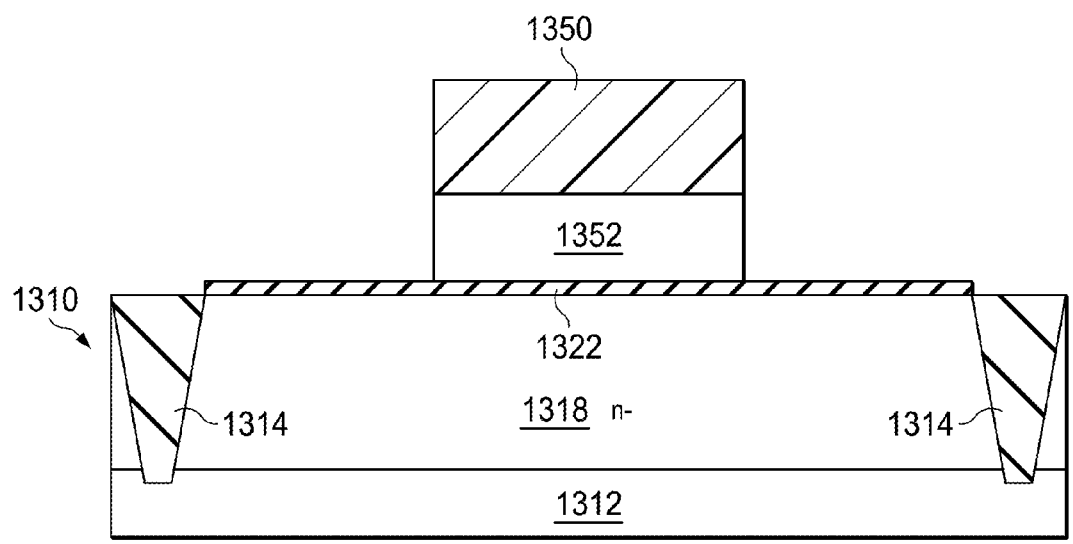
Figure 19E:
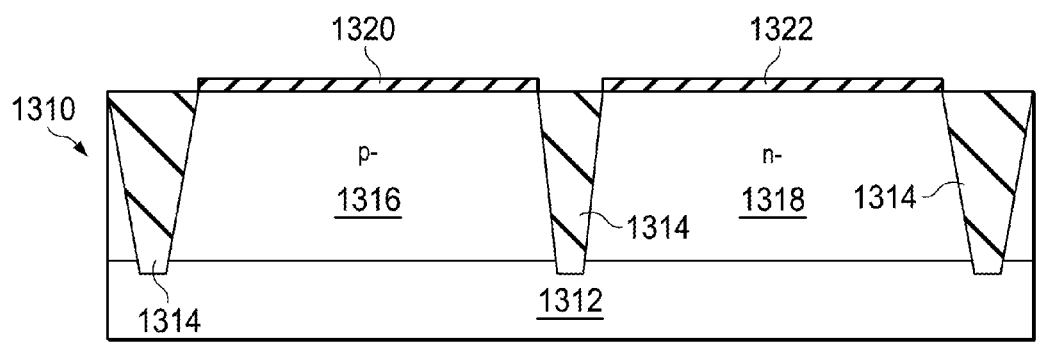
Figure 19F:
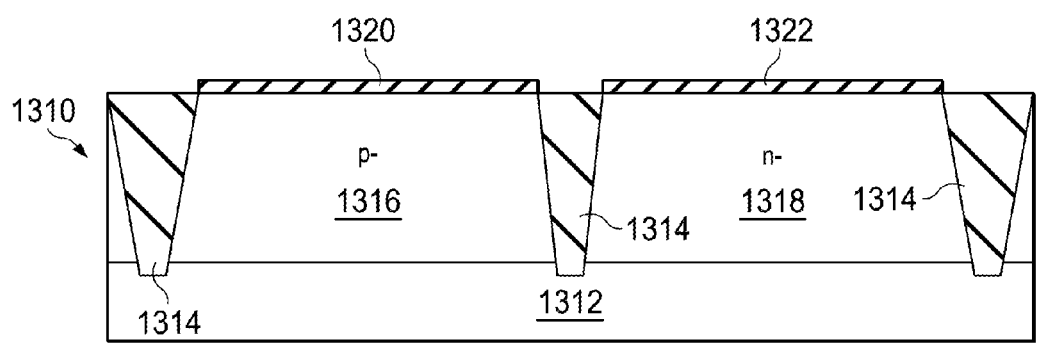
Figure 20A:
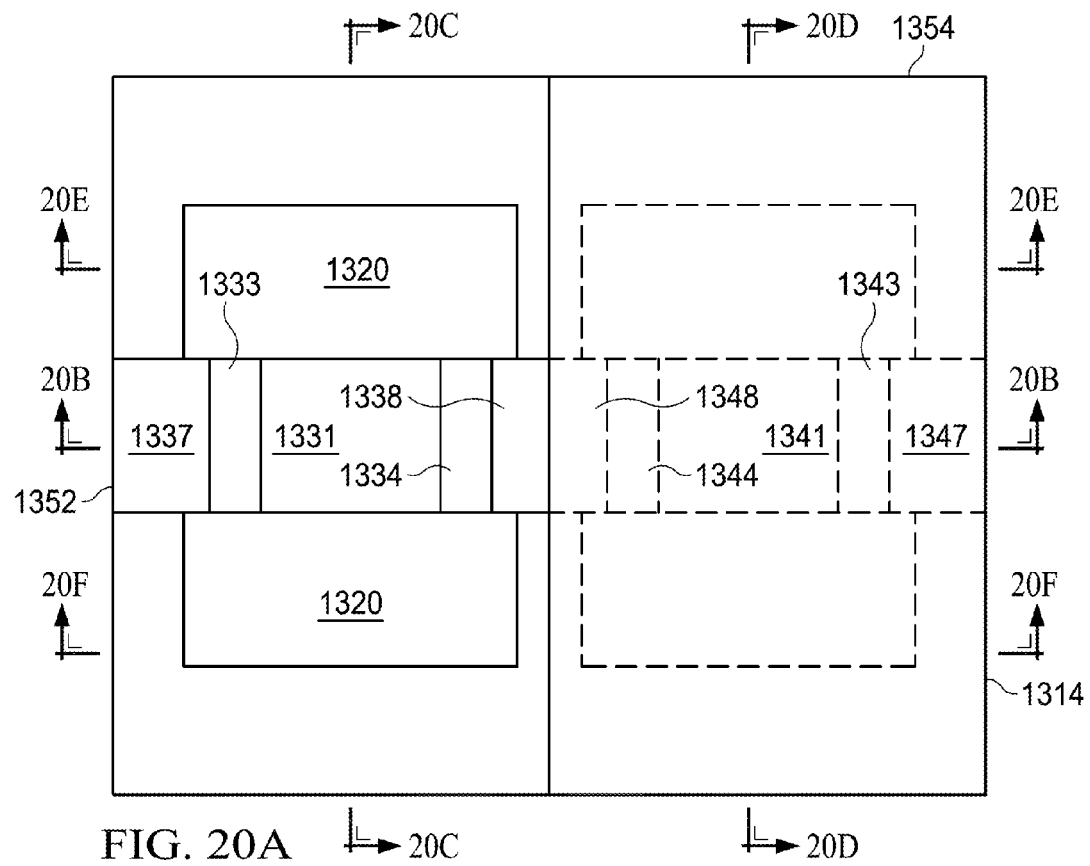
Figure 20B:
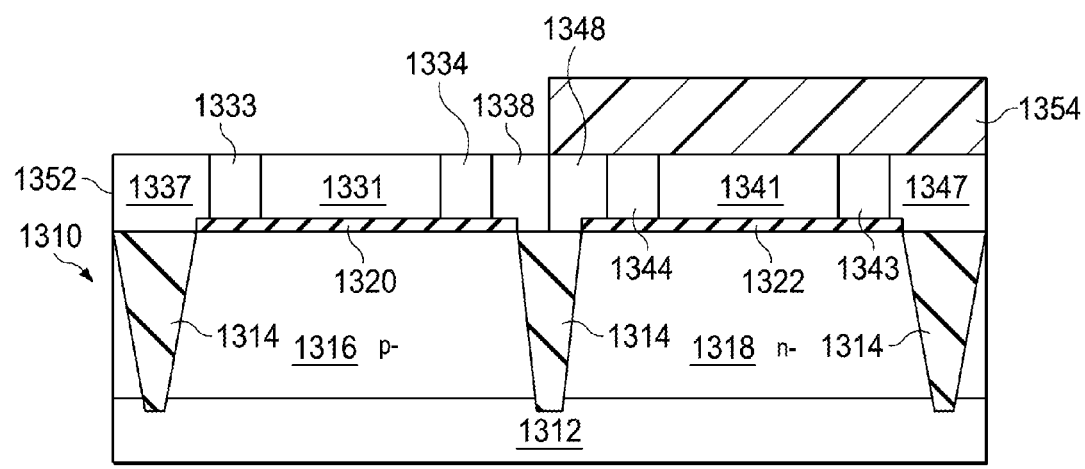
Figure 20C:
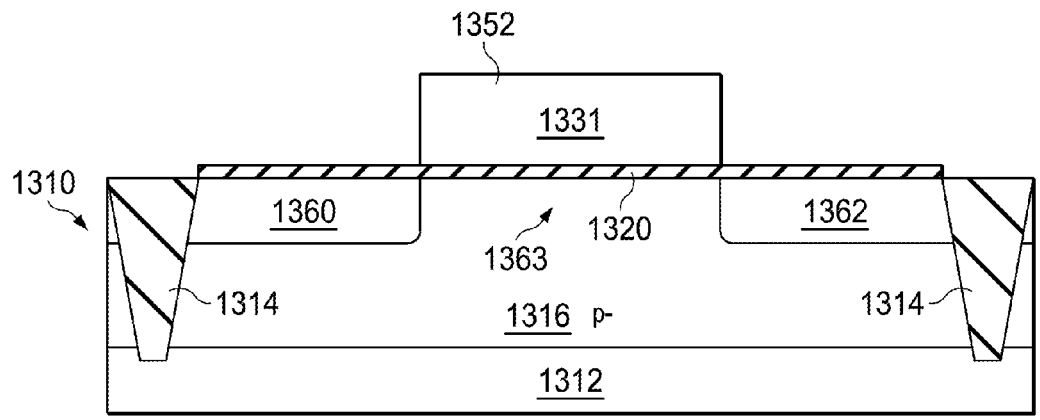
Figure 20D:
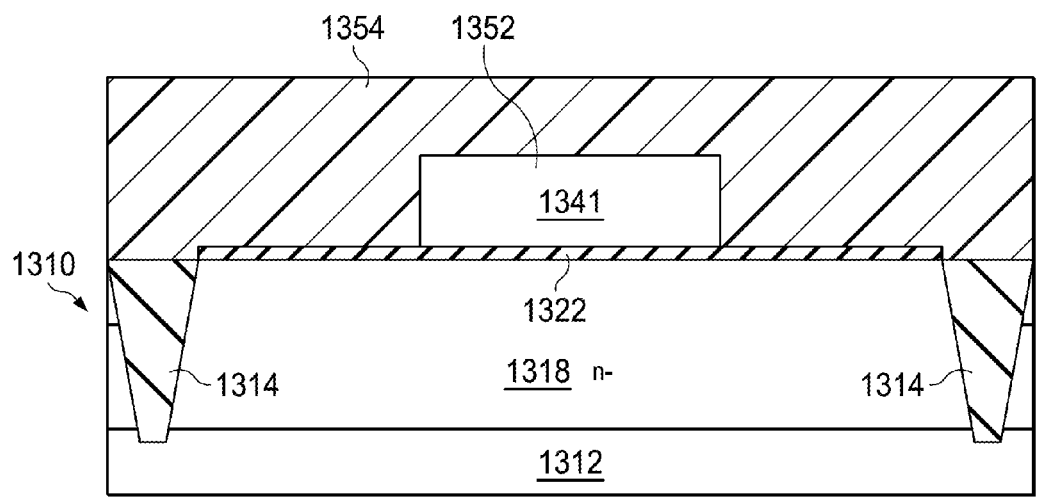
Figure 20E:
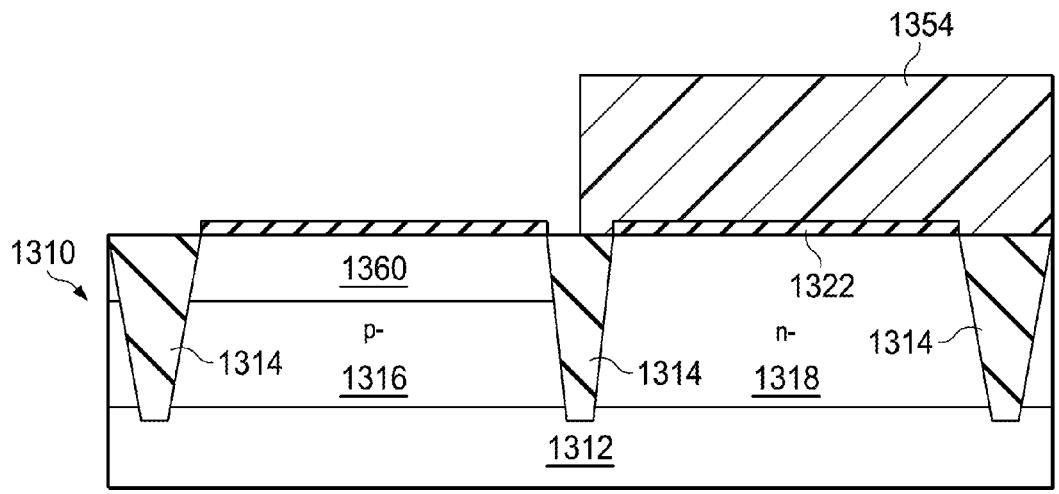
Figure 20F:
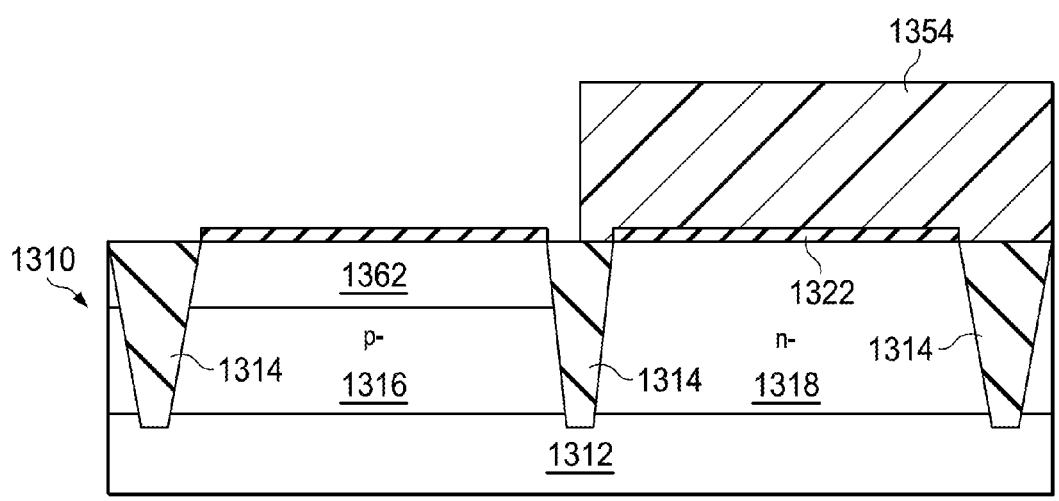
Figure 21A:
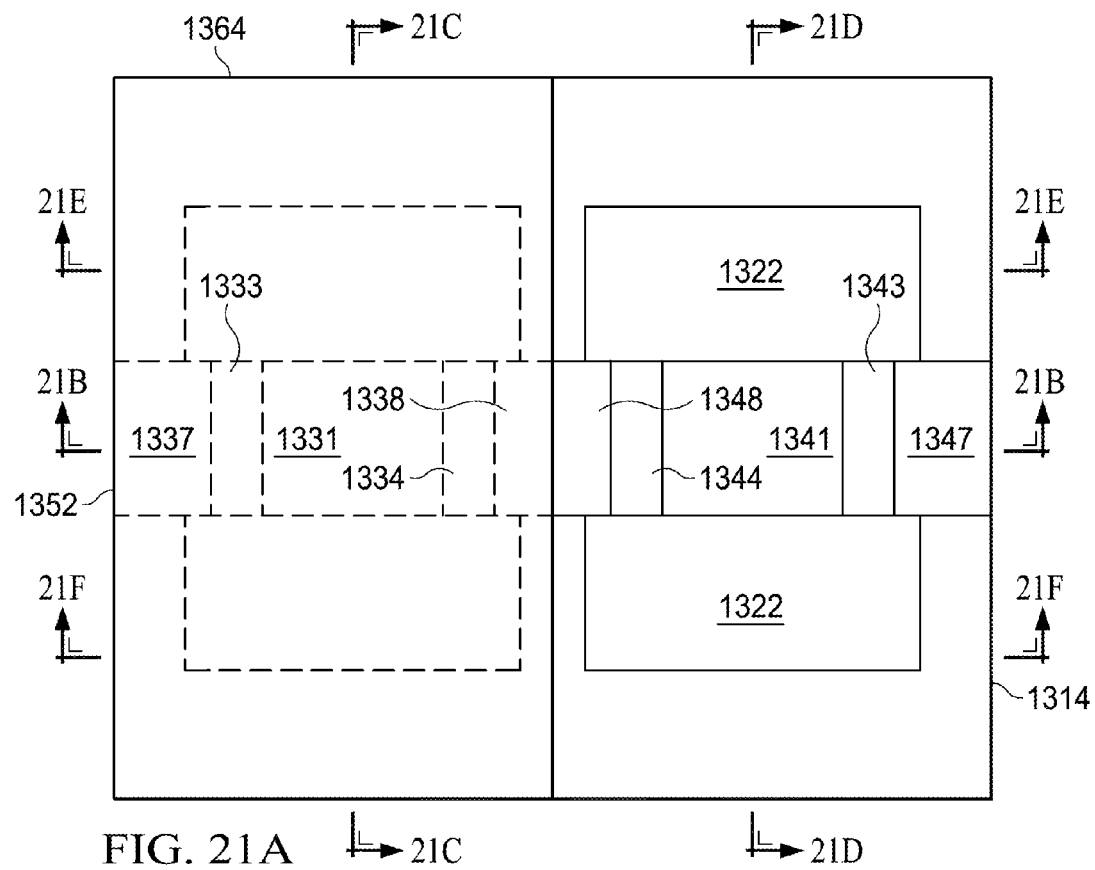
Figure 21B:
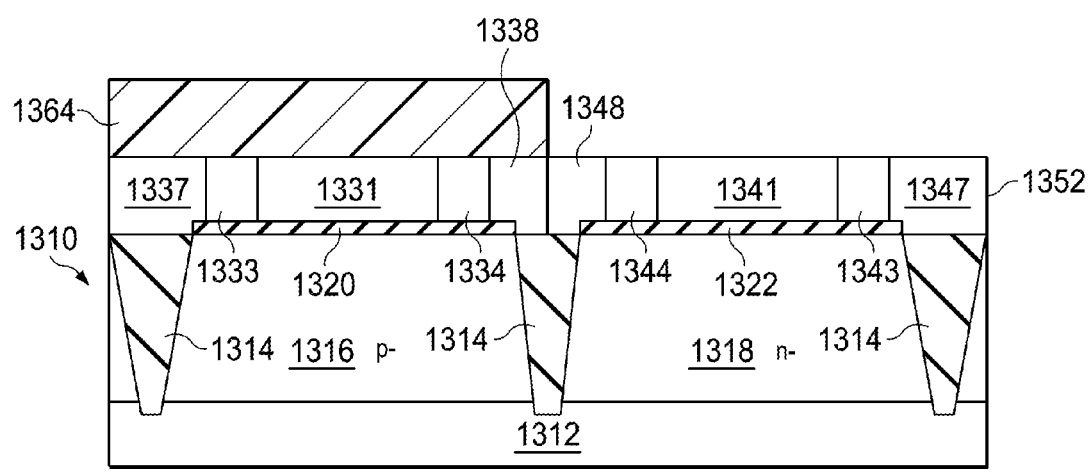
Figure 21C:
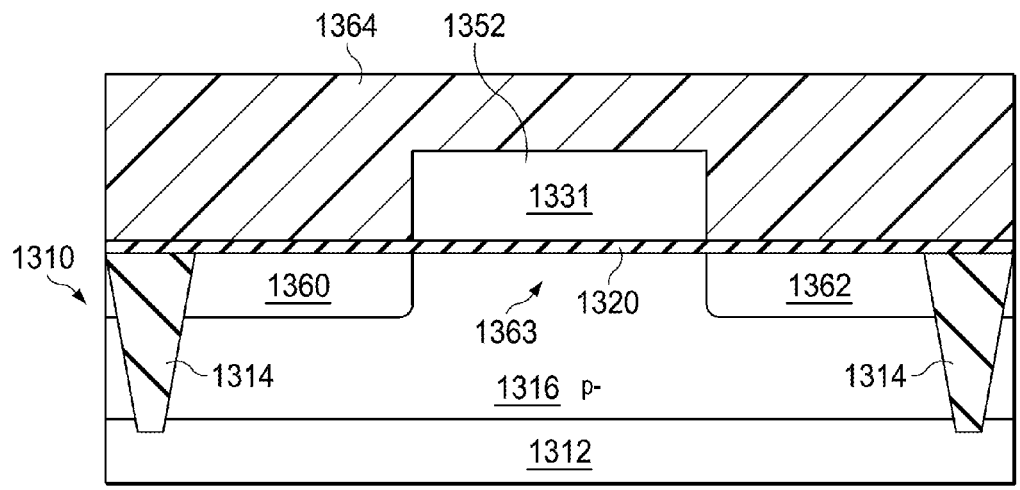
Figure 21D:
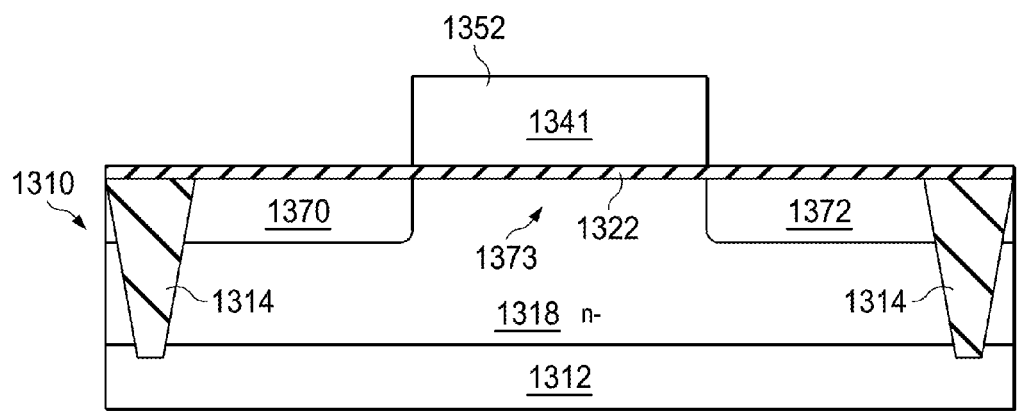
Figure 21E:
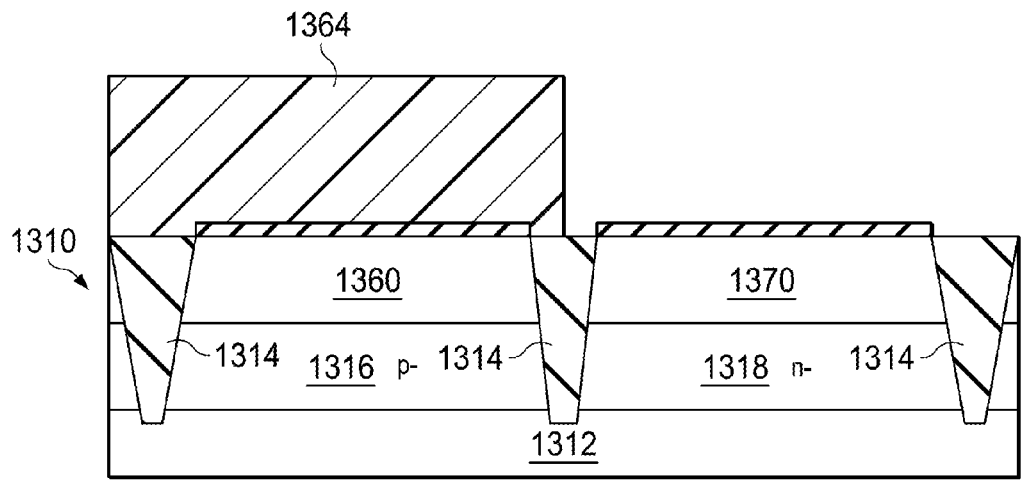
Figure 21F:
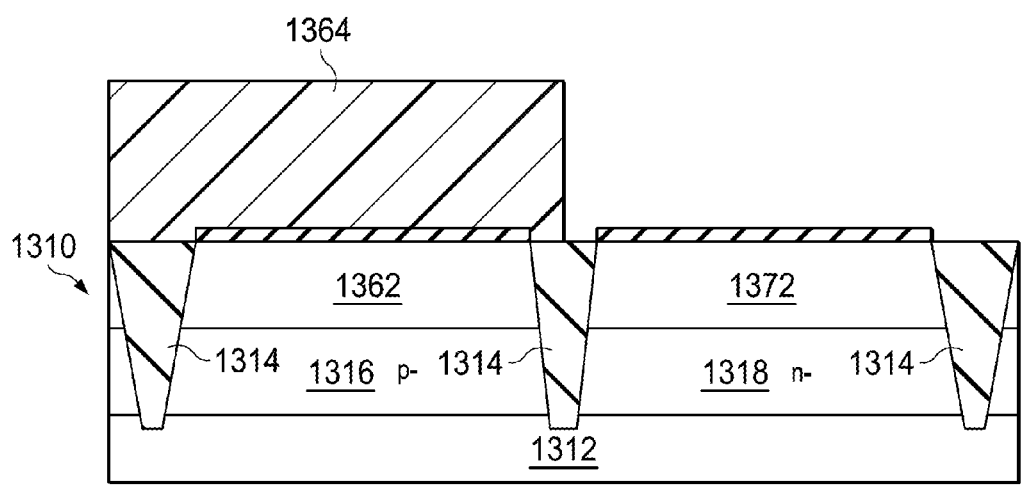
Figure 22A:
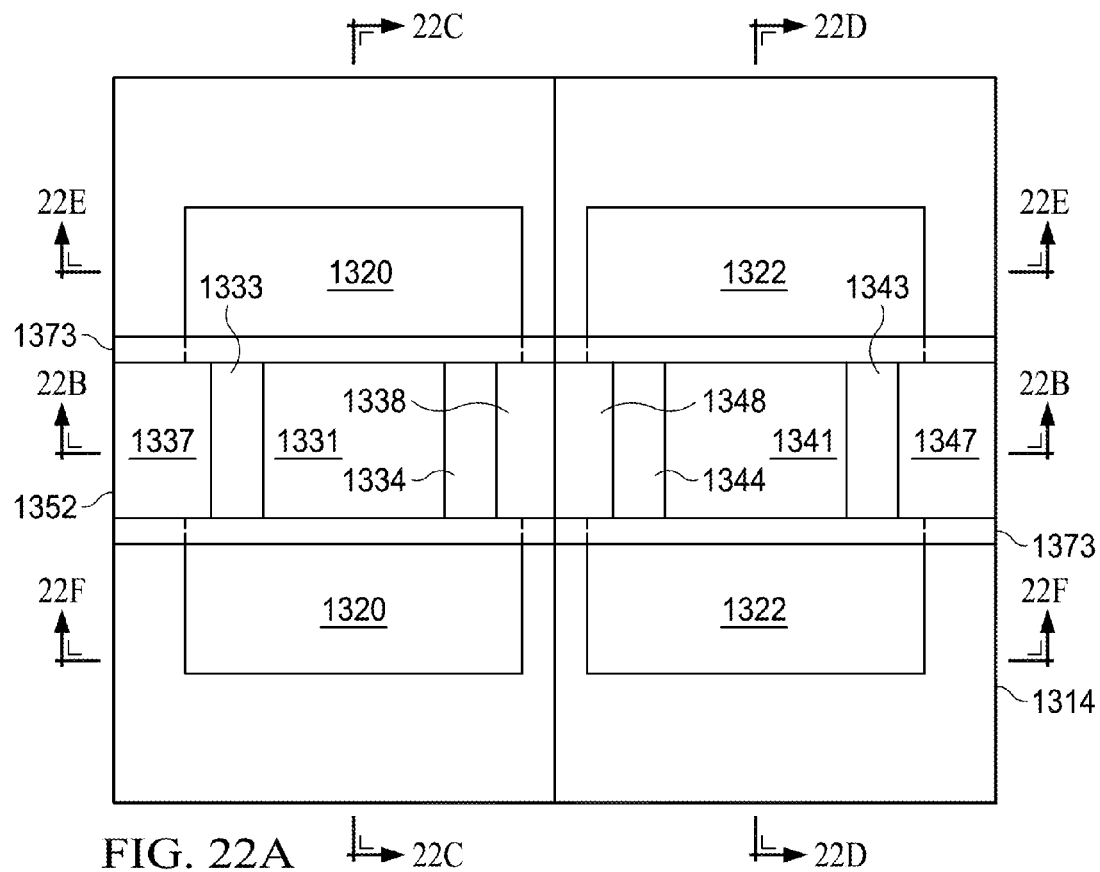
Figure 22B:
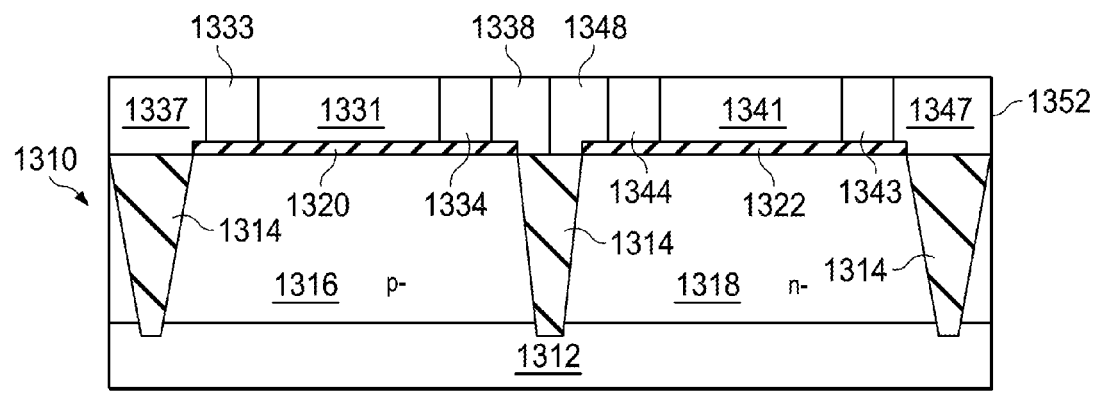
Figure 22C:
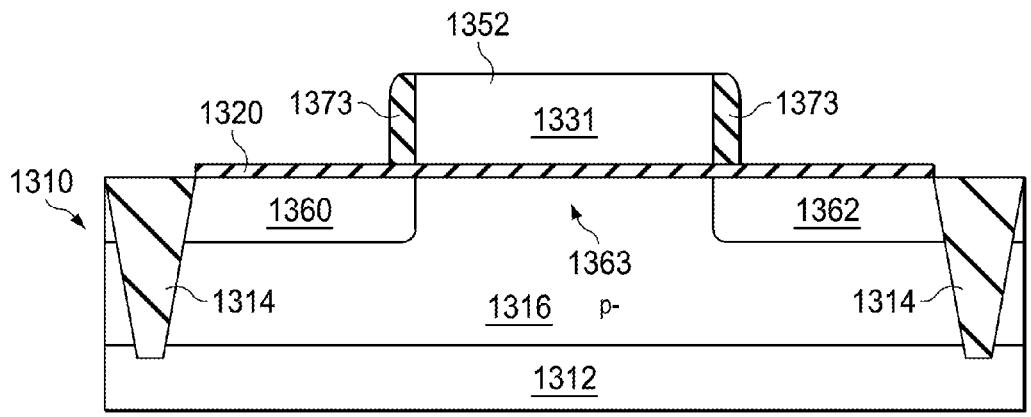
Figure 22D:
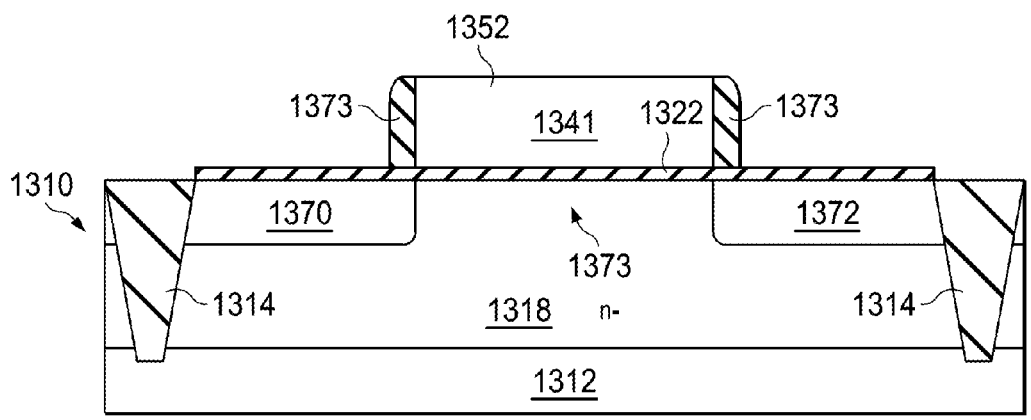
Figure 22E:
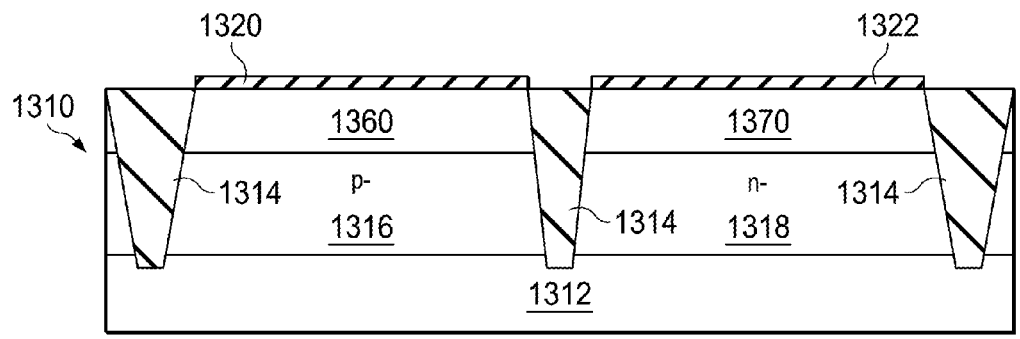
Figure 22F:
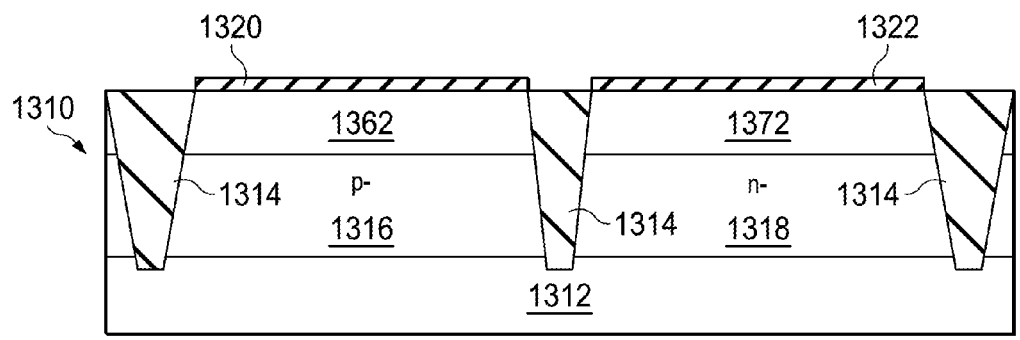
Figure 23A:
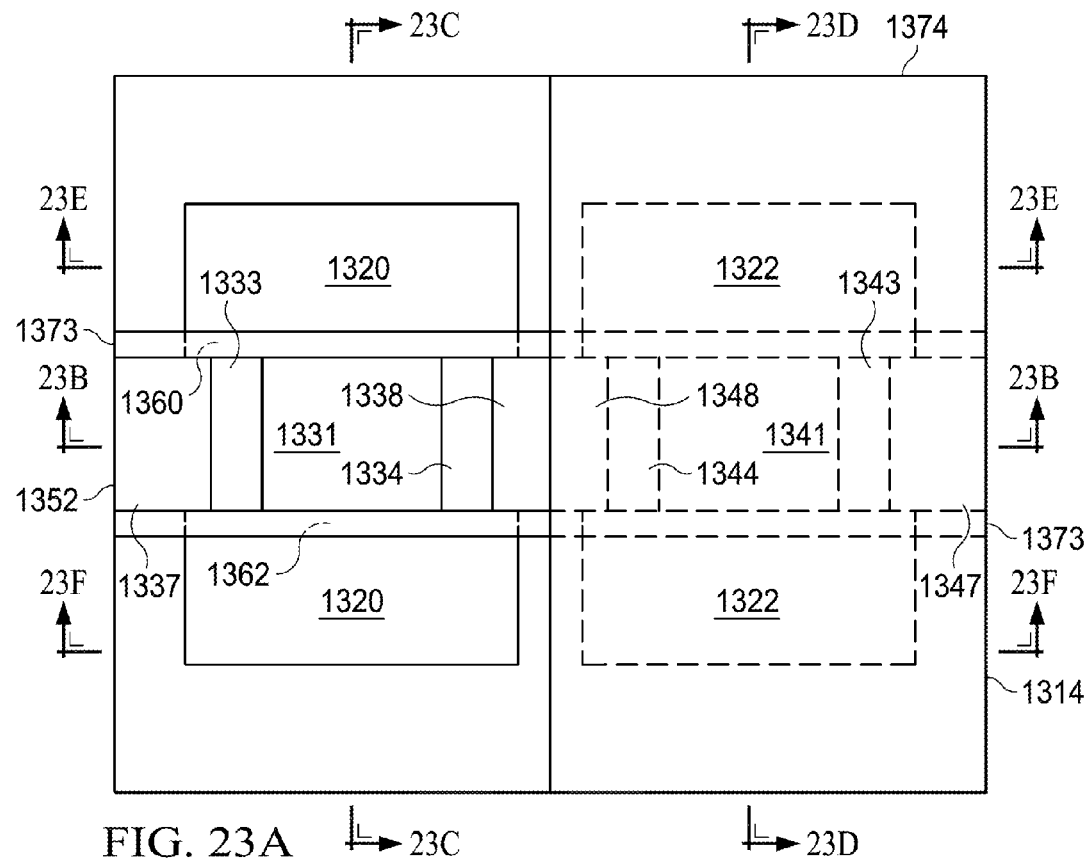
Figure 23B:
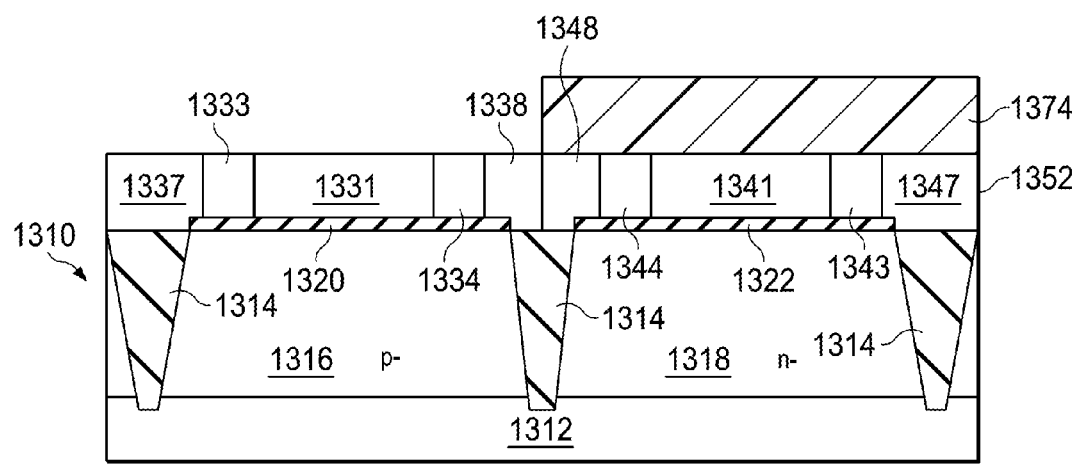
Figure 23C:
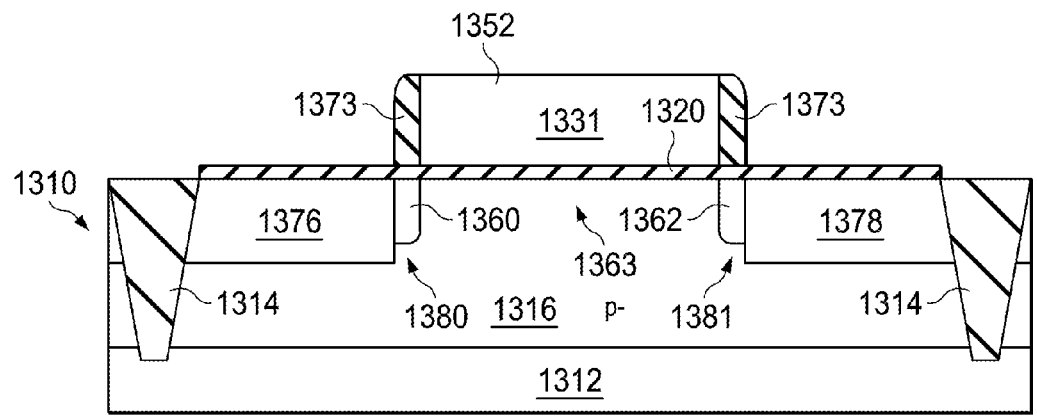
Figure 23D:
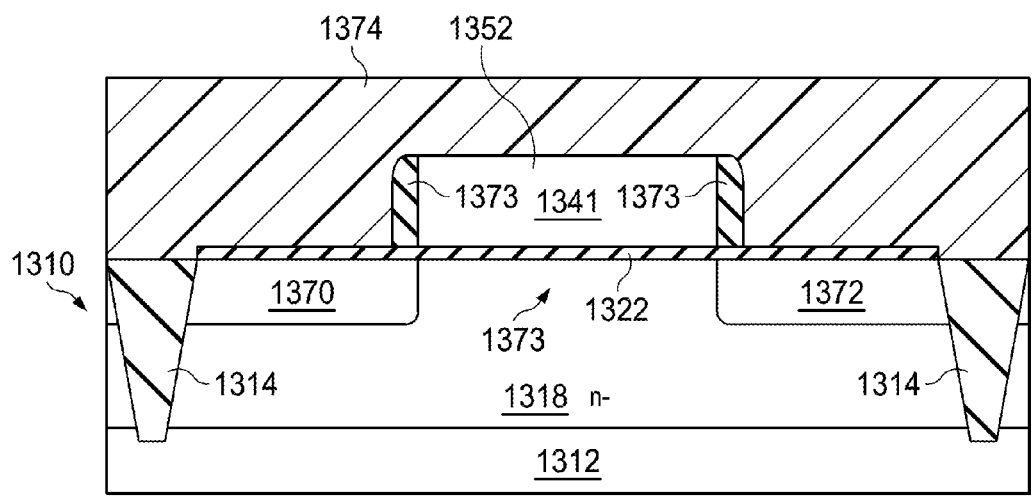
Figure 23E:
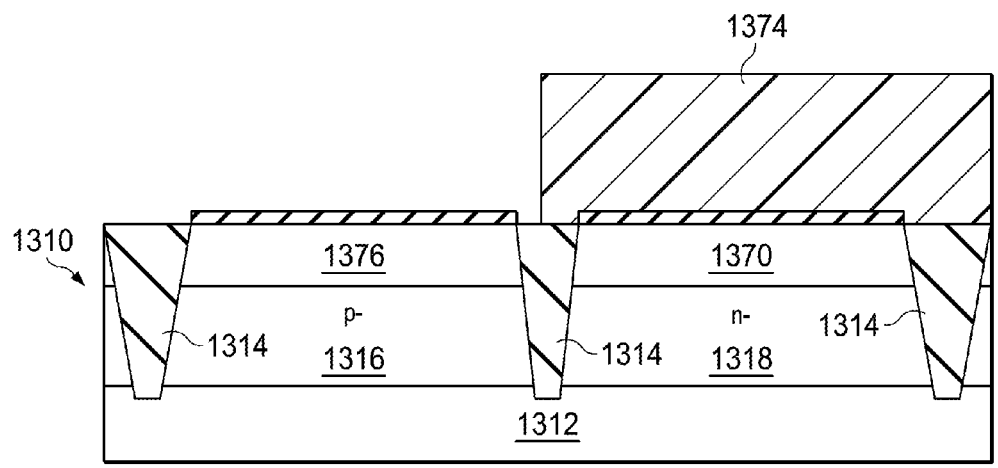
Figure 23F:
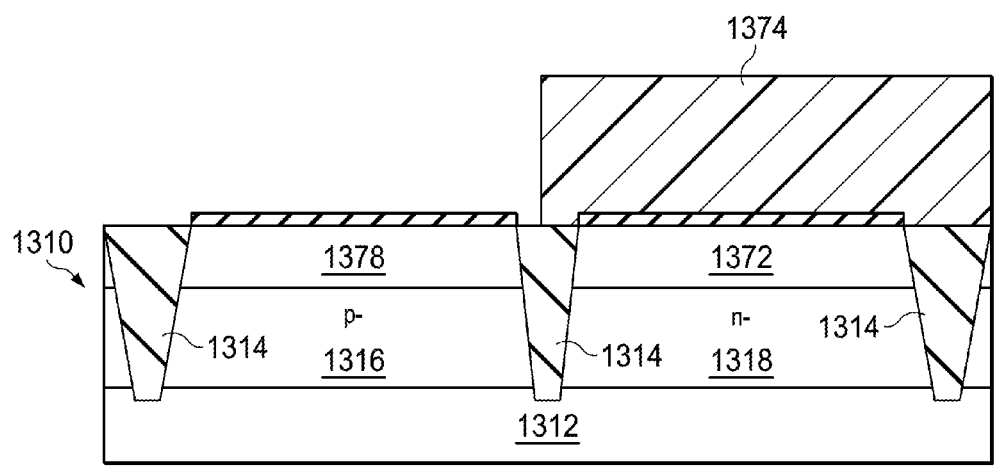
Figure 24A:
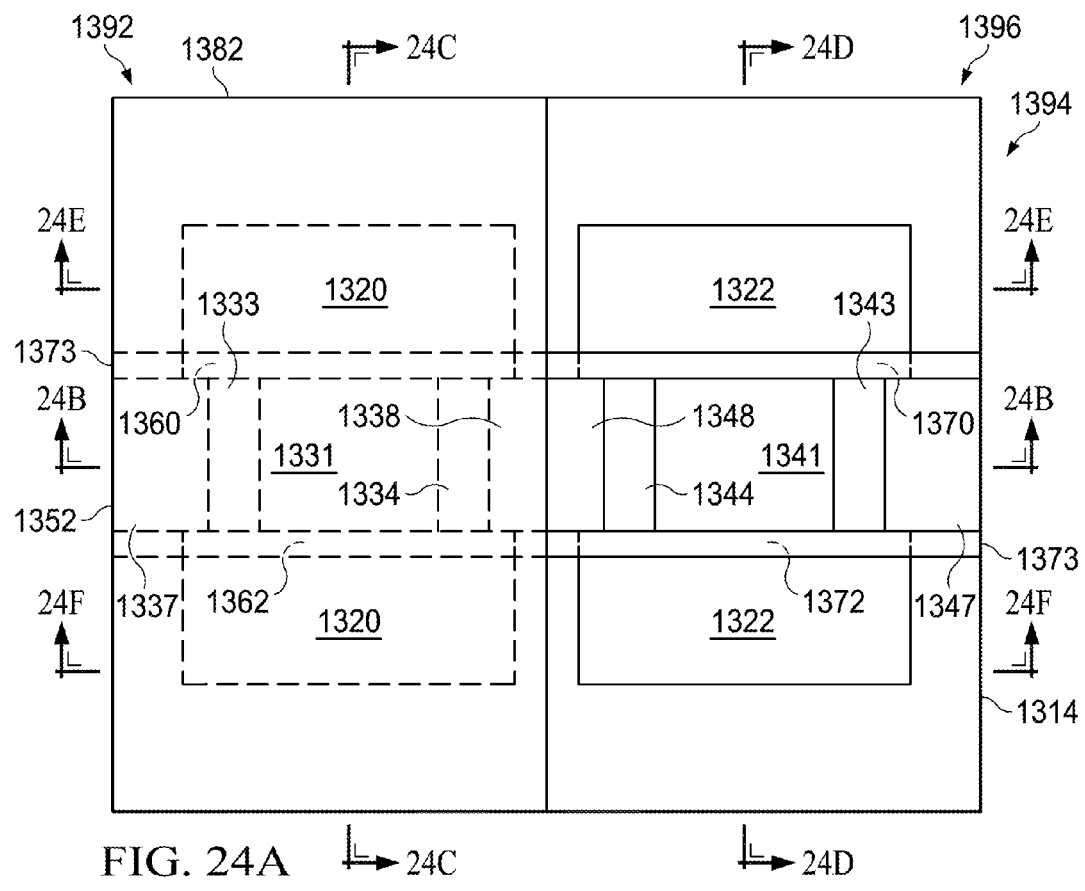
Figure 24B:
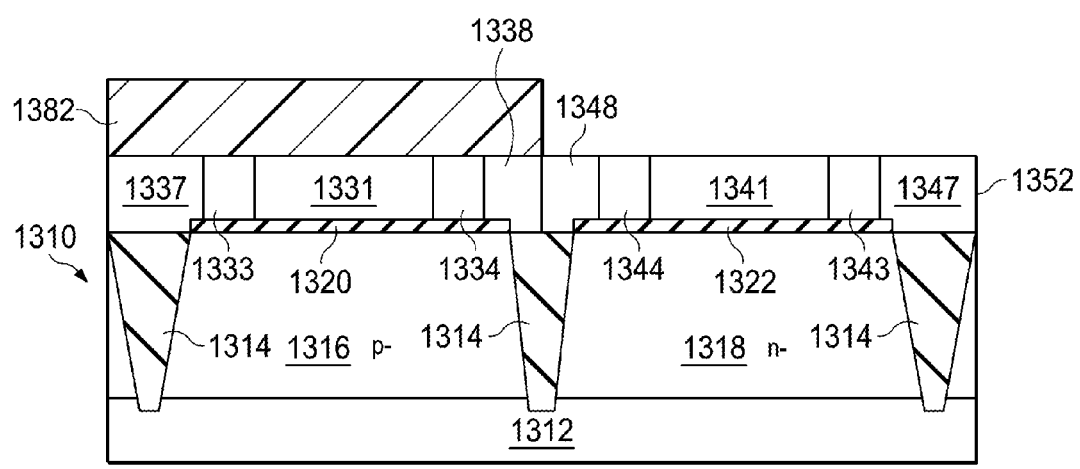
Figure 24C:
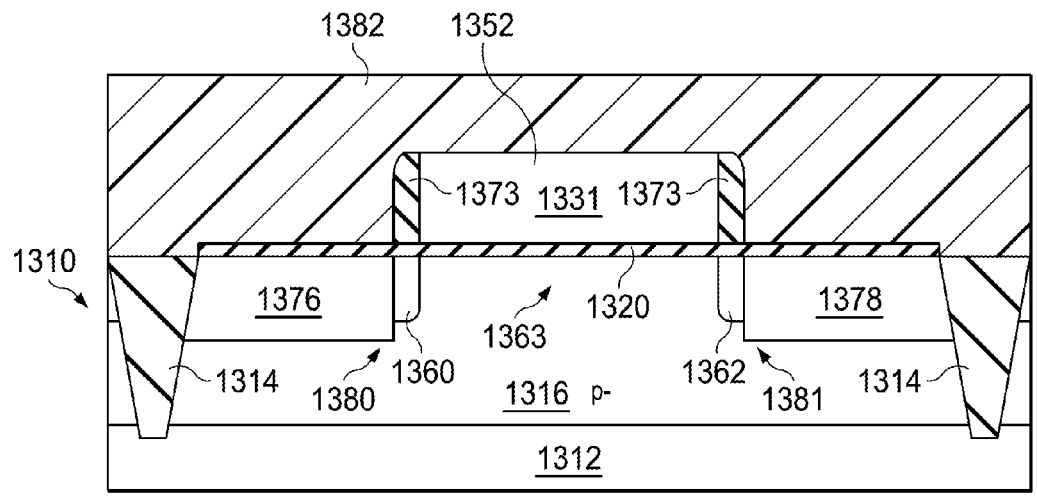
Figure 24D:
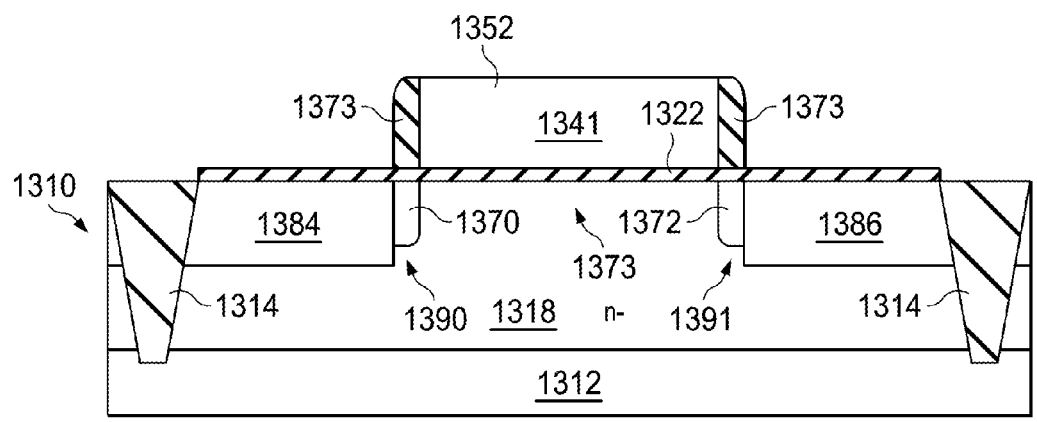
Figure 24E:
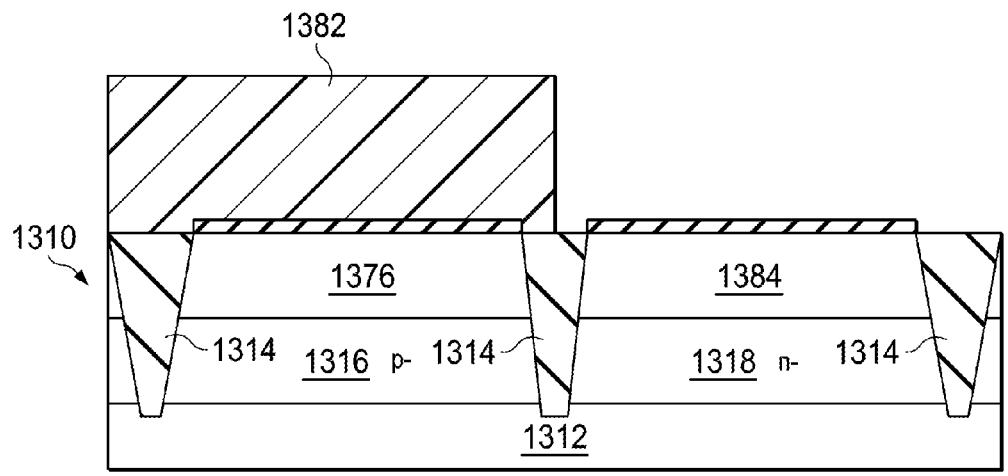
Figure 24F:
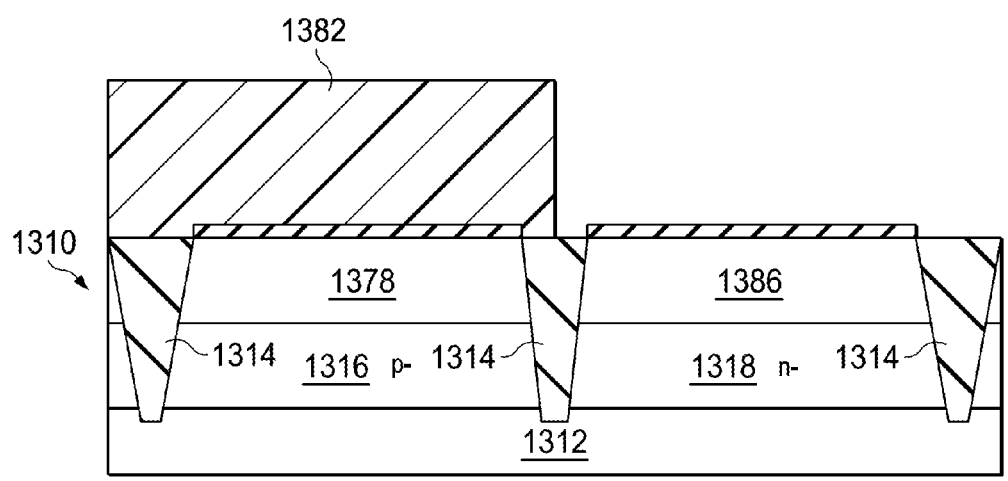

FIGS. 13D-24D show a series of cross-sectional views taken along line 13D-13D of FIG. 13A through line 24D-24D of FIG. 24A, respectively. FIGS. 13E-24E show a series of cross-sectional views taken along line 13E-13E of FIG. 13A through line 24E-24E of FIG. 24A, respectively. FIGS. 13F-24F show a series of cross-sectional views taken along line 13F-13F of FIG. 13A through line 24F-24F of FIG. 24A, respectively.

As shown in FIGS. 13A-13F, method 1300 utilizes a partially-completed conventionally-formed semiconductor device 1308 that includes a semiconductor body 1310. Semiconductor body 1310, in turn, includes a p-type single-crystal-silicon substrate 1312, and a trench isolation structure 1314 that touches substrate 1312.

Semiconductor body 1310 also includes a p-type well 1316 and an n-type well 1318 that touch substrate 1312 and trench isolation structure 1314. (P-type well 1316 can optionally be omitted such that all structures formed in p-well 1316 can alternately be formed in p-type substrate 1312.)

As additionally shown in FIGS. 13A-13F, semiconductor device 1308 also includes a gate insulation region 1320 that touches and lies over p-type well 1316, and a gate insulation region 1322 that touches and lies over n-type well 1318. CMOS device 1308 further includes a gate layer 1324 that touches trench isolation structure 1314, gate insulation region 1320, and gate insulation region 1322. Gate layer 1324 can be implemented with, for example, polycrystalline silicon.

As further shown in FIGS. 13A-13F, method 1300 begins by forming an implant blocking structure 1330 to touch and lie over gate layer 1324. As shown, implant blocking structure 1330 exposes a portion of gate layer 1324. In the present example, implant blocking structure 1330 is implemented with a conventionally-formed patterned photoresist layer. A conventionally-formed hard mask can alternately be used. After implant blocking structure 1330 has been formed, an n-type dopant, such as phosphorous or arsenic, is conventionally implanted into the exposed portion of gate layer 1324 to form a first n-type gate region 1331.

As shown in FIGS. 14A-14F, following the formation of first n-type gate region 1331, implant blocking structure 1330 is replaced with an implant blocking structure 1332. As shown, implant blocking structure 1332 exposes first n-type gate region 1331, while exposing new portions of gate layer 1324.

Implant blocking structure 1330 can be replaced with implant blocking structure 1332 in a number of ways. When implant blocking structure 1330 is implemented with a conventionally-formed patterned photoresist layer or a conventionally-formed hard mask, implant blocking structure 1330 can be trimmed to form implant blocking structure 1332.

Alternately, implant blocking structure 1330 can be completely removed in a conventional fashion. After this, a new implant blocking structure with larger openings can be conventionally formed to form implant blocking structure 1332. For example, a patterned photoresist layer or hard mask can be completely removed. After this, a new patterned photoresist layer or hard mask with larger openings can be formed.

Once implant blocking structure 1332 has been formed, an n-type dopant, such as phosphorous or arsenic, is conventionally implanted into first n-type gate region 1331 and the newly exposed portions of gate layer 1324. The implant increases the dopant concentration of first n-type gate region 1331, and forms a second n-type gate region 1333 and a fourth n-type gate region 1334. The second and third n-type gate regions 1333 and 1334 are spaced apart and separated by the first n-type gate region 1331.

As shown in FIGS. 15A-15F, following the formation of the first, second, and third n-type gate regions 1331, 1333, and 1334, implant blocking structure 1332 is replaced with an implant blocking structure 1336. As shown, implant blocking structure 1336 exposes the first, second, and third n-type gate regions 1331, 1333, and 1334, while exposing new portions of gate layer 1324.

As with implant blocking structure 1330, implant blocking structure 1332 can be replaced with implant blocking structure 1336 in a number of ways. When implant blocking structure 1332 is implemented with a conventionally-formed patterned photoresist layer or a conventionally-formed hard mask, implant blocking structure 1332 can be trimmed to form implant blocking structure 1336.

Alternately, implant blocking structure 1332 can be completely removed in a conventional fashion. After this, a new implant blocking structure with larger openings can be conventionally formed to form implant blocking structure 1336. For example, a patterned photoresist layer or hard mask can be completely removed. After this, a new patterned photoresist layer or hard mask with larger openings can be formed.

Once implant blocking structure 1336 has been formed, an n-type dopant, such as phosphorous or arsenic, is conventionally implanted with a relatively light dose into the first, second, and third n-type gate regions 1331, 1333, and 1334, and the newly exposed portions of gate layer 1324. The implant increases the dopant concentrations of the first, second, and third n-type gate regions 1331, 1333, and 1334. The implant also forms relatively lightly doped fourth and fifth n-type gate regions 1337 and 1338. Following the formation of the fourth and fifth n-type gate regions 1337 and 1338, implant blocking structure 1336 is removed in a conventional manner.

As shown in FIGS. 16A-16F, after implant blocking structure 1336 has been removed, an implant blocking structure 1340 is formed to touch and lie over gate layer 1324. As shown, implant blocking structure 1340 exposes a new portion of gate layer 1324, while protecting the first, second, third, fourth, and fifth n-type gate regions 1331, 1333, 1334, 1337, and 1338.

In the present example, implant blocking structure 1340 is implemented with a conventionally-formed patterned photoresist layer. A conventionally-formed hard mask can alternately be used. After implant blocking structure 1340 has been formed, a p-type dopant, such as boron, is conventionally implanted into the exposed portion of gate layer 1324 to form a first p-type gate region 1341.

As shown in FIGS. 17A-17F, following the formation of first p-type gate region 1341, implant blocking structure 1340 is replaced with an implant blocking structure 1342. As shown, implant blocking structure 1342 exposes first p-type gate region 1341, while exposing new portions of gate layer 1324. In addition, implant blocking structure 1342 continues to protect the first, second, third, fourth, and fifth n-type gate regions 1331, 1333, 1334, 1337, and 1338.

Implant blocking structure 1340 can be replaced with implant blocking structure 1342 in a number of ways. When implant blocking structure 1340 is implemented with a conventionally-formed patterned photoresist layer or a conventionally-formed hard mask, implant blocking structure 1340 can be trimmed to form implant blocking structure 1342.

Alternately, implant blocking structure 1340 can be completely removed in a conventional fashion. After this, a new implant blocking structure with larger openings can be conventionally formed to form implant blocking structure 1342. For example, a patterned photoresist layer or hard mask can be completely removed. After this, a new patterned photoresist layer or hard mask with larger openings can be formed.

Once implant blocking structure 1342 has been formed, a p-type dopant, such as boron, is conventionally implanted into first p-type gate region 1341 and the newly exposed portions of gate layer 1324. The implant increases the dopant concentrations of first p-type gate region 1341. The implant also forms second and third p-type gate regions 1343 and 1344.

As shown in FIGS. 18A-18F, following the formation of the first, second, and third p-type gate regions 1341, 1343, and 1344, implant blocking structure 1342 is replaced with an implant blocking structure 1346. As shown, implant blocking structure 1346 exposes the first, second, and third p-type gate regions 1341, 1343, and 1344, while exposing new portions of gate layer 1324. In addition, implant blocking structure 1346 continues to protect the first, second, third, fourth, and fifth n-type gate regions 1331, 1333, 1334, 1337, and 1338.

As with implant blocking structure 1340, implant blocking structure 1342 can be replaced with implant blocking structure 1346 in a number of ways. When implant blocking structure 1342 is implemented with a conventionally-formed patterned photoresist layer or a conventionally-formed hard mask, implant blocking structure 1342 can be trimmed to form implant blocking structure 1346.

Alternately, implant blocking structure 1342 can be completely removed in a conventional fashion. After this, a new implant blocking structure with larger openings can be conventionally formed to form implant blocking structure 1346. For example, a patterned photoresist layer or hard mask can be completely removed. After this, a new patterned photoresist layer or hard mask with larger openings can be formed.

Once implant blocking structure 1346 has been formed, a p-type dopant, such as boron, is conventionally implanted with a relatively light dose into the first, second, and third p-type gate regions 1341, 1343, and 1344, and the newly exposed portions of gate layer 1324. The implant increases the dopant concentrations of the first, second, and third p-type gate regions 1341, 1343, and 1344, and forms relatively lightly doped fourth and fifth p-type gate regions 1347 and 1348. Following the formation of the fourth and fifth p-type gate regions 1347 and 1348, implant blocking structure 1346 is removed in a conventional manner.

After implant blocking structure 1346 has been removed, the first, second, third, fourth and fifth n-type gate regions 1331, 1333, 1334, 1337, and 1338 and the first, second, third, fourth, and fifth p-type gate regions 1341, 1343, 1344, 1347, and 1348 are driven in (e.g., annealed at 1100° C. in a neutral ambient such as $N_2$).

As shown in FIGS. 19A-19F, after the drive in, a patterned photoresist layer 1350 that touches and lies over gate layer 1324 is conventionally formed. Once patterned photoresist layer 1350 has been formed, gate layer 1324 is etched in a conventional manner to form a gate 1352 that touches and lies over trench isolation structure 1314, gate insulation region 1320, and gate insulation region 1322. Patterned photoresist layer 1350 is then conventionally removed.

As shown in FIGS. 20A-20F, following the removal of patterned photoresist layer 1350, a patterned photoresist layer 1354 is conventionally formed to touch trench isolation structure 1314, gate insulation region 1322, and a portion of gate 1352. Once patterned photoresist layer 1354 has been formed, an n-type dopant, such as phosphorous or arsenic, is conventionally implanted into p-type well 1316 and the exposed portions of gate 1352.

The implant increases the dopant concentrations of the first, second, third, fourth and fifth n-type gate regions 1331, 1333, 1334, 1337, and 1338 of gate 1352, and forms a first n-type source region 1360 and a first n-type drain region 1362. Further, the first n-type source and drain regions 1360 and 1362 define a p-type channel portion 1363 of p-type well 1316 that lies between, touches, and separates the n-type source and drain regions 1360 and 1362. Following the implant, patterned photoresist layer 1354 is removed in a conventional fashion, such as with an ash process.

As shown in FIGS. 21A-21F, after patterned photoresist layer 1354 has been removed, a patterned photoresist layer 1364 is formed in a conventional manner to touch trench isolation structure 1314, gate insulation region 1320, and a portion of gate 1352. After patterned photoresist layer 1364 has been formed, a p-type dopant, such as boron, is conventionally implanted into n-type well 1318 and the exposed portions of gate 1352. The implant increases the dopant concentrations of the first, second, third, fourth and fifth p-type gate regions 1341, 1343, 1344, 1347, and 1348 of gate 1352, and forms a first p-type source region 1370 and a first n-type drain region 1372.

Further, the first p-type source and drain regions 1370 and 1372 define an n-type channel portion 1373 of n-type well 1318 that lies between, touches, and separates the p-type source and drain regions 1370 and 1372. Following the implant, patterned photoresist layer 1364 is removed in a conventional fashion, such as with an ash process.

As shown in FIGS. 22A-22F, once patterned photoresist layer 1364 has been removed, a non-conductive layer is deposited in a conventional manner to touch trench isolation structure 1314, gate insulation region 1320, gate insulation region 1322, and gate 1352. The non-conductive layer can be implemented with, for example, oxide. Following this, the non-conductive layer is anisotropically etched to form a side wall spacer 1373 that laterally surrounds gate 1352.

As shown in FIGS. 23A-23F, after side wall spacer 1373 has been formed, a patterned photoresist layer 1374 is conventionally formed to touch trench isolation structure 1314, gate insulation region 1322, a portion of gate 1352, and side wall spacer 1373. Once patterned photoresist layer 1374 has been formed, an n-type dopant, such as phosphorous or arsenic, is conventionally implanted into p-type well 1316 and the exposed portions of gate 1352.

The implant increases the dopant concentrations of the first, second, third, fourth and fifth n-type gate regions 1331, 1333, 1334, 1337, and 1338 of gate 1352, and forms a second n-type source region 1376 and a second n-type drain region 1378. The second n-type source and drain regions 1376 and 1378 reduce the sizes of the first n-type source and drain regions 1360 and 1362 to lie below side wall spacer 1373. The first and second n-type source regions 1360 and 1376 define an n-type transistor source 1380, while the first and second n-type drain regions 1362 and 1378 define an n-type transistor drain 1381. Following the implant, patterned photoresist layer 1374 is removed in a conventional fashion, such as with an ash process.

As shown in FIGS. 24A-24F, after patterned photoresist layer 1374 has been removed, a patterned photoresist layer 1382 is conventionally formed to touch trench isolation structure 1314, gate insulation region 1320, a portion of gate 1352, and side wall spacer 1373. Once patterned photoresist layer 1382 has been formed, a p-type dopant, such as boron, is conventionally implanted into n-type well 1318 and the exposed portions of gate 1352.

The implant increases the dopant concentrations of the first, second, third, fourth and fifth p-type gate regions 1341, 1343, 1344, 1347, and 1348 of gate 1352, and forms a second p-type source region 1384 and a second n-type drain region 1386. The second p-type source and drain regions 1384 and 1386 reduce the sizes of the first p-type source and drain regions 1370 and 1372 to lie below side wall spacer 1373. The first and second p-type source regions 1370 and 1384 define a p-type transistor source 1390, while the first and second p-type drain regions 1372 and 1386 define a p-type transistor drain 1391. Following the implant, patterned photoresist layer 1382 is removed in a conventional fashion, such as with an ash process.

After patterned photoresist layer 1382 has been removed, the first, second, third, fourth and fifth n-type gate regions 1331, 1333, 1334, 1337, and 1338, the first, second, third, fourth, and fifth p-type gate regions 1341, 1343, 1344, 1347, and 1348, the first and second n-type source regions 1360 and 1376, the first and second n-type drain regions 1362 and 1378, the first and second p-type source regions 1370 and 1384, and the first and second p-type drain regions 1372 and 1386 are driven in (e.g., annealed at 1100° C. in a neutral ambient such as N$_2$).

Following the anneal, the first n-type gate region 1331 has substantially a first n-type dopant concentration, the second and third n-type gate regions 1333 and 1334 each has substantially a second n-type dopant concentration, and the fourth and fifth n-type gate regions 1337 and 1338 each has substantially a third n-type dopant concentration. In addition, the first n-type source and drain regions 1360 and 1362 each has substantially a fourth n-type dopant concentration, and the second n-type source and drain regions 1376 and 1378 each has substantially a fifth n-type dopant concentration.

The second n-type dopant concentration is less than the first n-type dopant concentration. The third n-type dopant concentration is less than the second n-type dopant concentration. The fourth n-type dopant concentration is less than the third n-type dopant concentration. The fifth n-type dopant concentration is less than the third n-type dopant concentration, but greater than the fourth n-type dopant concentration.

Further, the first p-type gate region 1341 has substantially a first p-type dopant concentration, the second and third p-type gate regions 1343 and 1344 each has substantially a second p-type dopant concentration, and the fourth and fifth p-type gate regions 1347 and 1348 each has substantially a third p-type dopant concentration. In addition, the first p-type source and drain regions 1370 and 1372 each has substantially a fourth p-type dopant concentration, and the second p-type source and drain regions 1390 and 1391 each has substantially a fifth p-type dopant concentration.

The second p-type dopant concentration is less than the first p-type dopant concentration. The third p-type dopant concentration is less than the second p-type dopant concentration. The fourth p-type dopant concentration is less than the third p-type dopant concentration. The fifth p-type dopant concentration is less than the third p-type dopant concentration, but greater than the fourth p-type dopant concentration.

After the drive in, method 1300 continues with conventional steps, including the conventional formation of a silicide region on the top surface of gate 1352, and the optional formation of silicide regions on the top surfaces of the second n-type source and drain regions 1376 and 1378 and the top surfaces of the second p-type source and drain regions 1384 and 1386.

In the present example, p-type well 1316, n-type source region 1380, n-type drain region 1381, channel portion 1363, gate insulation region 1320, the first, second, third, fourth, and fifth n-type gate regions 1331, 1333, 1334, 1337, and 1338 form an NMOS transistor 1392.

Further, n-type well 1318, p-type source region 1390, p-type drain region 1391, channel portion 1373, gate insulation region 1322, and the first, second, third, fourth, and fifth p-type gate regions 1341, 1343, 1344, 1347, and 1348 form a PMOS transistor 1394. NMOS transistor 1392 and PMOS transistor 1394 form a semiconductor structure 1396.

Figure 25:
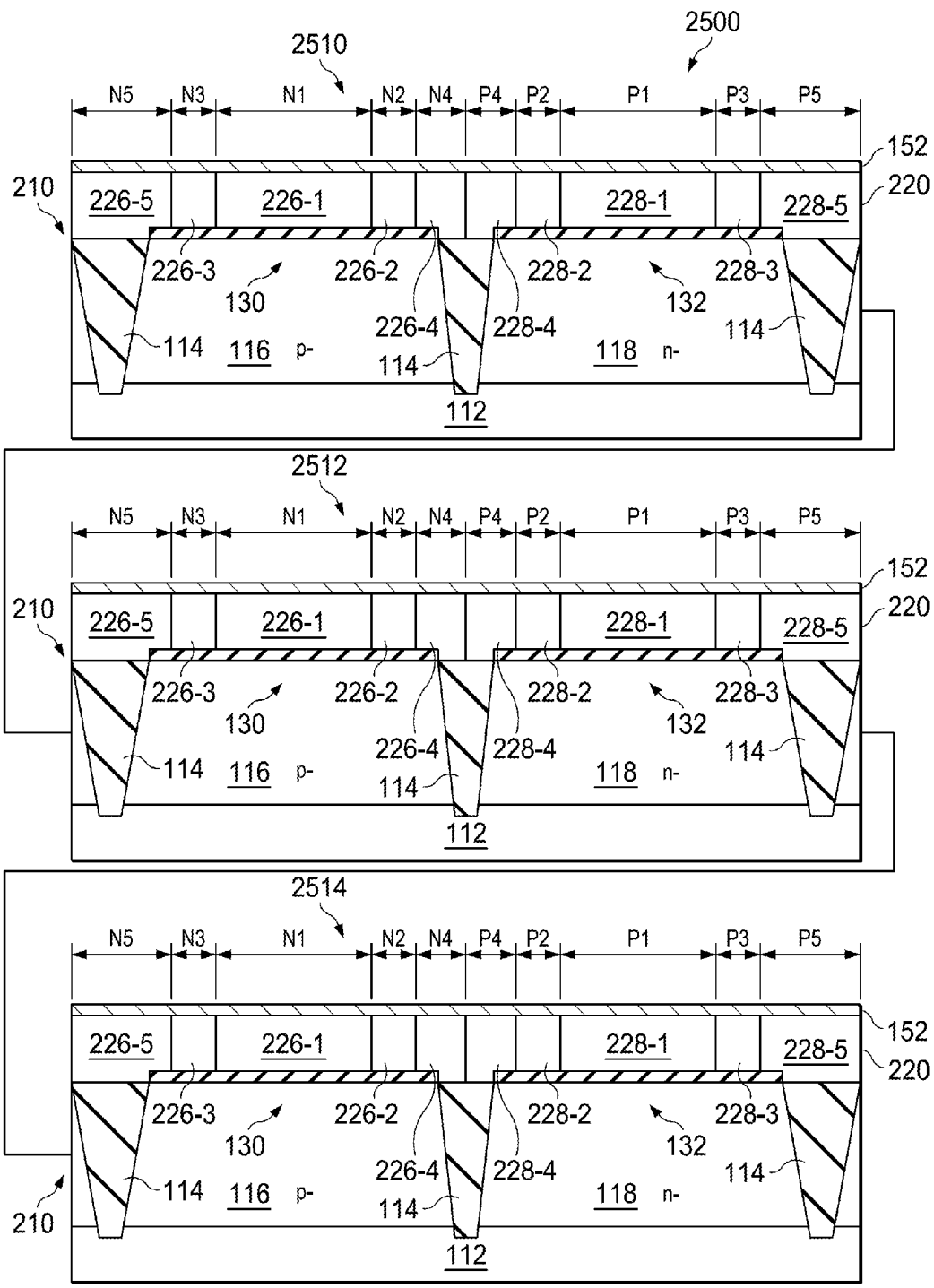
FIG. 25 is a cross-sectional view illustrating an example of a semiconductor device 2500 in accordance with an alternate embodiment of the present invention.

FIG. 25 shows a cross-sectional view that illustrates an example of a semiconductor device 2500 in accordance with an alternate embodiment of the present invention. Semiconductor device 2500 includes a semiconductor structure 2510, a semiconductor structure 2512, and a semiconductor structure 2514. In the present example, the semiconductor structures 2510, 2512, and 2514 are each implemented with semiconductor structure 200. Alternately, the semiconductor structures 2510, 2512, and 2514 can each be implemented with semiconductor structure 1200.

As shown in FIG. 25, the first, second, third, fourth, and fifth n-type gate regions 345-1, 345-2, 345-3, 345-4, and 345-5 of each of the semiconductor structures 2510, 2512, and 2514 have widths N1, N2, N3, N4, and N5, respectively. In addition, the first, second, third, fourth, and fifth p-type gate regions 363-1, 363-2, 363-3, 363-4, and 363-5 of each of the semiconductor structures 2510, 2512, and 2514 have widths P1, P2, P3, P4, and P5, respectively. Further, semiconductor structure 2510 is part of a memory circuit, semiconductor structure 2512 is part of a logic circuit, and semiconductor structure 2514 is part of an input/output circuit.

The widths N1, N2, N3, N4, and N5 of the n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of semiconductor structure 2510, the widths N1, N2, N3, N4, and N5 of the n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of semiconductor structure 2512, and the widths N1, N2, N3, N4, and N5 of the n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of semiconductor structure 2514 can be the same or different.

As a result, the widths N1, N2, N3, N4, and N5 of the n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of semiconductor structure 2510, the widths N1, N2, N3, N4, and N5 of the n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of semiconductor structure 2512, and the widths N1, N2, N3, N4, and N5 of the n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of semiconductor structure 2514 can be optimized to meet the needs of the memory circuit, the logic circuit, and the input/output circuit.

To form the first, second, third, fourth, and fifth n-type gate regions 345-1, 345-2, 345-3, 345-4, and 345-5 and the widths P1, P2, P3, P4, and P5 of the first, second, third, fourth, and fifth p-type gate regions 363-1, 363-2, 363-3, 363-4, and 363-5 of each of the semiconductor structures 2510, 2512, and 2514 to have different widths, the widths of the openings in the implant blocking structures can be different.

For example, if the width N1 of the first n-type gate region 345-1 of semiconductor structure 2510 is to be different from the widths N1 of the first n-type gate region 345-1 of the semiconductor structures 2512 and 2514, then the width of the opening in implant blocking structure 342 that is associated with semiconductor structure 2510 is formed to be different from the widths of the openings in implant blocking structure 342 that are associated with the semiconductor structures 2512 and 2514. The widths can also be formed to be different by using a new implant blocking structure (removing the prior implant blocking structure and forming a new implant blocking structure) when necessary.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor structure comprising:
    an isolation region;
    a source that touches the isolation region and a channel region of a first conductivity type, the source having a second conductivity type and including a first source region, a second source region that touches the first source region, and a third source region that touches the first and second source regions, the first source region having substantially a first dopant concentration, the second source region having substantially a second dopant concentration that is greater than the first dopant concentration, the third source region having substantially a third dopant concentration that is greater than the first dopant concentration and less than the second dopant concentration;
    a drain that touches the isolation region and the channel region and lies spaced apart from the source, the drain having the second conductivity type and including a first drain region, a second drain region that touches the first drain region, and a third drain region that touches the first and second drain regions, the first drain region having substantially the first dopant concentration, the second drain region having substantially the second dopant concentration, the third drain region having substantially the third dopant concentration;
    a gate insulation structure that touches and lies above the channel region; and
    a gate that touches the isolation region and the gate insulation structure, the gate lying above the channel region.

2. The semiconductor structure of claim 1 wherein the gate has a first gate region that lies above the isolation region, a second gate region lies above the channel region, and a third gate region that lies above the channel region, the first gate region having substantially a fourth dopant concentration that is less than the third dopant concentration, the second gate region having the third dopant concentration, and the third gate region having the second dopant concentration.

3. The semiconductor structure of claim 2 wherein the second gate region touches and lies between the first gate region and the third gate region.

4. A semiconductor structure comprising:
    an isolation region;
    a first insulation structure that touches and lies above a p-type channel region;
    a second insulation structure that touches and lies above an n-type channel region;
    a gate having a first n-type gate region that lies over the isolation region, a second n-type gate region that touches the first insulation structure and lies over the p-type channel region, a first p-type gate region that lies over the isolation structure, and a second p-type gate region that touches the second insulation structure and lies over the n-type channel region, the first n-type gate region touching the second n-type gate region and the first p-type gate region, the first p-type gate region touching the second p-type gate region and being spaced apart from the second n-type gate region, the second p-type gate region being spaced apart from the first n-type gate region, the first n-type gate region having substantially a first n-type dopant concentration, the second n-type gate region having substantially a second n-type dopant concentration that is greater than the first n-type dopant concentration, the first p-type gate region having substantially a first p-type dopant concentration, and the second p-type gate region having substantially a second p-type dopant concentration that is greater than the first p-type dopant concentration.

5. The semiconductor structure of claim 4 and further comprising:
an n-type source and an n-type drain that touch the p-type channel region, the p-type channel region separating the n-type source from the n-type drain; and
a p-type source and a p-type drain that touch the n-type channel region, the n-type channel region separating the p-type source from the p-type drain.

6. The semiconductor structure of claim 5 wherein:
the n-type source includes a first n-type source region and a second n-type source region that touches the first n-type source region, the first n-type source region having substantially a third n-type dopant concentration that is less than the second n-type dopant concentration, the second n-type source region having substantially the second n-type dopant concentration; and
the n-type drain includes a first n-type drain region and a second n-type drain region that touches the first n-type drain region, the first n-type drain region having substantially the third n-type dopant concentration, the second n-type drain region having substantially the second n-type dopant concentration.

7. The semiconductor structure of claim 6 wherein:
the p-type source includes a first p-type source region and a second p-type source region that touches the first p-type source region, the first p-type source region having substantially a third p-type dopant concentration that is less than the second p-type dopant concentration, the second p-type source region having substantially the second p-type dopant concentration; and
the p-type drain includes a first p-type drain region and a second p-type drain region that touches the first p-type drain region, the first p-type drain region having substantially the third p-type dopant concentration, the second p-type drain region having substantially the second p-type dopant concentration.

8. The semiconductor structure of claim 7 wherein:
the n-type source further includes a third n-type source region that touches the first and second n-type source regions, the third n-type source region having substantially a fourth n-type dopant concentration that is greater than the second n-type dopant concentration; and
the n-type drain further includes a third n-type drain region that touches the first and second n-type drain regions, the third n-type drain region having substantially the fourth n-type dopant concentration.

9. The semiconductor structure of claim 8 wherein:
the p-type source further includes a third p-type source region that touches the first and second p-type source regions, the third p-type source region having substantially a fourth p-type dopant concentration that is greater than the second p-type dopant concentration; and
the p-type drain further includes a third p-type drain region that touches the first and second p-type drain regions, the third p-type drain region having substantially the fourth p-type dopant concentration.

10. The semiconductor structure of claim 5 wherein the gate further includes:
a third n-type gate region that touches the first insulation structure and lies over the p-type channel region, the third n-type gate region touching the second n-type gate region, having substantially a third n-type dopant concentration that is greater than the second n-type dopant concentration, and being spaced apart from the first n-type gate region, the first p-type gate region, and the second p-type gate region; and
a third p-type gate region that touches the second insulation structure and lies over the n-type channel region, the third p-type gate region touching the second p-type gate region, having substantially a third p-type dopant concentration that is greater than the second p-type dopant concentration, and being spaced apart from the first p-type gate region, the first n-type gate region, the second n-type gate region, and the third n-type gate region.

11. The semiconductor structure of claim 10 and further comprising:
a third insulation structure that touches and lies above a p-type channel portion;
a fourth insulation structure that touches and lies above an n-type channel portion;
a gate having a fourth n-type gate region that lies over the isolation region, a fifth n-type gate region that touches the third insulation structure and lies over the p-type channel portion, a sixth n-type gate region that touches the third insulation structure and lies over the p-type channel portion, a fourth p-type gate region that lies over the isolation structure, a fifth p-type gate region that touches the fourth insulation structure and lies over the n-type channel portion, and a sixth p-type gate region that touches the fourth insulation structure and lies over the n-type channel portion, the fourth n-type gate region being spaced apart from the first, second, and third n-type gate regions, the fifth n-type gate region touching the fourth n-type gate region, the sixth n-type gate region touching the fifth n-type gate region and being spaced apart from the fourth n-type gate region, the fourth p-type gate region being spaced apart from the first, second, and third p-type gate regions, the fifth p-type region touching the fourth p-type gate region, the sixth p-type gate region touching the fifth p-type gate region and being spaced apart from the fourth p-type gate region, the fourth n-type gate region having substantially the first n-type dopant concentration, the fifth n-type gate region having substantially the second n-type dopant concentration, the sixth n-type gate region having substantially the third n-type dopant concentration, the fourth p-type gate region having substantially the first p-type dopant concentration, the fifth p-type gate region having substantially the second p-type dopant concentration, the sixth p-type gate region having substantially the third p-type dopant concentration.

12. The semiconductor structure of claim 11 wherein the third n-type gate region and the sixth n-type gate region have substantially equal widths.

13. The semiconductor structure of claim 11 wherein the third n-type gate region and the sixth n-type gate region have different widths.

* * * * *